US007255912B2

(12) United States Patent
Aylward et al.

(10) Patent No.: US 7,255,912 B2
(45) Date of Patent: *Aug. 14, 2007

(54) ANTISTATIC CONDUCTIVE GRID PATTERN WITH INTEGRAL LOGO

(75) Inventors: Peter T. Aylward, Hilton, NY (US); Debasis Majumdar, Rochester, NY (US); Barry A. Fitzgerald, Holley, NY (US); Kelly S. Robinson, Fairport, NY (US)

(73) Assignee: Eastman Kodak Company, Rochester, NY (US)

( * ) Notice: Subject to any disclaimer, the term of this patent is extended or adjusted under 35 U.S.C. 154(b) by 256 days.

This patent is subject to a terminal disclaimer.

(21) Appl. No.: 10/669,181

(22) Filed: Sep. 23, 2003

(65) Prior Publication Data

US 2005/0069683 A1    Mar. 31, 2005

(51) Int. Cl.
*G03G 5/10* (2006.01)
(52) U.S. Cl. ............... 428/195.1; 428/172; 428/500
(58) Field of Classification Search ........... 428/195.1, 428/323, 423.1, 480, 500, 172
See application file for complete search history.

(56) References Cited

U.S. PATENT DOCUMENTS

| 3,974,302 | A |   | 8/1976  | Croop et al. ............ 427/468 |
| 4,940,315 | A |   | 7/1990  | Demiryont .............. 359/267 |
| 5,208,066 | A |   | 5/1993  | Fujisaki et al. .......... 427/97.5 |
| 5,968,871 | A | * | 10/1999 | Katashima et al. ......... 503/227 |
| 6,197,486 | B1 |   | 3/2001 | Majumdar et al. .......... 430/527 |
| 6,207,361 | B1 |   | 3/2001 | Greener et al. ............ 430/520 |
| 6,566,033 | B1 |   | 5/2003 | Majumdar et al. .......... 430/201 |
| 2003/0031842 | A1 | * | 2/2003 | Marietti et al. ............ 428/195 |
| 2003/0116756 | A1 |   | 6/2003 | Takezawa et al. .......... 252/500 |
| 2003/0119391 | A1 |   | 6/2003 | Swallow et al. ............ 442/6 |
| 2003/0124265 | A1 |   | 7/2003 | Bellmann et al. .......... 427/536 |
| 2004/0213957 | A1 | * | 10/2004 | Kaminsky et al. .......... 428/141 |
| 2004/0213962 | A1 | * | 10/2004 | Bourdelais et al. ......... 428/172 |
| 2005/0064152 | A1 | * | 3/2005 | Aylward et al. .......... 428/195.1 |
| 2005/0064154 | A1 | * | 3/2005 | Aylward et al. .......... 428/195.1 |

FOREIGN PATENT DOCUMENTS

| EP | 0926260 A2 | 6/1999 |
| GB | 2094014 A  | 9/1982 |
| WO | 99/33760   | 7/1999 |

OTHER PUBLICATIONS

M. Takashi, JP 9 066681 A, *Thermal Transfer Imaging Receiving Body*, Patent Abstracts of Japan.
M. Takashi, JP 9 066682 A, *Thermal Transfer Imaging Receiving Body*, Patent Abstracts of Japan.

* cited by examiner

*Primary Examiner*—Rena Dye
*Assistant Examiner*—C Thompson
(74) *Attorney, Agent, or Firm*—Lynne M. Blank

(57) ABSTRACT

The present invention relates to an article comprising a substrate having thereon at least one antistatic layer, wherein said antistatic layer comprises at least one conductive material, and wherein said antistatic layer comprises areas of patterned coverage, and wherein said patterned coverage comprises a graphic design.

126 Claims, 4 Drawing Sheets

ANTISTATIC CONDUCTIVE GRID PATTERN WITH INTEGRAL LOGO

CROSS REFERENCE TO RELATED APPLICATIONS

Reference is made to commonly assigned, co-pending U.S. patent application Ser. No. 10/839,935 by Aylward et al. filed of even date herewith entitled "Transparent Invisible Conductive Grid", the disclosures of which is incorporated herein.

FIELD OF THE INVENTION

The present invention relates to an antistatic layer having areas of patterned coverage in the form of a graphic design, such as a logo, applied to a support or a substrate.

BACKGROUND OF THE INVENTION

The problem of controlling static charge during plastic web manufacturing and transport is well known. Generation and uncontrolled discharge of electrostatic charge can cause a number of serious problems including safety hazards. In the field of imaging, particularly photography, the accumulation of charge on film or paper surfaces leads to the attraction of dirt, which can produce physical defects. The discharge of accumulated charge during or after the application of the sensitized emulsion layer(s) can produce irregular fog patterns or "static marks" in the emulsion. The static problems have been aggravated by increase in the sensitivity of new emulsions, increase in coating machine speeds, and increase in post-coating drying efficiency. The charge generated during the coating process may accumulate during winding and unwinding operations, during transport through the coating machines and during finishing operations such as slitting and spooling.

It is generally known that electrostatic charge can be dissipated effectively by incorporating one or more electrically-conductive "antistatic" layers into the support structure. Typical location of an antistatic layer is an external surface, which comes in contact with various transport rollers. For imaging elements, the antistatic layer is usually placed on the side of the support opposite to the imaging layer. The imaging element may also have a dual system for control of static in which the resin-coated paper contains both ionically conductive salts and water as well as a conductor on the outside of the backside resin layer.

A wide variety of electrically-conductive materials can be incorporated into antistatic layers to produce a wide range of conductivities. These can be divided into two broad groups: (i) ionic conductors and (ii) electronic conductors. In ionic conductors charge is transferred by the bulk diffusion of charged species through an electrolyte. Here the resistivity of the antistatic layer is dependent on temperature and humidity. Antistatic layers containing simple inorganic salts, alkali metal salts of surfactants, ionic conductive polymers, polymeric electrolytes containing alkali metal salts, and colloidal metal oxide sols (stabilized by metal salts), described previously in patent literature, fall in this category. However, many of the inorganic salts, polymeric electrolytes, and low molecular weight surfactants used are water-soluble and are leached out of the antistatic layers during processing, resulting in a loss of antistatic function. The conductivity of antistatic layers employing an electronic conductor depends on electronic mobility rather than ionic mobility and is independent of humidity. Antistatic layers which contain conjugated polymers, semi-conductive metal halide salts, and semi-conductive metal oxide particles, have been described previously. However, these antistatic layers typically contain a high volume percentage of electronically conducting materials, which are often expensive and impart unfavorable physical characteristics, such as color, increased brittleness and poor adhesion, to the antistatic layer.

A vast majority of the prior art involves coatings of antistatic layers from aqueous or organic solvent based coating compositions. For photographic paper, typically antistatic layers based on ionic conductors, are coated out of aqueous and/or organic solvent based formulations, which necessitate an effective elimination of the solvent. Under fast drying conditions, as dictated by efficiency, formation of such layers may pose some problems. An improper drying will invariably cause coating defects and inadequate adhesion and/or cohesion of the antistatic layer, generating waste or inferior performance. Poor adhesion or cohesion of the antistatic layer can lead to unacceptable dusting and track-off. A discontinuous antistatic layer, resulting from dusting, flaking, or other causes, may exhibit poor conductivity, and may not provide necessary static protection. It can also allow leaching of calcium stearate from the paper support into the processing tanks causing build-up of stearate sludge. Flakes of the antistatic backing in the processing solution can form soft tar-like species, which, even in extremely small amounts, can re-deposit as smudges on drier rollers eventually transferring to image areas of the photographic paper, creating unacceptable defects.

Moreover, majority of antistats on current photographic paper products lose their electrical conductivity after photographic processing due to their ionic nature. This can cause print sticking after drying in the photo processor, and/or in a stack.

In U.S. Pat. Nos. 6,197,486 and 6,207,361, antistatic layers have been disclosed which can be formed through the (co)-extrusion method thus eliminating the need to coat the support in a separate step and rendering the manufacturing process less costly.

With the development of all plastic web media, such as, for example, foam-core polymer sheets, the conductivity requirements of the plastic web media are typically increased because there is no paper base that contains water and salt to provide conductivity. The web media may require the addition of an electronically conducting material such as tin oxide, polythiophene and others. Some of these materials have color associated with them at various coverages. These materials are also very expensive when compared to more conventional antistatic compounds.

Imaging supports often have a logo or other graphic design located on the backside of the support that provides brand recognition. During the manufacture of such supports, a dye or pigment is imprinted in the form of the desired graphic onto a paper core that is then coated over with a clear layer of resin. Such a printing operation requires a separate process of printing and drying. This adds complexity and additional cost in terms of material, energy to dry the inks, and waste that is associated with the printing process. Additionally the manufacturing process also requires a separate operation in which an antistatic layer is applied to the resin coated paper.

PROBLEM TO BE SOLVED

There remains a need for conductive materials for use on a number of substrates or supports, which are simpler to manufacture, utilize less raw materials and are lower in cost.

SUMMARY OF THE INVENTION

The present invention relates to an article comprising a substrate having thereon at least one antistatic layer, wherein said antistatic layer comprises at least one conductive material, and wherein said antistatic layer comprises areas of patterned coverage, and wherein said patterned coverage comprises a graphic design.

ADVANTAGEOUS EFFECT OF THE INVENTION

The present invention includes several advantages, not all of which are incorporated in a single embodiment. Coating the antistatic layer in a patterned format provides a network of conductive pathways at a significantly reduced coverage (up to 80-90% reduction). The pattern may be a simple grid pattern or any other interconnected labyrinthine pattern. The significant reduction in coverage of the antistatic layer of the invention leads directly to savings in material costs. Significantly less conductive material may be required to provide antistatic protection, friction control and improved transport through image processing equipment. The conducting layer may contain less material that is likely to come off in processing, thus minimizing the potential for dusting during manufacturing, transport, finishing or photofinishing and reducing the potential for contamination of the processing chemicals and associated sensitometric interactions. Additionally, the invention provides a means to incorporate an integral design, such as a logo, by means of the antistatic layer itself, obviating the need for additional material, coating stations or coating passes during manufacturing. The present invention may provide advantages when utilized in other applications as well, such as packaging materials.

DETAILED DESCRIPTION OF THE INVENTION

Figure 1:
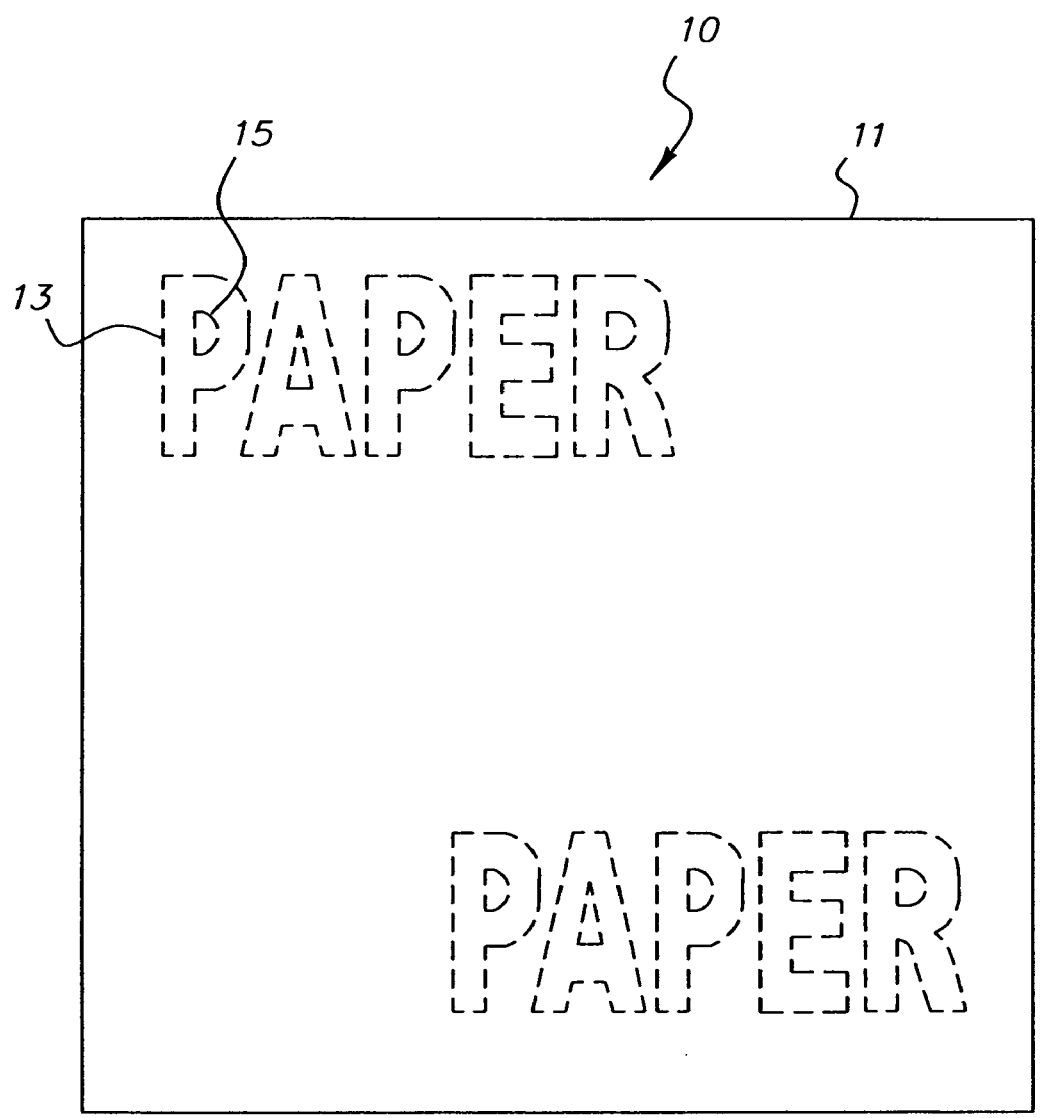
FIG. 1 illustrates the backside of an imaging support or substrate having a conductive layer with an integral graphic design, such as a logo, according to one embodiment of the invention.

The present invention relates to an article, preferably an imaging element, comprising a substrate or support having at least one antistatic layer, wherein said antistatic layer comprises a conductive material having areas of patterned coverage in the form of a graphic design such as a logo. The antistatic layer may optionally comprise a carrier for the conductive material, such as a polymer. This invention provides a graphic design pattern on a substrate or support, as a means to reduce the coverage of conductive materials required for various coatable supports, for examples, imaging elements. Embodiments of this invention are represented in FIGS. 1, 2, 3 and 4. FIG. 1 is a top view of the backside of an imaging substrate 10 comprising a background antistatic layer 11 with integral logo 13 that comprises a non-continuous outline 15 with an optical density different than background antistatic layer 11 and an interior region of the logo that is also conductive. In this configuration any electrical charge may migrate along the background conductive path that may pass through the logo. The imaging substrate may be a sheet or in roll form. The interior of the graphic design, such as a logo, may be the same or different coverage that may provide some additional contrast between the background and the graphic design, such as a logo. The outline area may have no coverage and therefore only show the background of the substrate or it may be a higher coverage of the antistatic layer.

Figure 2:
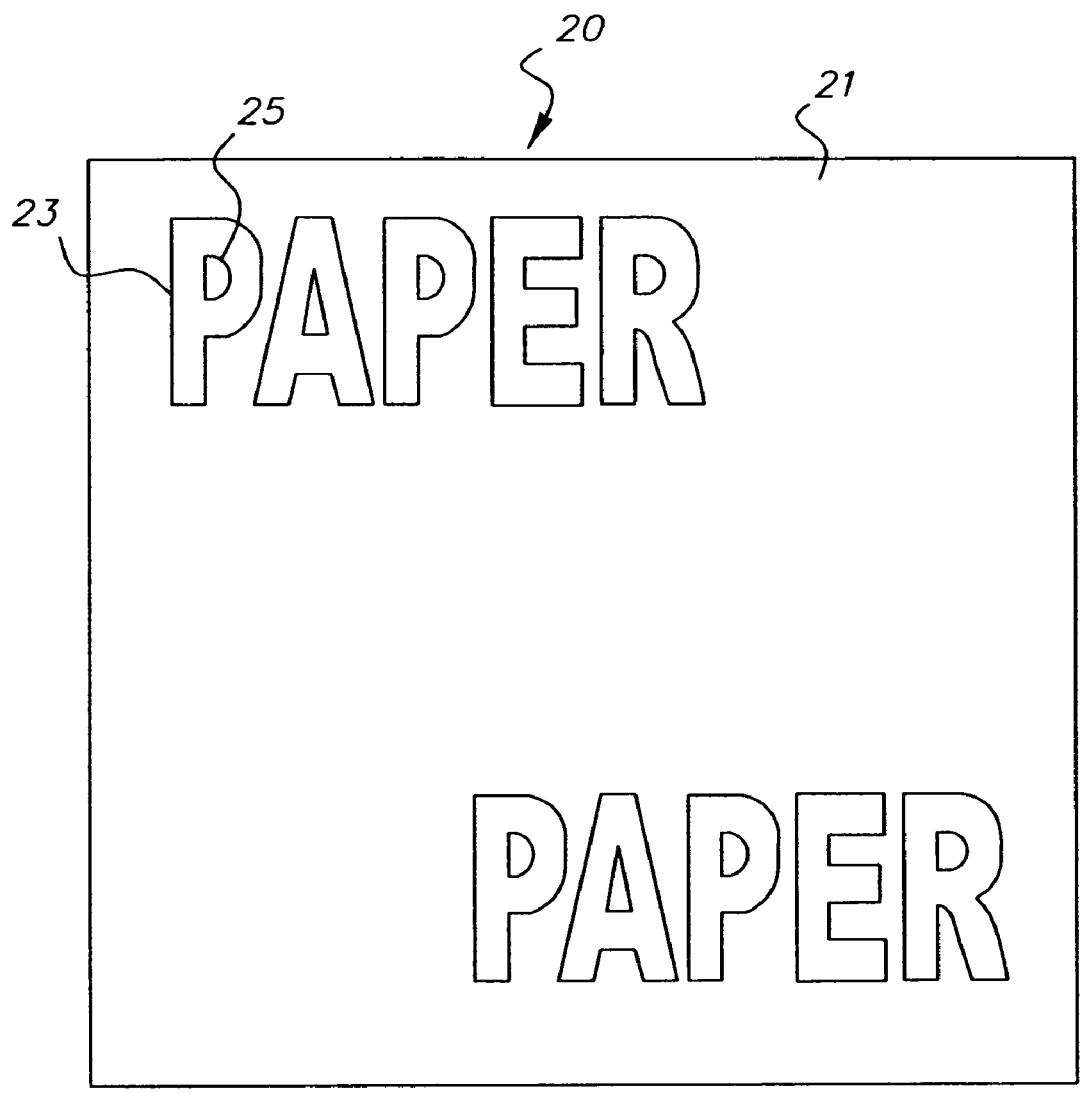
FIG. 2 illustrates the backside of an imaging support or substrate having a conductive layer with an integral graphic design, such as a logo, according to one embodiment of the invention.

FIG. 2 is a top view of the backside of an imaging substrate 20 comprising a background antistatic layer 21 with integral logo 23 that comprises a logo with an optical density different than background antistatic layer 21 and an interior region of the logo that may be conductive or non-conductive. In this configuration any electrical charge may migrate along the background conductive path around the graphic design, such as a logo. The imaging substrate may be a sheet or in roll form. The interior of the graphic design, such as a logo, is printed at a different coverage than the background antistatic layer in order to provide contrast between the background and the logo. The logo area may have no coverage and therefore only show the background of the substrate or it may be a higher or lower coverage than that of the background antistatic layer.

Figure 3:
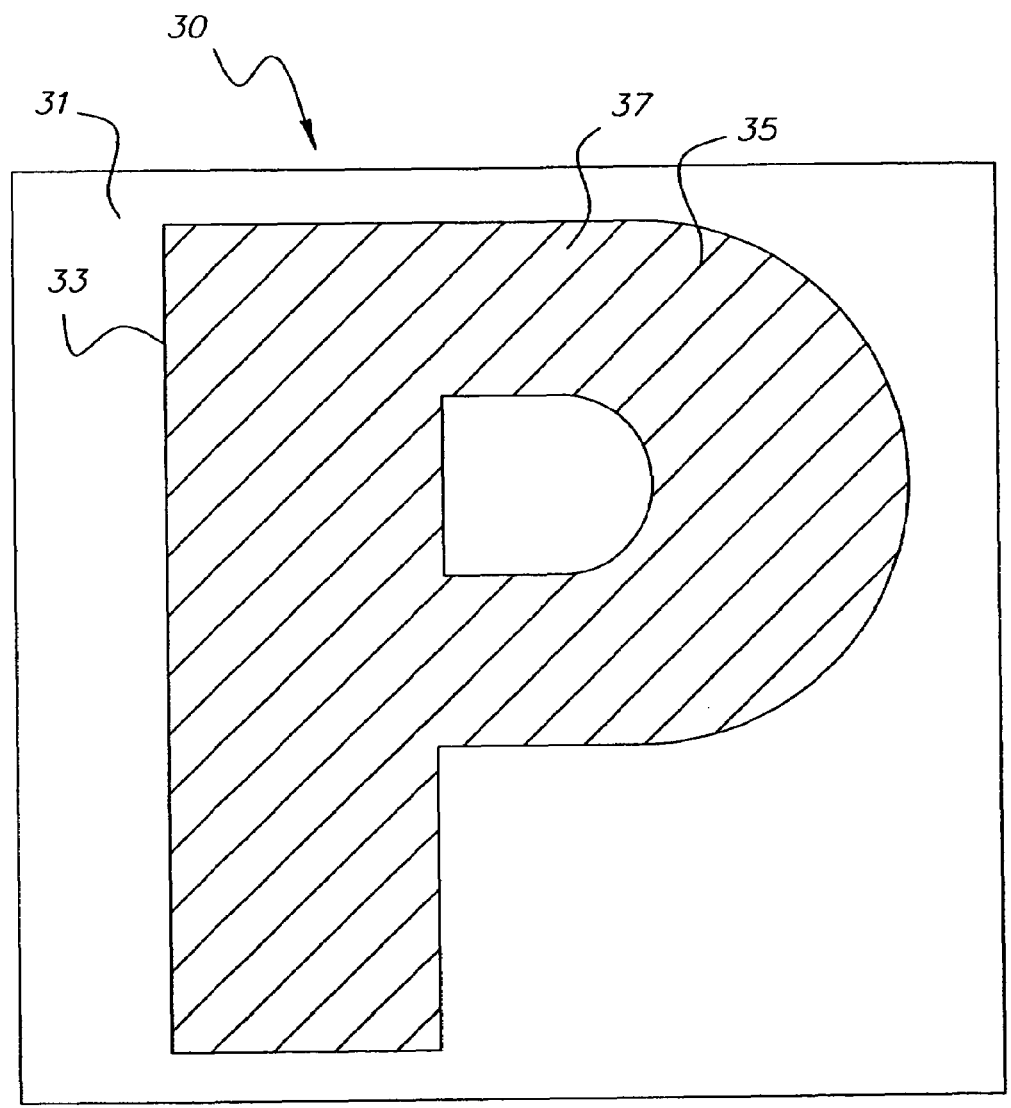
FIG. 3 illustrates the backside of an imaging support or substrate having a conductive layer with an integral graphic design, such as a logo, having areas of differing conductivity according to one embodiment of the invention.

FIG. 3 is a top view of the backside of an imaging substrate 30 comprising a conductive background layer 31 with integral logo 33 that comprises regions of at least two different optical densities or colors. These regions are conductive region 35 and less conductive or non-conductive region 37. Conductive region 35 may be the same or different coverage than conductive background layer 31 while less or non-conductive region 37 has a different visual density or color than conductive background layer 31 and conductive region 35. This provides sufficient contrast to make the graphic design, such as a logo, visible. In this configuration any electrical charge may migrate along the conductive path that may include through the logo. The imaging substrate may be a sheet or in roll form.

Figure 4:
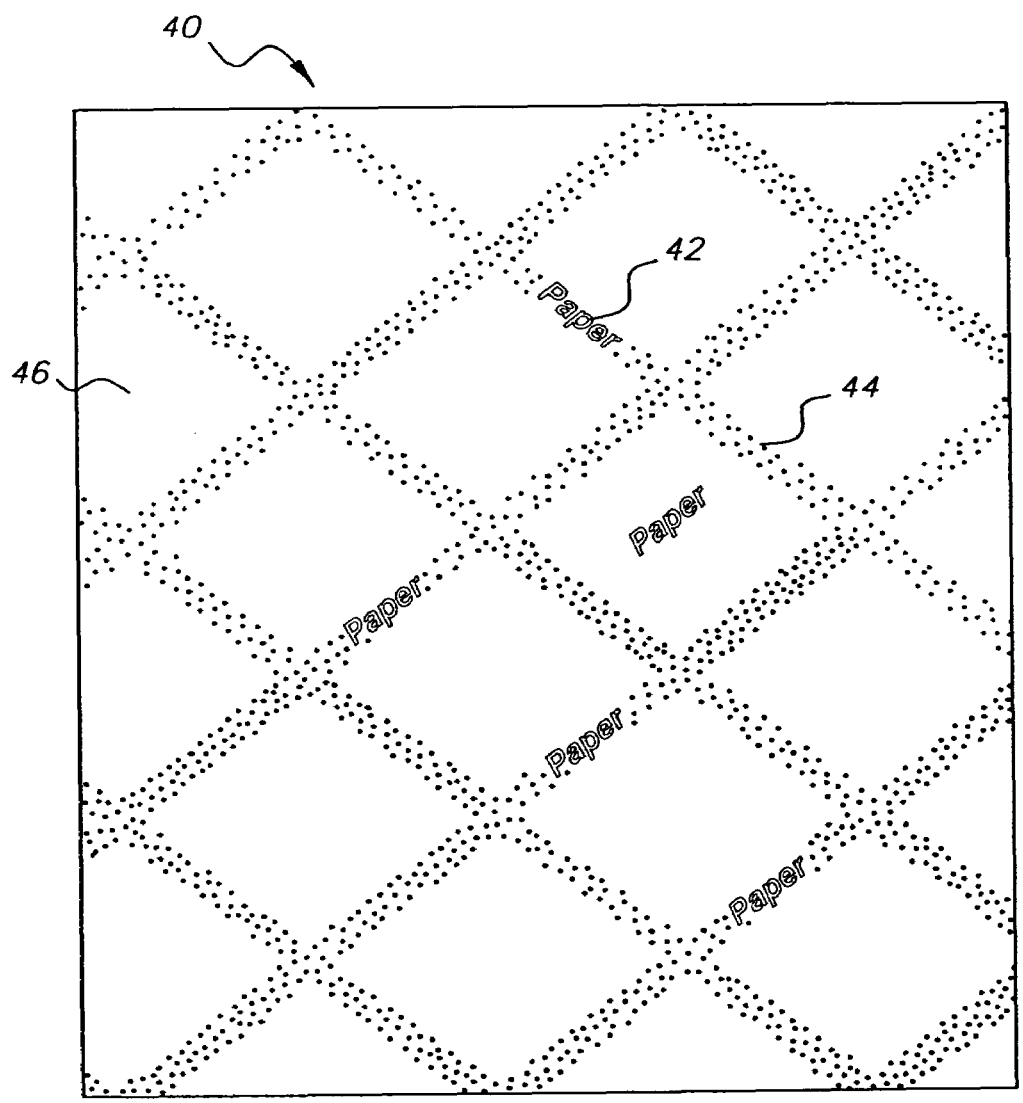
FIG. 4 illustrates the backside of an imaging support or substrate having a conductive layer with an integral graphic design, such as a logo, and utilizing a pattern according to one embodiment of the invention

FIG. 4 is a top view of an imaging substrate 40 that comprises a conductive grid pattern 44 with a integral logo 42 that has a pattern that provides a means of conducting a charge through the logo's interior. Additionally background layer 46 may be conductive or non-conductive. If background layer 46 is conductive, it may be coated with a different coverage than grid pattern 44. In the embodiment represented by FIG. 4, the background layer is at a lower coverage than grid pattern 44. In this case the background area can still transport electrical charge to the primary conductor as represented by grid pattern 44.

The terms as used herein, "top", "upper", "emulsion side", and "face" mean the side or toward the side of the imaging member bearing the imaging layers. The terms "bottom", "lower side", and "back" mean the side or toward the side of the imaging member opposite from the side bearing the imaging layers or image. The "image side" of the support is the side on which imaging layers would be applied. The "non-image side" of the support is the side of support opposite the imaging layers.

The antistatic layer of the present invention comprises an electrically conductive material and may include ionic conductors and electronic conductors. The conductive material, when utilized in an antistatic layer, typically produces an antistatic layer having a resistivity of less than $10^{13}$ ohm/square, most preferably, a resistivity less than $3 \times 10^{12}$ ohms/square. In a preferred embodiment, the conductivity ranges between $10^{13}$ and $10^7$ ohms/sq.

Electronic conductors such as conjugated conducting polymers, conducting carbon particles, crystalline semiconductor particles, amorphous semi-conductive fibrils, and continuous conductive metal or semi-conducting thin films may be used as conductive materials in this invention to afford humidity independent, process-surviving antistatic protection. Of the various types of electronic conductors, electronically conductive metal-containing particles, such as semi-conducting metal oxides, and electronically conductive polymers, such as, substituted or unsubstituted polythiophenes, substituted or unsubstituted polypyrroles, and substituted or unsubstituted polyanilines are particularly effective for the present invention.

Conductive metal-containing particles, which may be used in the present invention include conductive crystalline inorganic oxides, conductive metal antimonates, and conductive inorganic non-oxides. Crystalline inorganic oxides may be chosen from zinc oxide, titania, tin oxide, alumina, indium oxide, silica, magnesia, barium oxide, molybdenum oxide, tungsten oxide, and vanadium oxide or composite oxides thereof, as described in, for example, U.S. Pat. Nos. 4,275,103, 4,394,441, 4,416,963, 4,418,141, 4,431,764, 4,495,276, 4,571,361, 4,999,276 and 5,122,445.

The conductive crystalline inorganic oxides may contain a "dopant" in the range from 0.01 to 30 mole percent. Preferred dopants may include aluminum or indium for zinc oxide, niobium or tantalum for titania, and antimony, niobium or halogens for tin oxide. Alternatively, the conductivity may be enhanced by formation of oxygen defects by methods well known in the art. The use of antimony-doped tin oxide particles, such as those having an X-ray crystallite size less than 100 Å and an average equivalent spherical diameter less than 15 nm but no less than the X-ray crystallite size as taught in U.S. Pat. No. 5,484,694 is specifically contemplated.

Particularly useful electronically conductive metal-containing particles, which may be used in the antistatic layer, include acicular doped metal oxides, acicular metal oxide particles, acicular metal oxides containing oxygen deficiencies. In this category, acicular doped tin oxide particles, particularly acicular antimony-doped tin oxide particles, or acicular niobium-doped titanium dioxide particles, are preferred because of their availability. The aforesaid acicular conductive particles preferably have a cross-sectional diameter less than or equal to 0.02 μm and an aspect ratio greater than or equal to 5:1. Some of these acicular conductive particles, useful for the present invention, are described in U.S. Pat. Nos. 5,719,016, 5,731,119, 5,939,243 and references therein.

The volume fraction of the acicular electronically conductive metal oxide particles in the dried antistatic layer of the invention may vary from 1 to 70% and preferably from 5 to 50% for optimum physical properties. For non-acicular electronically conductive metal oxide particles, the volume fraction may vary from 15 to 90%, and preferably from 20 to 80% for optimum properties.

The invention is also applicable where the conductive material comprises a conductive "amorphous" gel such as vanadium oxide gel comprised of vanadium oxide ribbons or fibers. Such vanadium oxide gels may be prepared by any variety of methods, including but not specifically limited to melt quenching as described in U.S. Pat. No. 4,203,769, ion exchange as described in DE 4,125,758, or hydrolysis of a vanadium oxoalkoxide as claimed in WO 93/24584. The vanadium oxide gel is preferably doped with silver to enhance conductivity. Other methods of preparing vanadium oxide gels, which are well known in the literature, include reaction of vanadium or vanadium pentoxide with hydrogen peroxide and hydrolysis of $VO_2$ OAc or vanadium oxychloride.

Conductive metal antimonates suitable for use in accordance with the invention include those as disclosed in, U.S. Pat. Nos. 5,368,995 and 5,457,013, for example. Preferred conductive metal antimonates have a rutile or rutile-related crystallographic structures and may be represented as $M^{+2}Sb^{+5}{}_2O_6$ (where $M^{+2}=Zn^{+2}$, $Ni^{+2}$, $Mg^{+2}$, $Fe^{+2}$, $Cu^{+2}$, $Mn^{+2}$, $Co^{+2}$) or $M^{+3}Sb^{+5}O_4$ (where $M^{+3}=In^{+3}$, $Al^{+3}$, $Sc^{+3}$, $Cr^{+3}$, $Fe^{+3}$). Several colloidal conductive metal antimonate dispersions are commercially available from Nissan Chemical Company in the form of aqueous or organic dispersions. Alternatively, U.S. Pat. Nos. 4,169,104 and 4,110,247 teach a method for preparing $M^{+2}Sb^{+5}{}_2O_6$ by treating an aqueous solution of potassium antimonate with an aqueous solution of an appropriate metal salt (for example, chloride, nitrate, sulfate) to form a gelatinous precipitate of the corresponding insoluble hydrate which may be converted to a conductive metal antimonate by suitable treatment. If used, the volume fraction of the conductive metal antimonates in the dried antistatic layer may vary from 15 to 90%. But it is preferred to be from 20 to 80% for optimum physical properties.

Conductive inorganic non-oxides suitable for use as conductive particles in the present invention include metal nitrides, metal borides and metal silicides, which may be acicular or non-acicular in shape. Examples of these inorganic non-oxides include titanium nitride, titanium boride, titanium carbide, niobium boride, tungsten carbide, lanthanum boride, zirconium boride, and molybdenum boride. Examples of conductive carbon particles, include carbon black and carbon fibrils or nanotubes with single walled or multi-walled morphology. Example of such suitable conductive carbon particles can be found in U.S. Pat. No. 5,576,162 and references therein.

Suitable electrically conductive polymers that are preferred for incorporation in the antistatic layer of the invention are specifically electronically conducting polymers, such as those illustrated in U.S. Pat. Nos. 6,025,119, 6,060,229, 6,077,655, 6,096,491, 6,124,083, 6,162,596, 6,187,522, and 6,190,846. These electronically conductive polymers include substituted or unsubstituted aniline-containing polymers (as disclosed in U.S. Pat. Nos. 5,716,550, 5,093,439 and 4,070,189), substituted or unsubstituted thiophene-containing polymers (as disclosed in U.S. Pat. Nos. 5,300,575, 5,312,681, 5,354,613, 5,370,981, 5,372,924, 5,391,472, 5,403,467, 5,443,944, 5,575,898, 4,987,042 and 4,731,408), substituted or unsubstituted pyrrole-containing polymers (as disclosed in U.S. Pat. Nos. 5,665,498 and 5,674,654), and poly(isothianaphthene) or derivatives thereof. These conducting polymers may be soluble or dispersible in organic solvents or water or mixtures thereof. Preferred conducting polymers for the present invention include polypyrrole styrene sulfonate (referred to as polypyrrole/poly (styrene sulfonic acid) in U.S. Pat. No. 5,674,654), 3,4-dialkoxy substituted polypyrrole styrene sulfonate, and 3,4-dialkoxy substituted polythiophene styrene sulfonate because of their color. The most preferred substituted electronically conductive polymers include poly(3,4-ethylene dioxythiophene styrene sulfonate), such as Baytron® P supplied by Bayer Corporation, for its apparent availability in relatively large quantity. The weight % of the conductive polymer in the dried antistatic layer of the invention may vary from 1 to 99% but preferably varies from 2 to 30% for optimum physical properties.

Humidity dependent, ionic conductors are traditionally more cost-effective than electronic conductors and find widespread use in reflective imaging media such as paper. Any such ionic conductor may be incorporated in the antistatic layer of the invention. The ionic conductors may comprise inorganic and/or organic salt. Alkali metal salts, particularly those of polyacids, are effective. The alkali metal may comprise lithium, sodium or potassium and the polyacid may comprise polyacrylic or polymethacrylic acid, maleic acid, itaconic acid, crotonic acid, polysulfonic acid or mixed polymers of these compounds, as well as cellulose derivatives. The alkali salts of polystyrene sulfonic acid, napthalene sulfonic acid or an alkali cellulose sulfate are preferred for their performance.

The combination of polymerized alkylene oxides and alkali metal salts, described in U.S. Pat. Nos. 4,542,095 and 5,683,862 and incorporated herein by reference, is also a preferred choice. Specifically, a combination of a polyethylene ether glycol and lithium nitrate is a desirable choice because of its performance and cost. Also, preferred are inorganic particles such as electrically conductive synthetic or natural smectite clay. Of particular preference for application in the present invention are those ionic conductors, such as an alkali metal salt in combination with a polymeric latex binder and a non-ionic, surface active compound containing, as described in U.S. Pat. No. 5,683,862, a smectite clay in combination with an interpolymer of vinylidene halide, as described in U.S. Pat. No. 5,869,227, a smectite clay, and a polymeric binder wherein the polymeric binder can sufficiently intercalate inside or exfoliate the smectite clay, as described in U.S. Pat. No. 5,891,611, a smectite clay, a first polymeric binder which sufficiently intercalates inside or exfoliates the smectite clay and a second polymeric binder which does not sufficiently intercalate inside or exfoliate the smectite clay, as described in U.S. Pat. No. 5,981,126, a combination of an alkali metal salt and a polymerized alkylene oxide, a positively charged colloidal oxide sol and a film forming binder which is an interpolymer of a primary amine addition salt with a peel strength of 200 g or above on a polyolefin surface, as described in U.S. Pat. No. 6,077,656, and a combination of an alkali metal salt and a polymerized alkylene oxide, colloidal silica, preferably aluminum modified colloidal silica, and a polymeric film-forming binder with a peel strength of 200 g or above on a polypropylene surface, as described in U.S. Pat. No. 6,171,769, and references therein.

The conductive particles that can be incorporated in the antistatic layer are not specifically limited in particle size or shape. The particle shape may range from roughly spherical or equiaxed particles to high aspect ratio particles such as fibers, whiskers, tubes, platelets or ribbons. Additionally, the conductive materials described above may be coated on a variety of other particles, also not particularly limited in shape or composition. For example the conductive inorganic material may be coated on non-conductive silica, alumina, titania and mica particles, whiskers or fibers.

Another suitable group of polymeric conductive materials, which are well known in the art for their excellent melt-processabilty while retaining their antistatic property and overall physical performance, may include polyether based polymeric conductive materials containing polyalkoxylated compounds. These materials may include various polymeric substances containing polyether blocks such as polyethylene oxides, polypropylene oxides, polybutylene oxides, polytetramethylene oxides, polyoxyalkylene glycols such as polyoxyethylene glycol, polyoxypropylene glycol, polyoxytetramethylene glycol, the reaction products of polyalkoxylates with fatty acids, the reaction products of polyalkoxylates with fatty alcohols, the reaction products of polyalkoxylates with fatty acid esters of polyhydroxyl alcohols (for instance polyalkoxylate reaction products of fatty acids, of fatty glycols, of fatty sorbitols, of fatty sorbitans, and of fatty alcohols), or, interpolymers and/or mixtures thereof. The polyether chains in the suitable polyalkoxylated compounds are of the formula $(-OC_xH_{2x}-)_n$ wherein x is from 2 to 8, wherein the alkyl group is straight or branched, and wherein n is from 2 to 1000. It is believed that ionic conduction along the polyether chains makes these polymers inherently dissipative, yielding surface resistivities in the range $10^8$-$10^{13}$ ohm/square.

For the purpose of this invention any polyalkoxylated compounds containing oligomer, homopolymer, interpolymer and/or mixtures thereof may suitably be used in this invention. However, preferred examples of such polyether polymeric antistatic materials are: those comprising polyamide blocks and polyether block(s), for example, as disclosed in U.S. Pat. Nos. 4,331,786, 4,115,475, 4,195,015, 4,839,441, 4,864,014, 4,230,838, 4,332,920, 6,197,486, 6,207,361, 6,436,619, 6,465,140 and 6,566,033 and product literature for Pebax® supplied by Elf Atochem or Irgastat® currently supplied by Ciba Specialty Chemicals, polyetheresteramides, for example, as disclosed in U.S. Pat. Nos. 5,604,284; 5,652,326; 5,886,098, and thermoplastic polyurethanes containing a polyalkylene glycol moiety, for example, as disclosed in U.S. Pat. Nos. 5,159,053 and 5,863,466, with the content of all of the aforementioned literature incorporated herein by reference. Most preferred polyether polymeric conductive materials are those comprising polyamide blocks and polyether block(s).

Surfactants capable of static dissipation are also suitable for application in the present invention. Such surfactants are usually highly polar compounds and may be anionic, cationic or non-ionic or mixtures thereof, as described in U.S. Pat. No. 6,136,396 herein incorporated by reference. Examples of anionic surfactants include compounds such as those comprising alkyl sulfates, alkyl sulfonates and alkyl phosphates having alkyl chains of 4 or more carbon atoms in length. Examples of cationic surfactants include compounds such as onium salts, particularly quaternary ammonium or phosphonium salts, having alkyl chains of 4 or more carbon atoms in length. Examples of non-ionic surfactants include compounds such as polyvinyl alcohol, polyvinylpyrrolidone and polyethers, as well as amines, acids and fatty acid esters having alkyl groups of 4 or more carbon atoms in length. Surfactants may also be effectively used for charge balancing, as per the present invention. In this case, suitable surfactants are chosen to counter balance the tribocharge generated on the surface.

In one embodiment useful in this invention, the patterns of conductive material are visible to the human eye under natural or artificial daylight illuminance. The pattern of conductive material may respond to actinic radiation below 400 nanometers or above 700 nanometers. Such conductive materials visible to the human eye under daylight illuminance may be applied to the substrate or support. In an embodiment of this invention there may be at least two regions of the conductive material. There may be a background region for conducting charge and a logo or indicia region that has sufficient density or color difference than the background region. In such an embodiment, it is the contrast difference that make the graphic design, such as a logo, visible. The graphic design, such as a logo, may be further patterned with a grid of connecting lines or patterns, so as to conductive electrical charge through or around the logo. In this embodiment, the contrast may be achieved by providing an antistatic layer with a colored dye or pigment or, in the case of some materials such as polythiophene, polyanaline or other conductive material that are naturally colored, as the background conducting region and the logo or indicia may not be printed thus having the color of the article or support substrate. It should also be noted that the logo or indicia may be printed with the same conductive material as the background conducting region but at a different coverage so as to provide some conductivity but at the same time have sufficient density difference as to make the logo visible. When patterns of conductive materials visible to the human eye under daylight illuminance are printed on supports, it may be desirable to have a transparent backside flange layer. In another embodiment useful in this invention, the patterns of conductive material are machine detectable and not visible to the human eye under natural or artificial daylight illuminance. Another embodiment may include combinations of conductive materials visible to the human eye under natural or artificial daylight illuminance and not visible to the human eye under natural or artificial daylight illuminance.

For the purpose of clarification, as used in this application "light" is the only type of electromagnetic radiation that is visible to the human eye. Other types of radiation, such as "infrared radiation" are not visible to the human eye because they have different wavelengths than light. "Light" has a wavelength range of 400 nm to 700 nm, which makes it visible to the human eye. Infrared radiation has a wavelength range beginning above 700 nm, generally at 800 nm which makes it invisible to the human eye, that is, not visible to the human eye under daylight illuminance. Similarly, ultraviolet radiation has a wavelength that is less than 400 nm, making it invisible to the human eye, that is, not visible to the human eye under daylight illuminance. When electromagnetic radiation of the appropriate wavelength range is applied to the substrate or support, the areas imprinted with conductive materials not visible to the human eye under daylight illuminance will respond by emitting electromagnetic radiation. The wavelength range of the emitted radiation is dependent on the specific characteristics of the materials used. For a particular conductive material not visible to the human eye under daylight illuminance, there is a specific wavelength range of absorbtivity and reflectance. The source of illuminance is matched to the absorptivity of the pattern of the conductive materials and a detector is matched to its reflectivity.

The conductive materials may be added to inks. Examples of solvent based inks include nitrocellulose maleic, nitrocellulose polyamide, nitrocellulose acrylic, nitrocellulose urethane, chlorinated rubber, vinyl, acrylic, alcohol soluble acrylic, cellulose acetate acrylic styrene, and other synthetic polymers. Examples of water based inks include acrylic emulsion, maleic resin dispersion styrene-maleic anhydride resins, and other synthetic polymers. Examples of radiation cured inks include ultraviolet and electron beam inks. The preferred ink systems for printing patterns of conductive materials are water based inks and radiation cured inks, because of the need to reduce volatile organic compounds associated with solvent based ink systems. Inks not visible to the human eye under daylight illuminance, as they are transparent, may be applied to the backside film support without altering the physical appearance of any designs on the support.

The antistatic layer of the invention may also comprise a colloidal sol, which may or may not be electrically conductive, to improve physical properties such as durability, roughness, coefficient of friction, as well as to reduce cost. The colloidal sol preferred in the present invention comprises finely divided inorganic particles in a liquid medium, preferably water. Most preferably the inorganic particles are metal oxide based. Such metal oxides include tin oxide, titania, antimony oxide, zirconia, ceria, yttria, zirconium silicate, silica, alumina, such as boehmite, aluminum modified silica, as well as other inorganic metal oxides of Group III and IV of the Periodic Table and mixtures thereof. The selection of the inorganic metal oxide sol is dependent on the ultimate balance of properties desired as well as cost. Inorganic particles such as silicon carbide, silicon nitride and magnesium fluoride when in sol form are also useful for the present invention. The inorganic particles of the sol have an average particle size less than 100 nm, preferably less than 70 nm and most preferably less than 40 nm. A variety of colloidal sols useful in the present invention are commercially available from DuPont, Nalco Chemical Co., and Nyacol Products Inc.

The weight % of the inorganic particles of the aforesaid sol are preferred to be at least 5% and more preferred to be at least 10% of the dried antistatic layer of the invention to achieve the desired physical properties.

Besides the conductive material, the antistatic layer of the invention is preferred to comprise a suitable carrier for the conductive material, to achieve physical properties such as adhesion, abrasion resistance, backmark retention and others. Polymers are often used to promote adhesion of the conductive material to a base substrate or support material. They may also be useful in providing sufficient volume or bulk to make the coating or printing method work within it design range. Polymers may also provide enhanced functionality to the antistatic layer such as scratch or abrasion resistance, proper sliding friction to optimize coefficient of friction and other uses. The polymeric binder or carrier can be any polymer depending on the specific need. The carrier or binder polymer can be one or more of a water-soluble polymer, a hydrophilic colloid or a water insoluble polymer, latex or dispersion. Particular preference is given to polymers selected from the group of polymers and interpolymers prepared from ethylenically unsaturated monomers such as styrene, styrene derivatives, acrylic acid or methacrylic acid and their derivatives, olefins, chlorinated olefins, (meth) acrylonitriles, itaconic acid and its derivatives, maleic acid and its derivatives, vinyl halides, vinylidene halides, vinyl monomer having a primary amine addition salt, vinyl monomer containing an aminostyrene addition salt and others. Also included are carrier polymers such as polyurethanes and polyesters. Particularly preferred carrier or binder polymers are polymeric film-forming binder having a peel strength of 200 g or greater on a polypropylene surface, as disclosed in U.S. Pat. No. 6,171,769, or polymeric film-forming binders of an interpolymer of a primary amine addition salt, having a peel strength of 200 g or greater, as disclosed in U.S. Pat. No. 6,077,656, because of their excellent adhesion characteristics. Typically, the conductive material may comprise from 15 to 85% weight of the antistatic layer. The carrier polymer may preferably comprise from 15 to 85% by weight of the antistatic layer.

If formed by thermal processing, the polymeric binder or carrier may be any of the thermally processable polymers disclosed in U.S. Pat. Nos. 6,197,486, 6,197,486, 6,207,361, 6,436,619, 6,465,140 and 6,566,033 and incorporated herein by reference. Suitable classes of thermoplastic polymers preferred for this invention can include polymers of alpha-beta unsaturated monomers, polyesters, polyamides, polycarbonates, cellulosic esters, polyvinyl resins, polysulfonamides, polyethers, polyimides, polyurethanes, polyphenylenesulfides, polytetrafluoroethylene, polyacetals, polysulfonates, polyester ionomers, and polyolefin ionomers. Interpolymers and/or mixtures of these polymers can also be used. Illustrative of polymers of alpha-beta unsaturated monomers, which are suitable for use in this invention, include polymers of ethylene, propylene, hexene, butene, octene, vinylalcohol, acrylonitrile, vinylidene halide, salts of acrylic acid, salts of methacrylic acid, tetrafluoroethylene, chlorotrifluoroethylene, vinyl chloride, and styrene. Interpolymers and/or mixtures of these aforementioned polymers can also be used in the present invention. Most preferred polymers from this category include polyethylene, polypropylenes and polystyrenes together with their interpolymers and/or mixtures, because of their cost and mechanical properties.

Other carrier polymers utilized in the invention can be any suitable thermoplastic polymer. Suitable classes of thermoplastic polymers preferred for this invention may include polymers of alpha-beta unsaturated monomers, polyesters, polyamides, polycarbonates, cellulosic esters, polyvinyl resins, polysulfonamides, polyethers, polyimides, polyurethanes, polyphenylenesulfides, polytetrafluoroethylene, polyacetals, polysulfonates, polyester ionomers, and polyolefin ionomers. Interpolymers and/or mixtures of these polymers can also be used. Polymers of alpha-beta unsaturated monomers, which are suitable for use in this invention, may include polymers of ethylene, propylene, hexene, butene, octene, vinylalcohol, acrylonitrile, vinylidene halide, salts of acrylic acid, salts of methacrylic acid, tetrafluoroethylene, chlorotrifluoroethylene, vinyl chloride, and styrene. Interpolymers and/or mixtures of these aforementioned polymers can also be used in the present invention. Most preferred polymers from this category include polypropylenes and polystyrenes together with their interpolymers and/or mixtures, because of their cost and mechanical properties.

Polyesters which are suitable for use as carrier polymers in this invention may include those which are derived from the condensation of aromatic, cycloaliphatic, and aliphatic diols with aliphatic, aromatic and cycloaliphatic dicarboxylic acids and may be cycloaliphatic, aliphatic or aromatic polyesters. Useful cycloaliphatic, aliphatic and aromatic polyesters, which can be utilized in the practice of their invention, may include poly(ethylene terephthalate), poly(cyclohexlenedimethylene), terephthalate) poly(ethylene dodecate), poly(butylene terephthalate), poly(ethylene naphthalate), poly(ethylene(2,7-naphthalate)), poly(methaphenylene isophthalate), poly(glycolic acid), poly(ethylene succinate), poly(ethylene adipate), poly(ethylene sebacate), poly(decamethylene azelate), poly(ethylene sebacate), poly(decamethylene adipate), poly(decamethylene sebacate), poly(dimethylpropiolactone), poly(para-hydroxybenzoate), poly(ethylene oxybenzoate), poly(ethylene isophthalate), poly(tetramethylene terephthalate, poly(hexamethylene terephthalate), poly(decamethylene terephthalate), poly(1,4-cyclohexane dimethylene terephthalate) (trans), poly(ethylene 1,5-naphthalate), poly(ethylene 2,6-naphthalate), poly(1,4-cyclohexylene dimethylene terephthalate) (cis), and poly(1,4-cyclohexylene dimethylene terephthalate (trans).

Polyester compounds prepared from the condensation of a diol and an aromatic dicarboxylic acid is preferred for use in this invention. Useful aromatic carboxylic acids may include terephthalic acid, isophthalic acid and a o-phthalic acid, 1,3-napthalenedicarboxylic acid, 1,4 napthalenedicarboxylic acid, 2,6-napthalenedicarboxylic acid, 2,7-napthalenedicarboxylic acid, 4,4'-diphenyldicarboxylic acid, 4,4'-diphenysulfphone-dicarboxylic acid, 1,1,3-trimethyl-5-carboxy-3-(p-carboxyphenyl)-idane, diphenyl ether 4,4'-dicarboxylic acid, and bis-p(carboxy-phenyl) methane. Of the aforementioned aromatic dicarboxylic acids, those based on a benzene ring (such as terephthalic acid, isophthalic acid, orthophthalic acid) are preferred. Terephthalic acid is a particularly preferred acid precursor.

Preferred polyesters may include poly(ethylene terephthalate), poly(butylene terephthalate), poly(1,4-cyclohexylene dimethylene terephthalate), poly(ethylene naphthalate) and interpolymers and/or mixtures thereof. Among these polyesters of choice, poly(ethylene terephthalate), which may be modified by small amounts of other monomers, is most preferred.

Polyamides, which are suitable for use as carrier polymers in this invention, may include synthetic linear polycarbonamides characterized by the presence of recurring carbonamide groups as an integral part of the polymer chain, which are separated from one another by at least two carbon atoms. Polyamides of this type include polymers, generally known in the art as nylons, obtained from diamines and dibasic acids having the recurring unit represented by the general formula:

—NHCOR$^1$COHNR$^2$— in which R$^1$ is an alkylene group of at least 2 carbon atoms, preferably from 2 to 11 or arylene having at least 6 carbon atoms, preferably 6 to 17 carbon atoms; and R$^2$ is selected from R$^1$ and aryl groups. Also, included are copolyamides and terpolyamides obtained by known methods, for example, by condensation of hexamethylene diamine and a mixture of dibasic acids consisting of terephthalic acid and adipic acid. Polyamides of the above description are well-known in the art and include, for example, the copolyamide of 30% hexamethylene diammonium isophthalate and 70% hexamethylene diammonium adipate, poly(hexamethylene adipamide) (nylon 6,6), poly(hexamethylene sebacamide) (nylon 6, 10), poly(hexamethylene isophthalamide), poly(hexamethylene terephthalamide), poly(heptamethylene pimelamide) (nylon 7,7), poly(octamethylene suberamide) (nylon 8,8), poly(nonamethylene azelamide) (nylon 9,9) poly (decamethylene azelamide) (nylon 10,9), poly(decamethylene sebacamide) (nylon 10,10), poly(bis(4-amino cyclohexyl)methane-1,10-decane-carboxamide)), poly(m-xylylene adipamide), poly(p-xylene sebacamide), poly(2,2,2-trimethyl hexamethylene terephthalamide), poly(piperazine sebacamide), poly(p-phenylene terephthalamide), and poly(metaphenylene isophthalamide).

Other useful polyamides are those formed by polymerization of amino acids and derivatives thereof, as for example lactams. Useful polyamides may include poly(4-aminobutyric acid) (nylon 4), poly(6-aminohexanoic acid) (nylon 6), poly(7-aminoheptanoic acid) (nylon 7), poly(8-aminooctanoic acid) (nylon 8), poly(9-aminononanoic acid) (nylon 9), poly(10-amino-decanoic acid) (nylon 10), poly (11-aminoundecanoic acid) (nylon 11), and poly(12-aminododecanoic acid) (nylon 12). The most preferred polyamides include poly(caprolactam), poly(12-aminododecanoic acid), poly(hexamethylene adipamide), poly(m-xylylene adipamide), poly(6-aminohexanoic acid), and interpolymers and/or mixtures thereof.

Suitable cellulose esters may include cellulose nitrate, cellulose triacetate, cellulose diacetate, cellulose acetate propionate, cellulose acetate butyrate, and interpolymers and/or mixtures thereof. A polycarbonate preferred for use in this invention is bisphenol-A polycarbonate. Useful polyvinyl resins may include polyvinyl chloride, poly (vinyl acetal) and interpolymers and/or mixtures thereof.

The antistatic layer of the invention may include other optional components. Such optional components may include compatibilizers, nucleating agents, fillers, plasticizers, impact modifiers, chain extenders, colorants, lubricants, surfactants and coating aids, other antistatic conductive agents, onium salts, pigments such as titanium oxide, zinc oxide, talc, calcium carbonate, barium sulfate, clay, dispersants such as fatty amides, (for example, stearamide), metallic salts of fatty acids, for example, zinc stearate, magnesium stearate, calcium stearate, dyes such as ultramarine blue, cobalt violet, antioxidants, fluorescent whiteners, ultraviolet absorbers, fire retardants, matte particles or roughening agents, such as silica, titanium dioxide, talc, barium sulfate, clay, and alumina, cross linking agents, solvents and cosolvents, and voiding agents. These optional components and appropriate amounts are well known in the art and can be chosen according to need.

The antistatic layer of the present invention may be applied to the substrate or support in a manner capable of producing a pattern having areas of coverage and areas without coverage. The pattern should provide a continuous conductive pathway and/or a network of conductive pathways on, around, or in the substrate or support. The pattern may form a simple grid pattern or any other interconnected labyrinthine pattern comprising at least one line or a series of continuous segments, such as dots, lines or other shapes. For example, shapes may include interconnecting square, circles, triangles, or butterflies. The pattern may also form a gradient pattern having areas of differing coverage, for example, areas of higher coverage and areas of lower coverage or areas with coverage and areas without coverage. In a preferred embodiment, the areas of higher coverage demonstrate a resistivity of less than 13 log ohm/sq and the areas of lower coverage demonstrate a resistivity of greater than or equal to 13 log ohm/sq.

The patterns useful in this invention may also form traditional graphic designs, such as logos, to provide the consumer with brand recognition, or machine readable indicia on the back of the support, which allow for planar metrology of web and sheet material without contact. The pattern used in this invention may be printed, coated or embossed. The pattern may form a character, or a logo with at least one character. In other useful embodiments, the pattern, such as characters, may comprise at least one member selected from the group consisting of letters, pictures, numbers, symbols, and words. The pattern may form a simple grid pattern or any other interconnected labyrinthine pattern comprising at least one line or a series of continuous segments, such as dots, lines or other shapes. For example, shapes may include interconnecting square, circles, triangles, or butterflies.

An additional useful embodiment of this invention would be to apply ink or colored material containing the conductive material to the embossed pattern area or to the background area and not the pattern area in order to provide a pattern easier to view and which is less angular dependant when viewing. Such ink or colored solution containing the conductive materials may be aqueous or solvent-based.

"Planar metrology" as used in this application, is defined as point to point measurement of length through the use of predetermined coordinate systems. In a preferred case, rectangular coordinates are used for linear metrology. "Linear Metrology" as used in this application is defined to be the straight line measurement between two points. In web or sheet material applications, both machine and cross machine direction measurements are typically employed. Of particular interest are machine direction measurements. The use of patterns, including those not visible to the human eye under daylight illuminance, may be applied to linear metrology of high-speed webs without surface contact. The patterns of conductive material may also be analyzed against time to evaluate and control web speed and linear movement. Patterns of conductive indicia may further provide the accurate mapping of potentially defective areas of a substrate or support, and allow for the precise and rapid locating of such areas for removal. The use of different non-uniformly spaced patterns may be used to encode a variety of measurements in either the cross web or machine direction. The spacing of the patterned indicia will desirably match the capabilities of the equipment that applies and senses the pattern. A practical range of spacing for either uniform or non-uniform spacing is from 1 mm to 1 m.

Typically, antistatic layers as used in imaging application are relatively transparent and have little or no color or density associated with them. Antistatic layers that provide a visible graphic design, such as a logo or character, need a density difference between the substrate and the readable graphic design, such as a logo. In one embodiment of this invention the substrate and the antistatic layer have a density difference of at least 0.01 density units as measured by a reflection densitometer. Such a difference provides enough contrast to make the non-printed graphic design, such as a logo, readable.

The antistatic layer may be a coated or printed layer. The layer may be applied onto the substrate or support by conventional coating and printing means commonly used in this art. Coating methods may include, but are not limited to, extrusion coating, blade coating, wound wire rod coating, slot coating, hopper and slide hopper coating, gravure coating, curtain coating, spray coating, or inkjet coating. Printing methods may include gravure printing, offset printing, thermography, screen printing, electrophotography and other techniques. Some of these methods allow for simultaneous coatings of layers, which is preferred from a manufacturing economic perspective. Simultaneous coating may include simultaneous or consecutive extrusion coating or combinations thereof.

The antistatic layer may also be combined with other functional layers or solutions. For example, the antistatic layer may be combined with a printing ink. When imprinting an imaging support, consideration should be given to balancing the density for readability vs. show-through to the image side.

The surface on which the antistatic layer is deposited may be treated for improved adhesion by any of the means known in the art, such as acid etching, flame treatment, corona discharge treatment, glow discharge treatment or may be coated with a suitable primer layer. Corona discharge treatment is a preferred means for adhesion promotion. The antistatic layer may also be applied over an adhesion promoting primer layer of an interpolymer of a primary amine addition salt, as disclosed in U.S. Pat. No. 6,120,979.

The antistatic layer is applied to a substrate or support. The support may be either opaque or transparent. In one preferred embodiment, the supports preferably comprise opaque and/or transparent film-based output and capture supports. Opaque supports include plain paper, including cardboard and other card stocks, coated paper, resin-coated paper such as polyolefin-coated paper, synthetic paper, photographic paper support, melt-extrusion-coated paper, polyolefin-laminated paper, such as biaxially oriented support laminates, web materials, and sheet materials. In a preferred embodiment, the support comprises a support for an imaging element, which has an opacity of greater than 60. The support may also consist of microporous materials such as polyethylene polymer-containing material sold by PPG Industries, Inc., Pittsburgh, Pa. under the trade name of Teslin®, Tyvek® synthetic paper (DuPont Corp.), impregnated paper such as Duraform®, and OPPalyte® films (Mobil Chemical Co.) and other composite films listed in U.S. Pat. No. 5,244,861. Commercially available oriented and unoriented polymer films, such as opaque biaxially oriented polypropylene or polyester, may also be utilized. Such supports may contain pigments, air voids or foam voids to enhance their opacity. Transparent supports include glass, cellulose derivatives, such as a cellulose ester, cellulose triacetate, cellulose diacetate, cellulose acetate propionate, cellulose acetate butyrate, polyesters, such as poly (ethylene terephthalate), poly(ethylene naphthalate), poly-1, 4-cyclohexanedi-methylene terephthalate, poly(butylene terephthalate), and copolymers thereof, polyimides, polyamides, polycarbonates, polystyrene, polyolefins, such as polyethylene or polypropylene, polysulfones, polyacrylates, polyether imides, and mixtures thereof. The term as used herein, "transparent" means the ability to pass visible radiation without significant deviation or absorption. In a preferred embodiment, the element has a % transmission of greater than 80%.

The substrate useful in this invention may also be a composite structure of one or more of the above mentioned materials. The substrate may also comprise a microstructured feature to at least one surface. Furthermore the substrate may have a roughness pattern on at least side. The substrate thickness may be in the 8-2500 mm. For imaging elements, the preferred support used in the invention may have a thickness of from 50 to 500 µm, preferably from 75 to 350 µm. Antioxidants, brightening agents, antistatic agents, plasticizers and other known additives may be incorporated into the support, if desired. In one preferred embodiment, the element has an L* of greater than 80 and a b* of from 0 to −6.0.

In one preferred embodiment, the support may comprise a paper core that has adhered thereto at least one flange layer. The paper may come from a broad range of papers, from high end papers, such as photographic paper to low end papers, such as newsprint. In a preferred embodiment, photographic paper is employed. The paper may be made on a standard continuous fourdinier wire machine or on other modern paper formers. Any pulps known in the art to provide paper may be used in this invention. Bleached hardwood chemical kraft pulp is preferred, as it provides brightness, a smooth starting surface, and good formation while maintaining strength. Paper cores useful to this invention are of caliper from 50 µm to 230 µm, preferably from 100 µm to 190 µm because then the overall element thickness is in the range preferred by customers for imaging element and processes in existing equipment. They may be "smooth" as to not interfere with the viewing of images. Chemical additives to impart hydrophobicity (sizing), wet strength, and dry strength may be used as needed. Inorganic filler materials such as $TiO_2$, talc, mica, $BaSO_4$, clays, and $CaCO_3$ may be used to enhance optical properties and reduce cost as needed. Dyes, biocides, and processing chemicals may also be used as needed. The paper may also be subject to smoothing operations such as dry or wet calendering, as well as to coating through an in-line or an off-line paper coater.

In another embodiment, the support comprises a synthetic paper, preferably cellulose-free, having a polymer core or a polymer core that has adhered thereto at least one flange layer. The polymer core comprises a homopolymer such as a polyolefin, polystyrene, polyester, polyvinylchloride or other typical thermoplastic polymers; their copolymers or their blends thereof; or other polymeric systems like polyurethanes, polyisocyanurates. These materials may or may not have been expanded either through stretching resulting in voids or through the use of a blowing agent to consist of two phases, a solid polymer matrix, and a gaseous phase. Other solid phases may be present in the form of fillers that are of organic (polymeric, fibrous) or inorganic (glass, ceramic, metal) origin. The fillers may be used for physical, optical (lightness, whiteness, and opacity), chemical, or processing property enhancements of the core. Microvoided composite biaxially oriented sheets may be utilized and are conveniently manufactured by coextrusion of the core and surface layers, followed by biaxial orientation, whereby voids are formed around void-initiating material contained in the core layer. Such composite sheets are disclosed in, for example, U.S. Pat. Nos. 4,377,616; 4,758,462 and 4, 632, 869, the disclosure of which is incorporated for reference.

"Void" is used herein to mean devoid of added solid and liquid matter, although it is likely the "voids" contain gas. The void-initiating particles, which remain in the finished packaging sheet core, should be from 0.1 to 10 microns in diameter and preferably round in shape to produce voids of the desired shape and size. The size of the void is also dependent on the degree of orientation in the machine and transverse directions. Ideally, the void would assume a shape that is defined by two opposed, and edge contacting, concave disks. In other words, the voids tend to have a lens-like or biconvex shape. The voids are oriented so that the two major dimensions are aligned with the machine and transverse directions of the sheet. The Z-direction axis is a minor dimension and is roughly the size of the cross diameter of the voiding particle. The voids generally tend to be closed cells, and thus there is virtually no path open from one side of the voided-core to the other side through which gas or liquid may traverse.

In another embodiment, the support comprises a synthetic paper, preferably cellulose-free, having a foamed polymer core or a foamed polymer core that has adhered thereto at least one flange layer. The polymers described for use in a polymer core may also be employed in manufacture of the foamed polymer core layer, carried out through several mechanical, chemical, or physical means. Mechanical methods include whipping a gas into a polymer melt, solution, or suspension, which then hardens either by catalytic action or heat or both, thus entrapping the gas bubbles in the matrix. Chemical methods include such techniques as the thermal decomposition of chemical blowing agents generating gases such as nitrogen or carbon dioxide by the application of heat or through exothermic heat of reaction during polymerization. Physical methods include such techniques as the expansion of a gas dissolved in a polymer mass upon reduction of system pressure; the volatilization of low-boiling liquids such as fluorocarbons or methylene chloride, or the incorporation of hollow microspheres in a polymer matrix. The choice of foaming technique is dictated by desired foam density reduction, desired properties, and manufacturing process. Preferably, the foamed polymer core comprises a polymer expanded through the use of a blowing agent.

In a preferred embodiment of this invention polyolefins such as polyethylene and polypropylene, their blends and their copolymers are used as the matrix polymer in the foamed polymer core along with a chemical blowing agent such as sodium bicarbonate and its mixture with citric acid, organic acid salts, azodicarbonamide, azobisformamide, azobisisobutyroInitrile, diazoaminobenzene, 4,4'-oxybis (benzene sulfonyl hydrazide) (OBSH), N,N'-dinitrosopentamethyltetramine (DNPA), sodium borohydride, and other blowing agent agents well known in the art. The preferred chemical blowing agents would be sodium bicarbonate/citric acid mixtures, azodicarbonamide; though others may also be used. These foaming agents may be used together with an auxiliary foaming agent, nucleating agent, and a cross-linking agent.

The flange layers, which may be applied to the core of the support, are chosen to satisfy specific requirements of flexural modulus, caliper, surface roughness, and optical properties such as colorimetry and opacity. The flange members may be formed integral with the core by manufacturing the core with a flange skin sheet or the flange may be laminated to the core material. The integral extrusion of flange members with the core is preferred for cost. The lamination technique allows a wider range of properties and materials to be used for the skin materials.

Imaging elements are constrained to a range in stiffness and caliper. At stiffness below a certain minimum stiffness, there is a problem with the element in print stackability and print conveyance during transport through photofinishing equipment, particularly high-speed photoprocessors. It is believed that there is a minimum cross direction stiffness of 60 mN required for effective transport through photofinishing equipment. At stiffness above a certain maximum, there is a problem with the element in cutting, punching, slitting, and chopping during transport through photofinishing equipment. It is believed that there is a maximum machine direction stiffness of 300 mN for effective transport through photofinishing equipment. The caliper of the imaging element may be constrained from 75 μm to 350 μm for reasons relating to transport through photofinishing equipment.

Preferred ranges of core caliper and modulus and flange caliper and modulus follow: the preferred caliper of the polymer core useful with the invention ranges from 65 μm to 340 μm, the caliper of the flange sheets useful with the invention ranges from 10 μm to 175 μm, the modulus of the core useful with the invention ranges from 30 MPa to 1000 MPa, and the modulus of the flange sheets useful with the invention ranges from 690 to 5516 MPa. In each case, the above range is preferred because of (a) consumer preference, (b) manufacturability, and (c) materials selection. It is noted that the final choice of flange and core materials, modulus, and caliper will be a subject of the target overall element stiffness and caliper.

The flange sheets used comprise thermoplastic polymers. Suitable classes of thermoplastic polymers for blending include polyolefins, polyesters, polyamides, polycarbonates, cellulosic esters, polystyrene, polyvinyl resins, polysulfonamides, polyethers, polyimides, polyvinylidene fluoride, polyurethanes, polyphenylenesulfides, polytetrafluoroethylene, polyacetals, polysulfonates, polyester ionomers, and polyolefin ionomers. Copolymers and/or mixtures of these polymers may be used. Polypropylene and polyethylene are preferred, as they are low in cost and have desirable strength properties.

Suitable polyolefins include polypropylene, polyethylene, polymethylpentene, and mixtures thereof. Polyolefin copolymers, including copolymers of propylene and ethylene such as hexene, butene and octene are also useful. Polypropylenes are preferred because they are low in cost and have good strength and surface properties.

Suitable polyesters include those produced from aromatic, aliphatic or cycloaliphatic dicarboxylic acids of 4-20 carbon atoms and aliphatic or alicyclic glycols having from 2-24 carbon atoms. Examples of suitable dicarboxylic acids include terephthalic, isophthalic, phthalic, naphthalene dicarboxylic acid, succinic, glutaric, adipic, azelaic, sebacic, fumaric, maleic, itaconic, 1,4-cyclohexanedicarboxylic, sodiosulfoisophthalic and mixtures thereof. Examples of suitable glycols include ethylene glycol, propylene glycol, butanediol, pentanediol, hexanediol, 1,4-cyclohexanedimethanol, diethylene glycol, other polyethylene glycols and mixtures thereof. Such polyesters are well known in the art and may be produced by known techniques, for example, those described in U.S. Pat. Nos. 2,465,319 and 2,901,466. Preferred continuous matrix polyesters are those having repeat units from terephthalic acid or naphthalene dicarboxylic acid and at least one glycol selected from ethylene glycol, 1,4-butanediol and 1,4-cyclohexanedimethanol. Poly(ethylene terephthalate), which may be modified by small amounts of other monomers, is especially preferred. Other suitable polyesters include liquid crystal copolyesters formed by the inclusion of suitable amount of a co-acid component such as stilbene dicarboxylic acid. Examples of such liquid crystal copolyesters are those disclosed in U.S. Pat. Nos. 4,420,607, 4,459,402 and 4,468,510.

Useful polyamides include nylon 6, nylon 66, and mixtures thereof. Copolymers of polyamides are also suitable continuous phase polymers. An example of a useful polycarbonate is bisphenol-A polycarbonate. Cellulosic esters suitable for use as the continuous phase polymer of the composite sheets include cellulose nitrate, cellulose triacetate, cellulose diacetate, cellulose acetate propionate, cellulose acetate butyrate, and mixtures or copolymers thereof. Useful polyvinyl resins include polyvinyl chloride, poly (vinyl acetal), and mixtures thereof. Copolymers of vinyl resins may also be utilized.

The flange layers may also include other additives. These may include filler materials such as titanium dioxide and calcium carbonate and colorants, pigments, dyes and/or optical brighteners or other additives known to those skilled in the art. Some of the commonly used inorganic filler materials are talc, clays, calcium carbonate, magnesium carbonate, barium sulfate, mica, aluminum hydroxide (trihydrate), wollastonite, glass fibers and spheres, silica, various silicates, and carbon black. Some of the organic fillers used are wood flour, jute fibers, sisal fibers, or polyester fibers. The preferred fillers are talc, mica, and calcium carbonate because they provide excellent modulus enhancing properties. The fillers may be in the flange or an overcoat layer, such as polyethylene. Generally, base materials for color print imaging materials are white, possibly with a blue tint as a slight blue is preferred to form a preferred white look to whites in an image. Any suitable white pigment may be incorporated in the support such as, for example, titanium dioxide, zinc oxide, zinc sulfide, zirconium dioxide, white lead, lead sulfate, lead chloride, lead aluminate, lead phthalate, antimony trioxide, white bismuth, tin oxide, white manganese, white tungsten, and combinations thereof. The preferred pigment is titanium dioxide. In addition, suitable optical brightener may be employed in the polyolefin layer including those described in *Research Disclosure*, Vol. No. 308, December 1989, Publication 308119, Paragraph V, page 998.

In addition, it may be desirable to use various additives such as antioxidants, stiffness enhancing agents, slip agents, or lubricants, and light stabilizers in the synthetic elements, for example, plastic elements, as well as biocides in the paper elements. These additives are added to improve, among other things, the dispersibility of fillers and/or colorants, as well as the thermal and color stability during processing and the manufacturability and the longevity of the finished article. For example, polyolefin coatings may contain antioxidants such as 4,4'-butylidene-bis(6-tert-butyl-meta-cresol), di-lauryl-3,3'-thiopropionate, N-butylated-p-aminophenol, 2,6-di-tert-butyl-p-cresol, 2,2-di-tert-butyl-4-methyl-phenol, N,N-disalicylidene-1,2-diaminopropane, tetra(2,4-tert-butylphenyl)-4,4'-diphenyl diphosphonite, octadecyl 3-(3',5'-di-tert-butyl-4'-hydroxyphenyl propionate), combinations of the above, lubricants, such as higher aliphatic acid metal salts such as magnesium stearate, calcium stearate, zinc stearate, aluminum stearate, calcium palmitate, zirconium octylate, sodium laurate, and salts of benzoic acid such as sodium benzoate, calcium benzoate, magnesium benzoate and zinc benzoate; light stabilizers such as hindered amine light stabilizers (HALS), of which a preferred example is poly{[6-[(1,1,3,3-tetramethylbutylamino}-1,3,5-triazine-4-piperidinyl)-imino]-1,6-hexanediyl[{2,2,6,6-tetramethyl-4-piperdinyl)imino]} (Chimassorb® 944 LD/FL), 7-Oxa-3,20-diazadispiro[5.1.11.2] heneicosan-21-one, 2,2,4,4-tetramethyl-20-(oxiranylmethyl)-, homopolymer (Hostavin® N30).

Flange layers, which may be applied to the cores, may be unoriented or may have been stretched and oriented. They may be filled with suitable filler materials to further increase the modulus of the polymer and enhance other properties such as opacity and smoothness.

In one preferred embodiment of the invention the flange layer is a biaxially oriented sheet. The thickness of the biaxially oriented sheet may be from 5 to 150 microns. Below 5 microns, the sheets may not be thick enough to minimize any inherent non-planarity in the support and would be more difficult to manufacture. At thicknesses higher than 150 microns, little improvement in either surface smoothness or mechanical properties is seen, and so there is little justification for the further increase in cost for extra materials.

The biaxially oriented flange layers may be transparent for viewing objects through the back sheet or addenda, also referred to herein as additives, may be added to the biaxially oriented flange layers to color and opacify these layers.

The support of may be produced by any method know in the art for producing imaging supports. A preferred embodiment is extrusion of the antistatic layer on to the core layer (paper, or synthetic core, for example). This may entail either monolayer extrusion or coextrusion of additional layers. Extrusion laminating may be carried out by bringing together the polymeric flange sheets and the core with application of an adhesive between them.

In one embodiment utilizing oriented sheets, most preferably biaxially oriented sheets, the coextrusion, quenching, orienting, and heat setting of these biaxially oriented sheets may be effected by any process which is known in the art for producing oriented sheet, such as by a flat sheet process or a bubble or tubular process, as in, for example, U.S. Pat. No. 4,764,425. The flat sheet process involves extruding or coextruding the blend through a slit die and rapidly quenching the extruded or coextruded support upon a chilled casting drum so that the polymer component(s) of the sheet are quenched below their solidification temperature. The quenched sheet is then biaxially oriented by stretching in mutually perpendicular directions at a temperature above the glass transition temperature of the polymer(s). The sheet may be stretched in one direction and then in a second direction or may be simultaneously stretched in both directions. After the sheet has been stretched, it is heat set by heating to a temperature sufficient to crystallize the polymers while restraining to some degree the sheet against retraction in both directions of stretching.

To promote adhesion, an adhesive may be applied to either the flange sheets or the core prior to their being brought into a nip. In a preferred form, the adhesive is applied into the nip simultaneously with the flange sheets and the core. The adhesive may be any suitable material that does not have a harmful effect upon the element. The preferred materials are melt extrudable polymers but other solution based adhesives may also be used. These may include both aqueous and solvent based adhesive and may be either pressure sensitive or thermal activated adhesives. Adhesive composition may be selected from the group consisting of natural rubber, synthetic rubber, acrylics, acrylic copolymers, vinyl polymers, vinyl acetate-, urethane, acrylate-type materials, copolymer mixtures of vinyl chloride-vinyl acetate, polyvinylidene, vinyl acetate-acrylic acid copolymers, stryene butadiene, carboxylated styrene butadiene copolymers, ethylene copolymers, polyvinyl alcohol, polyesters and copolymers, cellulosic and modified cellulosic, starch and modified starches compounds, epoxies, polyisocyanate, polyimides. A preferred adhesive material is a 20%/80% blend of an extrusion grade low density polyethylene melt extruded at 12 g/m$^2$ and an acrylate modified copolymer (Dupont Bynel) and that helps promote adhesion of polyester compounds to other materials such as paper. A blend with polyethylene also helps to improve adhesion to polyethylene.

In one preferred embodiment, an ethylene polymer may be blended with metallocene catalyzed polyolefin plastomer, ionomer, ethylene vinyl acetate copolymer, ethylene methyl methacrylate copolymer, ethylene ethyl acrylate copolymer, ethylene methyl acrylate copolymer, ethylene acrylic acid copolymer, ethylene ethyl acrylate maleic anhydride copolymer, or ethylene methacrylic acid copolymer.

Metallocene catalyzed polyolefin plastomers are preferred for bonding-oriented polymer sheets to photographic base paper because they offer a combination of excellent adhesion to smooth biaxially oriented polymer sheets, are easily melt extruded using conventional extrusion equipment and are low in cost when compared to other adhesive resins. Metallocenes are a class of highly active olefin catalysts that are used in the preparation of polyolefin plastomers. These catalysts, particularly those based on group IVB transition metals such as zirconium, titanium, and hafnium, show extremely high activity in ethylene polymerization. Various forms of the catalyst system of the metallocene type may be used for polymerization to prepare the polymers used for bonding biaxially oriented polyolefin sheets to cellulose paper. Forms of the catalyst system include but are not limited to those of homogeneous, supported catalyst type, high pressure process or a slurry or a solution polymerization process. The metallocene catalysts are also highly flexible in that, by manipulation of catalyst composition and reaction conditions, they may be made to provide polyolefins with controllable molecular weights. Suitable polyolefins include polypropylene, polyethylene, polymethylpentene, polystyrene, polybutylene and mixtures thereof.

Development of these metallocene catalysts for the polymerization of ethylene is found in U.S. Pat. No. 4,937,299 (Ewen et al.) The most preferred metallocene catalyzed copolymers are very low density polyethylene (VLDPE) copolymers of ethylene and a $C_4$ to $C_{10}$ alpha monolefin, most preferably copolymers and terpolymers of ethylene and butene-1 and hexene-1. The melt index of the metallocene catalyzed ethylene plastomers preferably fall in a range of from 2.5 g/10 min to 27 g/10 min. The density of the metallocene catalyzed ethylene plastomers preferably falls in a range of from 0.8800 to 0.9100. In one preferred embodiment, low density polyethylene (hereinafter referred to as LDPE) may be utilized with the metallocene catalyzed ethylene plastomer. In general, the preferred range of LDPE blended is 10% to 80% by weight.

Addenda, also referred to herein as additives, may also be added to the adhesive layer. Any known material used in the art to improve the optical performance of the system may be used. The use of $TiO_2$ is preferred. During the lamination process, it is desirable to also maintain control of the tension of the flange sheets in order to minimize curl in the resulting laminated receiver support.

The imaging support, while described as having preferably at least two or three layers—a core and a flange layer on at least one side, may also be provided with additional layers that may serve to change the properties of the support. These might include layers to provide a vapor barrier, to improve opacity, to control color or static, to make them heat sealable, or to improve the adhesion to the support or to the photosensitive layers. Examples of this would be coating polyvinylidene chloride for heat seal properties. Further examples include flame, plasma, or corona discharge treatment to improve printability or adhesion.

Biaxially oriented sheets, while described as having preferably at least one layer, may also be provided with additional layers that may serve to change the properties of the biaxially oriented sheets. A different effect may be achieved by adding additional layers. Such layers might contain tints, antistatic materials, or slip agents to produce sheets of unique properties. Biaxially oriented sheets may be formed with surface layers, referred to herein as skin layers, which would provide an improved adhesion, or look to the support and photographic element. The biaxially oriented extrusion may be carried out with as many as 10 layers if desired to achieve some particular desired property. The biaxially oriented sheet may be made with layers of the same polymeric material, or it may be made with layers of different polymeric composition. For compatibility, an auxiliary layer may be used to promote adhesion of multiple layers.

A preferred application of the invention is in imaging elements, including those utilizing photographic, electrophotographic, electrostatographic, photothermographic, migration, electrothermographic, dielectric recording, thermal dye transfer, ink jet and other types of imaging. A more preferred application of the invention is in photographic imaging elements, particularly photographic paper and other display products. An imaging element utilized in the present invention comprises at least one imaging layer on a support.

As used herein the phrase "imaging element" is a material that may be used as a imaging support for the transfer of images to the support by techniques such as ink jet printing or thermal dye transfer as well as a support for silver halide images. As used herein, the phrase "photographic element" is a material that utilizes photosensitive silver halide in the formation of images.

Inks used to image the recording elements of the present invention are well known in the art. The ink compositions used in inkjet printing typically may be liquid compositions comprising a solvent or carrier liquid, dyes or pigments, humectants, organic solvents, detergents, thickeners, preservatives. The solvent or carrier liquid may be solely water or may be water mixed with other water-miscible solvents such as polyhydric alcohols. Inks in which organic materials such as polyhydric alcohols may be the predominant carrier or solvent liquid may also be used. Particularly useful are mixed solvents of water and polyhydric alcohols. The dyes used in such compositions may be typically water-soluble direct or acid type dyes. Such liquid compositions have been described extensively in the prior art including, for example, U.S. Pat. Nos. 4,381,946; 4,239,543; and 4,781,758, the disclosures of which are hereby incorporated by reference.

When used as inkjet imaging media, the recording elements or media typically comprise a substrate or a support material having on at least one surface thereof an ink receiving or recording/recording or image-forming layer. If desired, in order to improve the adhesion of the inkjet receiving or recording layer to the support, the surface of the support may be corona-discharge-treated prior to applying the solvent-absorbing layer to the support or, alternatively, an undercoating, such as a layer formed from a halogenated phenol or a partially hydrolyzed vinyl chloride-vinyl acetate copolymer, may be applied to the surface of the support. The inkjet receiving or recording layer may be preferably coated onto the support layer from water or water-alcohol solutions at a dry thickness ranging from 3 to 75 micrometers, preferably 8 to 50 micrometers.

Any known inkjet receiver layer may be used in combination with other particulate materials. For example, the ink receiving or recording layer may consist primarily of inorganic oxide particles such as silicas, modified silicas, clays, aluminas, fusible beads such as beads comprised of thermoplastic or thermosetting polymers, non-fusible organic beads, or hydrophilic polymers such as naturally-occurring hydrophilic colloids and gums such as gelatin, albumin, guar, xantham, acacia, chitosan, starches and their derivatives, derivatives of natural polymers such as functionalized proteins, functionalized gums and starches, and cellulose ethers and their derivatives, and synthetic polymers such as polyvinyloxazoline, polyvinylmethyloxazoline, polyoxides, polyethers, poly(ethylene imine), poly(acrylic acid), poly (methacrylic acid), n-vinyl amides including polyacrylamide and polyvinylpyrrolidone, and poly(vinyl alcohol), its derivatives and copolymers, and combinations of these materials. Hydrophilic polymers, inorganic oxide particles, and organic beads may be present in one or more layers on the substrate and in various combinations within a layer.

A porous structure may be introduced into ink receiving or recording layers comprised of hydrophilic polymers by the addition of ceramic or hard polymeric particulates, by foaming or blowing during coating, or by inducing phase separation in the layer through introduction of non-solvent. In general, it is preferred for the base layer to be hydrophilic, but not porous. This may be especially true for photographic quality prints, in which porosity may cause a loss in gloss. In particular, the ink receiving or recording layer may consist of any hydrophilic polymer or combination of polymers with or without additives as is well known in the art.

If desired, the ink receiving or recording layer may be overcoated with an ink-permeable, anti-tack protective layer such as, for example, a layer comprising a cellulose derivative or a cationically-modified cellulose derivative or mixtures thereof. An especially preferred overcoat is poly β-1, 4-anhydro-glucose-g-oxyethylene-g-(2'-hydroxypropyl)-N, N-dimethyl-N-dodecylammonium chloride. The overcoat layer may be non porous, but may be ink permeable and serves to improve the optical density of the images printed on the element with water-based inks. The overcoat layer may also protect the ink receiving or recording layer from abrasion, smudging, and water damage. In general, this overcoat layer may be present at a dry thickness of from 0.1 to 5 µM, preferably from 0.25 to 3 µm.

In practice, various additives may be employed in the ink receiving or recording layer and overcoat. These additives include surface active agents such as surfactant(s) to improve coatability and to adjust the surface tension of the dried coating, acid or base to control the pH, antistatic or conductive agents, suspending agents, antioxidants, hardening agents to cross-link the coating, antioxidants, UV stabilizers, light stabilizers. In addition, a mordant may be added in small quantities (2%-10% by weight of the base layer) to improve waterfastness. Useful mordants are disclosed in U.S. Pat. No. 5,474,843.

The layers, including the ink receiving or recording layer and the overcoat layer, may be coated by conventional coating means onto a transparent or opaque support material. Coating methods may include, but are not limited to, blade coating, wound wire rod coating, slot coating, slide hopper coating, gravure, curtain coating. Some of these methods allow for simultaneous coatings of both layers, which is preferred from a manufacturing economic perspective.

The ink receiving or recording layer (IRL) may also contain varying levels and sizes of matting agents for the purpose of controlling gloss, friction, and/or fingerprint resistance, surfactants to enhance surface uniformity and to adjust the surface tension of the dried coating, mordanting agents, antioxidants, UV absorbing compounds, light stabilizers.

The thermal dye image-receiving layer (hereinafter referred to as DRL) of receiving elements used with the invention may comprise, for example, a polycarbonate, a polyurethane, a polyester, polyvinyl chloride, poly(styrene-co-acrylonitrile), poly(caprolactone) or mixtures thereof. The dye image-receiving layer may be present in any amount that is effective for the intended purpose. In general, good results have been obtained at a concentration of from 1 to 10 g/m$^2$. An overcoat layer may be further coated over the dye-receiving layer, such as described in U.S. Pat. No. 4,775,657 of Harrison et al.

Dye-donor elements that are used with dye-receiving elements used in the invention conventionally comprise a support having thereon a dye-containing layer. Any dye may be used in the dye-donor employed in the invention provided it is transferable to the dye-receiving layer by the action of heat. Especially good results have been obtained with sublimable dyes. Dye donors applicable for use in the present invention are described, for example, in U.S. Pat. Nos. 4,916,112; 4,927,803 and 5,023,228.

As noted above, dye-donor elements are used to form a dye transfer image. Such a process comprises image-wise-heating a dye-donor element and transferring a dye image to a dye-receiving element as described above to form the dye transfer image.

In a preferred embodiment of the thermal dye transfer method of printing, a dye donor element is employed which compromises a poly-(ethylene terephthalate) support coated with sequential repeating areas of cyan, magenta, and yellow dye, and the dye transfer steps are sequentially performed for each color to obtain a three-color dye transfer image. Of course, when the process is only performed for a single color, then a monochrome dye transfer image is obtained.

Thermal printing heads that may be used to transfer dye from dye-donor elements to receiving elements used with the invention are available commercially. There may be employed, for example, a Fujitsu Thermal Head (FTP-040 MCS001), a TDK Thermal Head F415 HH7-1089 or a Rohm Thermal Head KE 2008-F3. Alternatively, other known sources of energy for thermal dye transfer may be used, such as lasers as described in, for example, GB No. 2,083,726A.

A thermal dye transfer assemblage comprises (a) a dye-donor element, and (b) a dye-receiving element as described above, the dye-receiving element being in a superposed relationship with the dye-donor element so that the dye layer of the donor element is in contact with the dye image-receiving layer of the receiving element.

When a three-color image is to be obtained, the above assemblage is formed on three occasions during the time when heat is applied by the thermal printing head. After the first dye is transferred, the elements are peeled apart. A second dye-donor element (or another area of the donor element with a different dye area) is then brought in register with the dye-receiving element and the process repeated. The third color is obtained in the same manner.

In another embodiment, a thermal imaging system, described in, inter alia, U.S. Pat. Nos. 4,771,032; 5,409,880; 5,410,335; 5,486,856; and 5,537,140, and sold by Fuji Photo Film Co., Ltd. under the Registered Trademark "AUTO-CHROME" which does not depend upon transfer of a dye, with or without a binder or carrier, from a donor to a receiving sheet may be utilized with the present invention. The imaging element contains an imaging layer, which comprises plural heat-coloring elements, each comprising a diazo compound and a coupling component causing heat-coloring. Each of the diazo compounds in the heat-coloring elements may be decomposed by radiation having a respectively different wavelength. The process uses a recording sheet having three separate superposed color-forming layers, each of which develops a different color upon heating. The top color-forming layer develops color at a lower temperature than the middle color-forming layer, which in turn develops color at a lower temperature than the bottom color-forming layer. Also, at least the top and middle color-forming layers may be deactivated by actinic radiation of a specific wavelength (the wavelength for each color-forming layer being different, but both typically being in the near ultra-violet) so that after deactivation the color-forming layer will not generate color upon heating.

This recording sheet is imaged by first imagewise heating the sheet so that color is developed in the top color-forming layer, the heating being controlled so that no color is developed in either of the other two color-forming layers. The sheet is next passed beneath a radiation source of a wavelength, which deactivates the top color-forming layer, but does not deactivate the middle color-forming layer. The sheet is then again imagewise heated by the thermal head, but with the head producing more heat than in the first pass, so that color is developed in the middle color-forming layer, and the sheet is passed beneath a radiation source of a wavelength, which deactivates the middle color-forming layer. Finally, the sheet is again imagewise heated by the thermal head, but with the head producing more heat than in the second pass, so that color is developed in the bottom color-forming layer.

Briefly, in the system, heat-responsive microcapsules containing a dye precursor, diazonium salt are controlled by heat, whereby the contact between the inclusion and a developer and an organic base compound having been prepared outside the microcapsules is controlled, or that is, the reaction between them is controlled to thereby control the dye formation resulting from the contact reaction. Next, the microcapsules are exposed to UV rays so as to decompose the dye precursor. The thus-decomposed dye precursor does not react with the coupler, and therefore gives no color. The latter stage is for color image fixation. The heat-responsive microcapsules are meant to indicate microcapsules of which the substance permeability through their walls varies under heat. For full-color imaging in the system, the heat-responsive microcapsules themselves and the diazonium salt to be therein are specifically defined. The details of the system are in *Printer Materials and Chemicals* (edited by Kyosuke Takahashi and Masahiro Irie, published by CMC, 1995).

The electrographic and electrophotographic processes and their individual steps have been well described in detail in many books and publications. The processes incorporate the basic steps of creating an electrostatic image, developing that image with charged, colored particles (toner), optionally transferring the resulting developed image to a secondary substrate, and fixing the image to the substrate. There are numerous variations in these processes and basic steps; the use of liquid toners in place of dry toners is simply one of those variations.

The first basic step, creation of an electrostatic image, may be accomplished by a variety of methods. The electrophotographic process of copiers uses imagewise photodischarge, through analog or digital exposure, of a uniformly charged photoconductor. The photoconductor may be a single-use system, or it may be rechargeable and reimageable, like those based on selenium or organic photoreceptors.

In an alternate electrographic process, electrostatic images are created iono-graphically. The latent image is created on dielectric (charge-holding) medium, either paper or film. Voltage is applied to selected metal styli or writing nibs from an array of styli spaced across the width of the medium, causing a dielectric breakdown of the air between the selected styli and the medium. Ions are created, which form the latent image on the medium.

Electrostatic images, however generated, are developed with oppositely charged toner particles. For development with liquid toners, the liquid developer is brought into direct contact with the electrostatic image. Usually a flowing liquid is employed, to ensure that sufficient toner particles are available for development. The field created by the electrostatic image causes the charged particles, suspended in a nonconductive liquid, to move by electrophoresis. The charge of the latent electrostatic image is thus neutralized by the oppositely charged particles. The theory and physics of electrophoretic development with liquid toners are well described in many books and publications.

If a reimageable photoreceptor or an electrographic master is used, the toned image is transferred to paper (or other substrate). The paper is charged electrostatically, with the polarity chosen to cause the toner particles to transfer to the paper. Finally, the toned image is fixed to the paper. For self-fixing toners, residual liquid is removed from the paper by air-drying or heating. Upon evaporation of the solvent these toners form a film bonded to the paper. For heat-fusible toners, thermoplastic polymers are used as part of the particle. Heating both removes residual liquid and fixes the toner to paper.

The dye receiving layer or DRL (dye receiving layer for thermal applications) or the ink receiving layer (IRL for inkjet imaging) may be applied by any known methods. Such as solvent coating, or melt extrusion coating techniques. The DRL/IRL is coated over the TL (tie layer) at a thickness ranging from 0.1-10 μm, preferably 0.5-5 μm. There are many known formulations, which may be useful as dye receiving layers. The primary requirement is that the DRL/IRL is compatible with the inks with which it will be imaged so as to yield the desirable color gamut and density. As the ink drops pass through the DRL/IRL, the dyes are retained or mordanted in the DRL/IRL, while the ink solvents pass freely through the DRL/IRL and are rapidly absorbed by the TL. Additionally, the DRL/IRL formulation is preferably coated from water, exhibits adequate adhesion to the TL, and allows for easy control of the surface gloss.

For example, Misuda et al. in U.S. Pat. Nos. 4,879,166; 5,264,275; 5,104,730; 4,879,166, and Japanese patents 1,095,091; 2,276,671; 2,276,670; 4,267,180; 5,024,335; and 5,016,517 discloses aqueous based DRL/IRL formulations comprising mixtures of psuedo-bohemite and certain water soluble resins. Light, in U.S. Pat. Nos. 4,903,040; 4,930,041; 5,084,338; 5,126,194; 5,126,195; and 5,147,717 discloses aqueous-based DRL/IRL formulations comprising mixtures of vinyl pyrrolidone polymers and certain water-dispersible and/or water-soluble polyesters, along with other polymers and addenda, also referred to herein as additives. Butters et al. in U.S. Pat. Nos. 4,857,386 and 5,102,717 disclose ink-absorbent resin layers comprising mixtures of vinyl pyrrolidone polymers and acrylic or methacrylic polymers. Sato et al. in U.S. Pat. No. 5,194,317 and Higuma et al. in U.S. Pat. No. 5,059,983 disclose aqueous-coatable DRL/IRL formulations based on poly (vinyl alcohol). Iqbal, in U.S. Pat. No. 5,208,092, discloses water-based DRL/IRL formulations comprising vinyl copolymers, which are subsequently cross-linked. In addition to these examples, there may be other known or contemplated DRL/IRL formulations, which are consistent with the aforementioned primary and secondary requirements of the DRL/IRL, all of which fall under the spirit and scope of the current invention.

The preferred DRL is a 0.1-10 micrometers DRL, which is coated as an aqueous dispersion of 5 parts alumoxane and 5 parts poly (vinyl pyrrolidone). The DRL may also contain varying levels and sizes of matting agents for the purpose of controlling gloss, friction, and/or finger print resistance, surfactants to enhance surface uniformity and to adjust the surface tension of the dried coating, mordanting agents, anti-oxidants, UV absorbing compounds, light stabilizers.

Although the dye or ink receiving elements as described above may be successfully used to achieve the advantages of the present invention, it may be desirable to overcoat the DRL/IRL for the purpose of enhancing the durability of the imaged element. Such overcoats may be applied to the DRL/IRL either before or after the element is imaged. For example, the DRL/IRL may be overcoated with an ink-permeable layer through which inks freely pass. Layers of this type are described in U.S. Pat. Nos. 4,686,118; 5,027,131; and 5,102,717. Alternatively, an overcoat may be added after the element is imaged. Any of the known laminating films and equipment may be used for this purpose. The inks used in the aforementioned imaging process are well known, and the ink formulations are often closely tied to the specific processes, that is, continuous, piezoelectric, or thermal. Therefore, depending on the specific ink process, the inks may contain widely differing amounts and combinations of solvents, colorants, preservatives, surfactants, and humectants. Inks preferred for use in combination with the image recording elements are water-based, such as those currently sold for use in the Hewlett-Packard Desk Writer 560C printer. However, it is intended that alternative embodiments of the image-recording elements as described above, which may be formulated for use with inks which are specific to a given ink-recording process or to a given commercial vendor, fall within the scope of the present invention.

As used herein, the phrase "photographic element" is a material that utilizes photosensitive silver halide in the formation of images. The photographic elements may be black and white, single color elements or multicolor elements. Multicolor elements contain image dye-forming units sensitive to each of the three primary regions of the spectrum. Each unit may comprise a single emulsion layer or multiple emulsion layers sensitive to a given region of the spectrum. The layers of the element, including the layers of the image-forming units, may be arranged in various orders as known in the art. In an alternative format, the emulsions sensitive to each of the three primary regions of the spectrum may be disposed as a single segmented layer.

For display material, at least one image layer containing silver halide and a dye forming coupler located on the top side or surface and bottom side or surface of the imaging element is suitable. Applying the imaging layer to either the top and bottom is suitable for a photographic display material, but it is not sufficient to create a photographic display material that is optimum for both a reflection display and a transmission display. For the display material of this invention, at least one image layer comprises at least one dye forming coupler located on both the top and bottom of the imaging support of this invention is preferred. Applying an imaging layer to both the top and bottom of the support allows for the display material to have the required density for both reflective viewing and for transmission viewing of the image. This duplitized "day/night" photographic display material has significant commercial value in that the day/night display material may be used for both reflective viewing and transmission viewing. Prior art display materials were optimized for either transmission viewing or reflective viewing but not both simultaneously.

It has been found that the duplitized emulsion coverage should be in a range that is greater than 75% and less than 175% of typical emulsion coverages for reflective consumer paper that contain typical amounts of silver and coupler. At coverages of less than 75% on the front side it was found that a pleasing reflection print may not be obtained. Further, at coverages of less than 75% on the backside, pleasing transmission images may not be obtained. Coverages greater than 175% are undesirable because of the increased material expense and also because of the need for extended development times in the processing solutions. In a more preferred embodiment, emulsion laydowns should be from 100 to 150% of that found for a typical reflective consumer color paper.

The display material of this invention wherein the amount of dye forming coupler is substantially the same on the top and bottom sides is most preferred because it allows for optimization of image density, while allowing for developer time less than 50 seconds. Further, coating substantially the same amount of light sensitive silver halide emulsion on both sides has the additional benefit of balancing the imaging element for image curl caused by the contraction and expansion of the hygroscopic gel typically found in photographic emulsions.

The photographic emulsions useful with this invention are generally prepared by precipitating silver halide crystals in a colloidal matrix by methods conventional in the art. The colloid is typically a hydrophilic sheet-forming agent such as gelatin, alginic acid, or derivatives thereof.

The crystals formed in the precipitation step are washed and then chemically and spectrally sensitized by adding spectral sensitizing dyes and chemical sensitizers, and by providing a heating step during which the emulsion temperature is raised, typically from 40° C. to 70° C., and maintained for a period of time. The precipitation and spectral and chemical sensitization methods utilized in preparing the emulsions employed in the invention may be those methods known in the art.

Chemical sensitization of the emulsion typically employs sensitizers such as: sulfur-containing compounds, for example, allyl isothiocyanate, sodium thiosulfate and allyl thiourea; reducing agents, for example, polyamines and stannous salts; noble metal compounds, for example, gold, platinum; and polymeric agents, for example, polyalkylene oxides. As described, heat treatment is employed to complete chemical sensitization. Spectral sensitization is effected with a combination of dyes, which are designed for the wavelength range of interest within the visible or infrared spectrum. It is known to add such dyes both before and after heat treatment.

The silver halide emulsions utilized used with this invention may be comprised of any halide distribution. Thus, they may be comprised of silver chloride, silver bromide, silver bromochloride, silver chlorobromide, silver iodochloride, silver iodobromide, silver bromoiodochloride, silver chloroiodobromide, silver iodobromochloride, and silver iodochlorobromide emulsions. It is preferred, however, that the emulsions be predominantly silver chloride emulsions. By predominantly silver chloride, it is meant that the grains of the emulsion are greater than 50 mole percent silver chloride. Preferably, they are greater than 90 mole percent silver chloride; and optimally greater than 95 mole percent silver chloride.

The silver halide emulsions may contain grains of any size and morphology. Thus, the grains may take the form of cubes, octahedrons, cubo-octahedrons, or any of the other naturally occurring morphologies of cubic lattice type silver halide grains. Further, the grains may be irregular such as spherical grains or tabular grains. Grains having a tabular or cubic morphology are preferred.

The photographic elements useful with the invention may utilize emulsions as described in *The Theory of the Photographic Process*, Fourth Edition, T. H. James, Macmillan Publishing Company, Inc., 1977, pages 151-152. Reduction sensitization has been known to improve the photographic sensitivity of silver halide emulsions. While reduction sensitized silver halide emulsions generally exhibit good photographic speed, they often suffer from undesirable fog and poor storage stability.

Reduction sensitization may be performed intentionally by adding reduction sensitizers, chemicals that reduce silver ions to form metallic silver atoms, or by providing a reducing environment such as high pH (excess hydroxide ion) and/or low pAg (excess silver ion). During precipitation of a silver halide emulsion, unintentional reduction sensitization may occur when, for example, silver nitrate or alkali solutions are added rapidly or with poor mixing to form emulsion grains. Also, precipitation of silver halide emulsions in the presence of ripeners (grain growth modifiers) such as thioethers, selenoethers, thioureas, or ammonia tends to facilitate reduction sensitization.

Examples of reduction sensitizers and environments which may be used during precipitation or spectral/chemical sensitization to reduction sensitize an emulsion include ascorbic acid derivatives; tin compounds; polyamine compounds; and thiourea dioxide-based compounds described in U.S. Pat. Nos. 2,487,850; 2,512,925; and British Patent 789,823. Specific examples of reduction sensitizers or conditions, such as dimethylamineborane, stannous chloride, hydrazine, high pH (pH 8-11) and low pAg (pAg 1-7) ripening are discussed by S. Collier in Photographic Science and Engineering, 23, p. 113 (1979). Examples of processes for preparing intentionally reduction sensitized silver halide emulsions are described in EP 0 348 934 A1 (Yamashita), EP 0 369 491 (Yamashita), EP 0 371 388 (Ohashi), EP 0 396 424 A1 (Takada), EP 0 404 142 A1 (Yamada), and EP 0 435 355 A1 (Makino).

The photographic elements of this invention may use emulsions doped with Group VIII metals such as iridium, rhodium, osmium, and iron as described in *Research Disclosure*, September 1994, Item 36544, Section I, published by Kenneth Mason Publications, Ltd., Dudley Annex, 12a North Street, Emsworth, Hampshire PO10 7DQ, ENGLAND. Additionally, a general summary of the use of iridium in the sensitization of silver halide emulsions is contained in Carroll, "Iridium Sensitization: A Literature Review," Photographic Science and Engineering, Vol. 24, No. 6, 1980. A method of manufacturing a silver halide emulsion by chemically sensitizing the emulsion in the presence of an iridium salt and a photographic spectral sensitizing dye is described in U.S. Pat. No. 4,693,965. In some cases, when such dopants are incorporated, emulsions show an increased fresh fog and a lower contrast sensitometric curve when processed in the color reversal E-6 process as described in The British Journal of Photography Annual, 1982, pages 201-203.

A typical multicolor photographic element useful with the invention comprises the invention laminated support bearing a cyan dye image-forming unit comprising at least one red-sensitive silver halide emulsion layer having associated therewith at least one cyan dye-forming coupler; a magenta image-forming unit comprising at least one green-sensitive silver halide emulsion layer having associated therewith at least one magenta dye-forming coupler; and a yellow dye image-forming unit comprising at least one blue-sensitive silver halide emulsion layer having associated therewith at least one yellow dye-forming coupler. The element may contain additional layers, such as filter layers, interlayers, overcoat layers, subbing layers. The support useful with the invention may also be utilized for black and white photographic print elements.

When the base material useful with the invention with the integral diffusion layer is coated with silver halide photographic element, it is capable of excellent performance when exposed by either an electronic printing method or a conventional optical printing method. An electronic printing method comprises subjecting a radiation sensitive silver halide emulsion layer of a recording element to actinic radiation of at least $10^{-4}$ ergs/cm$^2$ for up to 100µ seconds duration in a pixel-by-pixel mode wherein the silver halide emulsion layer is comprised of silver halide grains as described above. A conventional optical printing method comprises subjecting a radiation sensitive silver halide emulsion layer of a recording element to actinic radiation of at least $10^{-4}$ ergs/cm$^2$ for $10^{-3}$ to 300 seconds in an image-wise mode wherein the silver halide emulsion layer is comprised of silver halide grains as described above. A radiation-sensitive emulsion comprised of silver halide grains (a) containing greater than 50 mole percent chloride, based on silver, (b) having greater than 50 percent of their surface area provided by {100} crystal faces, and (c) having a central portion accounting for from 95 to 99 percent of total silver and containing two dopants selected to satisfy each of the following class requirements: (i) a hexacoordination metal complex which satisfies the formula $$[ML_6]^n \qquad (I)$$

wherein n is zero, -1, -2, -3, or -4; M is a filled frontier orbital polyvalent metal ion, other than iridium; and $L_6$ represents bridging ligands which may be independently selected, provided that least four of the ligands are anionic ligands, and at least one of the ligands is a cyano ligand or a ligand more electronegative than a cyano ligand; and (ii) an iridium coordination complex containing a thiazole or substituted thiazole ligand may be used with the present invention.

The combination of dopants (i) and (ii) provides greater reduction in reciprocity law failure than may be achieved with either dopant alone. The combination of dopants (i) and (ii) achieves reductions in reciprocity law failure beyond the simple additive sum achieved when employing either dopant class by itself. The combination of dopants (i) and (ii) provides greater reduction in reciprocity law failure, particularly for high intensity and short duration exposures. The combination of dopants (i) and (ii) further achieves high intensity reciprocity with iridium at relatively low levels, and both high and low intensity reciprocity improvements even while using conventional gelatino-peptizer (for example, other than low methionine gelatino-peptizer).

In a preferred practical application, the advantages of the invention may be transformed into increased throughput of digital substantially artifact-free color print images while exposing each pixel sequentially in synchronism with the digital data from an image processor.

Improved reciprocity performance may be obtained for silver halide grains (a) containing greater than 50 mole percent chloride, based on silver, and (b) having greater than 50 percent of their surface area provided by {100} crystal faces by employing a hexacoordination complex dopant of class (i) in combination with an iridium complex dopant comprising a thiazole or substituted thiazole ligand. The reciprocity improvement is obtained for silver halide grains employing conventional gelatino-peptizer, unlike the contrast improvement described for the combination of dopants set forth in U.S. Pat. Nos. 5,783,373 and 5,783,378, which requires the use of low methionine gelatino-peptizers as discussed therein, and which states it is preferable to limit the concentration of any gelatino-peptizer with a methionine level of greater than 30 micromoles per gram to a concentration of less than 1 percent of the total peptizer employed. It is specifically contemplated to use significant levels (that is, greater than 1 weight percent of total peptizer) of conventional gelatin (for example, gelatin having at least 30 micromoles of methionine per gram) as a gelatino-peptizer for the silver halide grains of the emulsions useful with the invention. A gelatino-peptizer is employed which comprises at least 50 weight percent of gelatin containing at least 30 micromoles of methionine per gram, as it is frequently desirable to limit the level of oxidized low methionine gelatin which may be used for cost and certain performance reasons.

It may be contemplated to employ a class (i) hexacoordination complex dopant satisfying the formula:

$$[ML_6]^n \qquad (I)$$

wherein n is zero, -1, -2, -3, or -4;

M is a filled frontier orbital polyvalent metal ion, other than iridium, preferably $Fe^{+2}$, $Ru^{+2}$, $Os^{+2}$, $Co^{+3}$, $Rh^{+3}$, $Pd^{+4}$ or $Pt^{+4}$, more preferably an iron, ruthenium or osmium ion, and most preferably a ruthenium ion;

$L_6$ represents six bridging ligands, which may be independently selected, provided that least four of the ligands are anionic ligands and at least one (preferably at least 3 and optimally at least 4) of the ligands is a cyano ligand or a ligand more electronegative than a cyano ligand. Any remaining ligands may be selected from among various other bridging ligands, including aquo ligands, halide ligands (specifically, fluoride, chloride, bromide and iodide), cyanate ligands, thiocyanate ligands, selenocyanate ligands, tellurocyanate ligands, and azide ligands. Hexacoordinated transition metal complexes of class (i), which include six cyano ligands, are specifically preferred.

Illustrations of specifically contemplated class (i) hexa-coordination complexes for inclusion in the high chloride grains are provided by Olm et al U.S. Pat. No. 5,503,970 and Daubendiek et al U.S. Pat. Nos. 5,494,789 and 5,503,971, and Keevert et al U.S. Pat. No. 4,945,035, as well as Murakami et al Japanese Patent Application Hei-2[1990]-249588, and Research Disclosure Item 36736. Useful neutral and anionic organic ligands for class (ii) dopant hexa-coordination complexes are disclosed by Olm et al U.S. Pat. No. 5,360,712 and Kuromoto et al U.S. Pat. No. 5,462,849.

Class (i) dopant is preferably introduced into the high chloride grains after at least 50 (most preferably 75 and optimally 80) percent of the silver has been precipitated, but before precipitation of the central portion of the grains has been completed. Preferably class (i) dopant is introduced before 98 (most preferably 95 and optimally 90) percent of the silver has been precipitated. Stated in terms of the fully precipitated grain structure, class (i) dopant is preferably present in an interior shell region that surrounds at least 50 (most preferably 75 and optimally 80) percent of the silver and, with the more centrally located silver, accounts the entire central portion (99 percent of the silver), most preferably accounts for 95 percent, and optimally accounts for 90 percent of the silver halide forming the high chloride grains. The class (i) dopant may be distributed throughout the interior shell region delimited above or may be added as one or more bands within the interior shell region.

Class (i) dopant may be employed in any conventional useful concentration. A preferred concentration range is from $10^{-8}$ to $10^{-3}$ mole per silver mole, most preferably from $10^{-6}$ to $5 \times 10^{-4}$ mole per silver mole.

The following are specific illustrations of class (i) dopants:

| (i-1)  | $[Fe(CN)_6]^{-4}$           |
| (i-2)  | $[Ru(CN)_6]^{-4}$           |
| (i-3)  | $[Os(CN)_6]^{-4}$           |
| (i-4)  | $[Rh(CN)_6]^{-3}$           |
| (i-5)  | $[Co(CN)_6]^{-3}$           |
| (i-6)  | $[Fe(pyrazine)(CN)_5]^{-4}$ |
| (i-7)  | $[RuCl(CN)_5]^{-4}$         |
| (i-8)  | $[OsBr(CN)_5]^{-4}$         |
| (i-9)  | $[RhF(CN)_5]^{-3}$          |
| (i-10) | $[In(NCS)_6]^{-3}$          |
| (i-11) | $[FeCO(CN)_5]^{-3}$         |
| (i-12) | $[RuF_2(CN)_4]^{-4}$        |
| (i-13) | $[OsCl_2(CN)_4]^{-4}$       |
| (i-14) | $[RhI_2(CN)_4]^{-3}$        |
| (i-15) | $[Ga(NCS)_6]^{-3}$          |
| (i-16) | $[Ru(CN)_5(OCN)]^{-4}$      |
| (i-17) | $[Ru(CN)_5(N_3)]^{-4}$      |
| (i-18) | $[Os(CN)_5(SCN)]^{-4}$      |
| (i-19) | $[Rh(CN)_5(SeCN)]^{-3}$     |
| (i-20) | $[Os(CN)Cl_5]^{-4}$         |

-continued

| (i-21) | $[Fe(CN)_3Cl_3]^{-3}$     |
| (i-22) | $[Ru(CO)_2(CN)_4]^{-1}$   |

When the class (i) dopants have a net negative charge, it is appreciated that they are associated with a counter ion when added to the reaction vessel during precipitation. The counter ion is of little importance, since it is ionically dissociated from the dopant in solution and is not incorporated within the grain. Common counter ions known to be fully compatible with silver chloride precipitation, such as ammonium and alkali metal ions, are contemplated. It is noted that the same comments apply to class (ii) dopants, otherwise described below.

The class (ii) dopant is an iridium coordination complex containing at least one thiazole or substituted thiazole ligand. Careful scientific investigations have revealed Group VIII hexahalo coordination complexes to create deep electron traps, as illustrated R. S. Eachus, R. E. Graves and M. T. Olm *J. Chem. Phys.*, Vol. 69, pp. 4580-7 (1978) and *Physica Status Solidi A*, Vol. 57, 429-37 (1980) and R. S. Eachus and M. T. Olm *Annu. Rep. Prog. Chem. Sect. C. Phys. Chem.*, Vol. 83, 3, pp. 3-48 (1986). The class (ii) dopants are believed to create such deep electron traps. The thiazole ligands may be substituted with any photographically acceptable substituent, which does not prevent incorporation of the dopant into the silver halide grain. Exemplary substituents include lower alkyl (for example, alkyl groups containing 1-4 carbon atoms), and specifically methyl. A specific example of a substituted thiazole ligand, which may be used is 5-methylthiazole. The class (ii) dopant preferably is an iridium coordination complex having ligands each of which are more electropositive than a cyano ligand. In a specifically preferred form the remaining non-thiazole or non-substituted-thiazole ligands of the coordination complexes forming class (ii) dopants are halide ligands.

It is specifically contemplated to select class (ii) dopants from among the coordination complexes containing organic ligands disclosed by Olm et al U.S. Pat. No. 5,360,712; Olm et al U.S. Pat. No. 5,457,021; and Kuromoto et al U.S. Pat. No. 5,462,849.

In a preferred form it is contemplated to employ as a class (ii) dopant a hexacoordination complex satisfying the formula:

$$[IrL^i_6]^{n-}$$

wherein n' is zero, -1, -2, -3, or -4; and $L^1_6$ represents six bridging ligands, which may be independently selected, provided that at least four of the ligands are anionic ligands, each of the ligands is more electropositive than a cyano ligand, and at least one of the ligands comprises a thiazole or substituted thiazole ligand. In a specifically preferred form at least four of the ligands are halide ligands, such as chloride or bromide ligands.

Class (ii) dopant is preferably introduced into the high chloride grains after at least 50 (most preferably 85 and optimally 90) percent of the silver has been precipitated, but before precipitation of the central portion of the grains has been completed. Preferably class (ii) dopant is introduced before 99 (most preferably 97 and optimally 95) percent of the silver has been precipitated. Stated in terms of the fully precipitated grain structure, class (ii) dopant is preferably present in an interior shell region that surrounds at least 50

(most preferably 85 and optimally 90) percent of the silver and, with the more centrally located silver, accounts the entire central portion (99 percent of the silver), most preferably accounts for 97 percent, and optimally accounts for 95 percent of the silver halide forming the high chloride grains. The class (ii) dopant may be distributed throughout the interior shell region delimited above or may be added as one or more bands within the interior shell region.

Class (ii) dopant may be employed in any conventional useful concentration. A preferred concentration range is from $10^{-9}$ to $10^{-4}$ mole per silver mole. Iridium is most preferably employed in a concentration range of from $10^{-8}$ to $10^{-5}$ mole per silver mole.

Specific illustrations of class (ii) dopants are the following:

| | |
|---|---|
| (ii-1) | $[IrCl_5(thiazole)]^{-2}$ |
| (ii-2) | $[IrCl_4(thiazole)_2]^{-1}$ |
| (ii-3) | $[IrBr_5(thiazole)]^{-2}$ |
| (ii-4) | $[IrBr_4(thiazole)_2]^{-1}$ |
| (ii-5) | $[IrCl_5(5\text{-methylthiazole})]^{-2}$ |
| (ii-6) | $[IrCl_4(5\text{-methylthiazole})_2]^{-1}$ |
| (ii-7) | $[IrBr_5(5\text{-methylthiazole})]^{-2}$ |
| (ii-8) | $[IrBr_4(5\text{-methylthiazole})_2]^{-1}$ |

A layer using a magenta dye forming coupler, a class (ii) dopant in combination with an $OsCl_5(NO)$ dopant has been found to produce a preferred result.

Emulsions may be realized by modifying the precipitation of conventional high chloride silver halide grains having predominantly (>50%) {100} crystal faces by employing a combination of class (i) and (ii) dopants as described above.

The silver halide grains precipitated contain greater than 50 mole percent chloride, based on silver. Preferably the grains contain at least 70 mole percent chloride and, optimally at least 90 mole percent chloride, based on silver. Iodide may be present in the grains up to its solubility limit, which is in silver iodochloride grains, under typical conditions of precipitation, 11 mole percent, based on silver. It is preferred for most photographic applications to limit iodide to less than 5 mole percent iodide, most preferably less than 2 mole percent iodide, based on silver.

Silver bromide and silver chloride are miscible in all proportions. Hence, any portion, up to 50 mole percent, of the total halide not accounted for chloride and iodide, may be bromide. For color reflection print (that is, color paper) uses bromide is typically limited to less than 10 mole percent based on silver, and iodide is limited to less than 1 mole percent based on silver.

In a widely used form high chloride grains are precipitated to form cubic grains—that is, grains having {100} major faces and edges of equal length. In practice ripening effects usually round the edges and corners of the grains to some extent. However, except under extreme ripening conditions substantially more than 50 percent of total grain surface area is accounted for by {100} crystal faces.

High chloride tetradecahedral grains are a common variant of cubic grains. These grains contain 6 {100} crystal faces and 8 {111} crystal faces. Tetradecahedral grains are within the contemplation of this invention to the extent that greater than 50 percent of total surface area is accounted for by {100} crystal faces.

Although it is common practice to avoid or minimize the incorporation of iodide into high chloride grains employed in color paper, it is has been recently observed that silver iodochloride grains with {100} crystal faces and, in some instances, one or more {111} faces offer exceptional levels of photographic speed. In the these emulsions iodide is incorporated in overall concentrations of from 0.05 to 3.0 mole percent, based on silver, with the grains having a surface shell of greater than 50 Å that is substantially free of iodide and a interior shell having a maximum iodide concentration that surrounds a core accounting for at least 50 percent of total silver. Such grain structures are illustrated by Chen et al., EPO 0718679.

In another improved form the high chloride grains may take the form of tabular grains having {100} major faces. Preferred high chloride {100} tabular grain emulsions are those in which the tabular grains account for at least 70 (most preferably at least 90) percent of total grain projected area. Preferred high chloride {100} tabular grain emulsions have average aspect ratios of at least 5 (most preferably at least >8). Tabular grains typically have thicknesses of less than 0.3 μm, preferably less than 0.2 μm, and optimally less than 0.07 μm. High chloride {100} tabular grain emulsions and their preparation are disclosed by Maskasky U.S. Pat. Nos. 5,264,337 and 5,292,632; House et al U.S. Pat. No. 5,320,938; Brust et al U.S. Pat. No. 5,314,798; and Chang et al U.S. Pat. No. 5,413,904.

Once high chloride grains having predominantly {100} crystal faces have been precipitated with a combination of class (i) and class (ii) dopants described above, chemical and spectral sensitization, followed by the addition of conventional addenda to adapt the emulsion for the imaging application of choice may take any convenient conventional form. These conventional features are illustrated by *Research Disclosure*, Item 38957, cited above, particularly:

| | |
|---|---|
| III. | Emulsion washing; |
| IV. | Chemical sensitization; |
| V. | Spectral sensitization and desensitization; |
| VII. | Antifoggants and stabilizers; |
| VIII. | Absorbing and scattering materials; |
| IX. | Coating and physical property modifying addenda; and |
| X. | Dye image formers and modifiers. |

Some additional silver halide, typically less than 1 percent, based on total silver, may be introduced to facilitate chemical sensitization. It is also recognized that silver halide may be epitaxially deposited at selected sites on a host grain to increase its sensitivity. For example, high chloride {100} tabular grains with corner epitaxy are illustrated by Maskasky U.S. Pat. No. 5,275,930. For the purpose of providing a clear demarcation, the term "silver halide grain" is herein employed to include the silver used to form the grain up to the point that the final {100} crystal faces of the grain are formed. Silver halide later deposited that does not overlie the {100} crystal faces previously formed accounting for at least 50 percent of the grain surface area is excluded in determining total silver forming the silver halide grains. Thus, the silver forming selected site epitaxy is not part of the silver halide grains while silver halide that deposits and provides the final {100} crystal faces of the grains is included in the total silver forming the grains, even when it differs significantly in composition from the previously precipitated silver halide.

Image dye-forming couplers may be included in the element such as couplers that form cyan dyes upon reaction with oxidized color developing agents which are described in such representative patents and publications as: U.S. Pat. Nos. 2,367,531; 2,423,730; 2,474,293; 2,772,162; 2,895, 826; 3,002,836; 3,034,892; 3,041,236; 4,883,746 and "Farbkuppler—Eine Literatur Ubersicht," published in Agfa Mitteilungen, Band III, pp. 156-175 (1961). Preferably such couplers are phenols and naphthols that form cyan dyes on reaction with oxidized color developing agent. Also preferable are the cyan couplers described in, for instance, European Patent Application Nos. 491,197; 544,322; 556,700; 556,777; 565,096; 570,006; and 574,948.

Typical cyan couplers are represented by the following formulas:

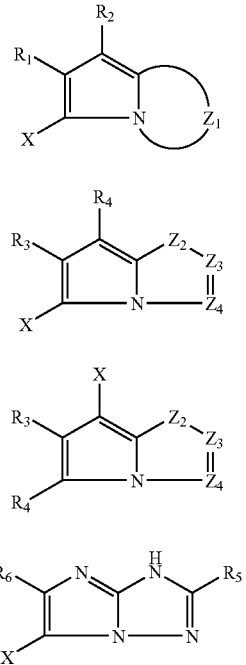

CYAN-1

CYAN-2

CYAN-3

CYAN-4 wherein $R_1$, $R_5$ and $R_8$ each represents a hydrogen or a substituent; $R_2$ represents a substituent; $R_3$, $R_4$ and $R_7$ each represents an electron attractive group having a Hammett's substituent constant $\sigma_{para}$ of 0.2 or more and the sum of the $\sigma_{para}$ values of $R_3$ and $R_4$ is 0.65 or more; $R_6$ represents an electron attractive group having a Hammett's substituent constant $\sigma_{para}$ of 0.35 or more; X represents a hydrogen or a coupling-off group; $Z_1$ represents nonmetallic atoms necessary for forming a nitrogen-containing, six-membered, heterocyclic ring which has at least one dissociative group; $Z_2$ represents —C($R_7$)= and —N=; and $Z_3$ and $Z_4$ each represents —C($R_8$)= and —N=.

Even more preferable are cyan couplers of the following formulas:

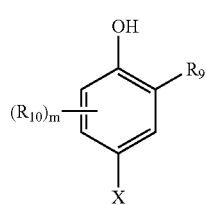

CYAN-5

-continued

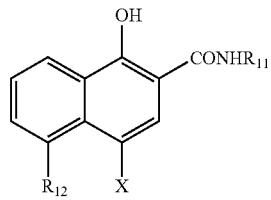

CYAN-6 wherein $R_9$ represents a substituent (preferably a carbamoyl, ureido, or carbonamido group); $R_{10}$ represents a substituent (preferably individually selected from halogens, alkyl, and carbonamido groups); $R_{11}$ represents ballast substituent; $R_{12}$ represents a hydrogen or a substituent (preferably a carbonamido or sulphonamido group); X represents a hydrogen or a coupling-off group; and m is from 1-3.

A dissociative group has an acidic proton, for example, —NH—, —CH(R)—, that preferably has a pKa value of from 3 to 12 in water. Hammett's rule is an empirical rule proposed by L. P. Hammett in 1935 for the purpose of quantitatively discussing the influence of substituents on reactions or equilibria of a benzene derivative having the substituent thereon. This rule has become widely accepted. The values for Hammett's substituent constants may be found or measured as is described in the literature. For example, see C. Hansch and A. J. Leo, *J. Med. Chem.*, 16, 1207 (1973); *J. Med. Chem.*, 20, 304 (1977); and J. A. Dean, *Lange's Handbook of Chemistry,* 12th Ed. (1979) (McGraw-Hill).

Another type of preferred cyan coupler is an "NB coupler" which is a dye-forming coupler which is capable of coupling with the developer 4-amino-3-methyl-N-ethyl-N-(2-methanesulfonamidoethyl) aniline sesquisulfate hydrate to form a dye for which the left bandwidth (LBW) of its absorption spectra upon "spin coating" of a 3% w/v solution of the dye in di-n-butyl sebacate solvent is at least 5 nm less than the LBW for a 3% w/v solution of the same dye in acetonitrile. The LBW of the spectral curve for a dye is the distance between the left side of the spectral curve and the wavelength of maximum absorption measured at a density of half the maximum.

The "spin coating" sample is prepared by first preparing a solution of the dye in di-n-butyl sebacate solvent (3% w/v). If the dye is insoluble, dissolution is achieved by the addition of some methylene chloride. The solution is filtered and 0.1-0.2 ml is applied to a clear polyethylene terephthalate support (approximately 4 cm×4 cm) and spun at 4,000 RPM using the Spin Coating equipment, Model No. EC101, available from Headway Research Inc., Garland Tex. The transmission spectra of the so prepared dye samples are then recorded.

Preferred "NB couplers" form a dye which, in n-butyl sebacate, has a LBW of the absorption spectra upon "spin coating" which is at least 15 nm, preferably at least 25 nm, less than that of the same dye in a 3% solution (w/v) in acetonitrile.

A cyan dye-forming "NB coupler" which may be useful in the invention has the formula (IA)

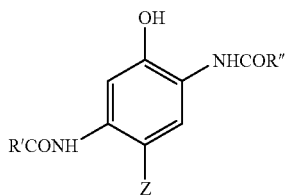

(IA)

wherein

R' and R" are substituents selected such that the coupler is a "NB coupler", as herein defined; and Z is a hydrogen atom or a group, which may be split off by the reaction of the coupler with an oxidized color developing agent.

The coupler of formula (IA) is a 2,5-diamido phenolic cyan coupler wherein the substituents R' and R" are preferably independently selected from unsubstituted or substituted alkyl, aryl, amino, alkoxy and heterocyclyl groups.

The "NB coupler" has the formula (I):

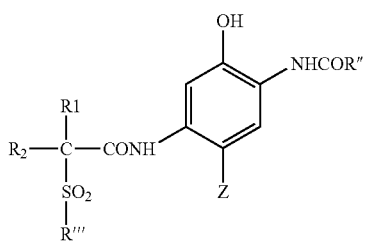

(I)

wherein

R" and R'" are independently selected from unsubstituted or substituted alkyl, aryl, amino, alkoxy and heterocyclyl groups and Z is as hereinbefore defined;

$R_1$ and $R_2$ are independently hydrogen or an unsubstituted or substituted alkyl group; and Typically, R" is an alkyl, amino or aryl group, suitably a phenyl group. R'" is desirably an alkyl or aryl group or a 5- to 10-membered heterocyclic ring which contains one or more heteroatoms selected from nitrogen, oxygen and sulfur, which ring group is unsubstituted or substituted.

In the preferred embodiment the coupler of formula (I) may be a 2,5-diamido phenol in which the 5-amido moiety is an amide of a carboxylic acid which is substituted in the alpha position by a particular sulfone (—$SO_2$—) group such as, for example, described in U.S. Pat. No. 5,686,235. The sulfone moiety is an unsubstituted or substituted alkylsulfone or a heterocyclyl sulfone or it is an arylsulfone, which is preferably substituted, in particular in the meta and/or para position.

Couplers having these structures of formulae (I) or (IA) comprise cyan dye-forming "NB couplers" which form image dyes having very sharp-cutting dye hues on the short wavelength side of the absorption curves with absorption maxima ($\lambda_{max}$) which are shifted hypsochromically and are generally in the range of 620-645 nm, which is ideally suited for producing excellent color reproduction and high color saturation in color photographic papers.

Referring to formula (I), $R_1$ and $R_2$ are independently hydrogen or an unsubstituted or substituted alkyl group, preferably having from 1 to 24 carbon atoms and, in particular, 1 to 10 carbon atoms, suitably a methyl, ethyl, n-propyl, isopropyl, butyl or decyl group or an alkyl group substituted with one or more fluoro, chloro or bromo atoms, such as a trifluoromethyl group. Suitably, at least one of $R_1$ and $R_2$ is a hydrogen atom, and if only one of $R_1$ and $R_2$ is a hydrogen atom, then the other is preferably an alkyl group having 1 to 4 carbon atoms, more preferably 1 to 3 carbon atoms, and desirably two carbon atoms.

As used herein and throughout the specification unless where specifically stated otherwise, the term "alkyl" refers to an unsaturated or saturated straight or branched chain alkyl group, including alkenyl, and includes aralkyl and cyclic alkyl groups, including cycloalkenyl, having 3-8 carbon atoms and the term 'aryl' includes specifically fused aryl.

In formula (I), R" is suitably an unsubstituted or substituted amino, alkyl or aryl group or a 5- to 10-membered heterocyclic ring which contains one or more heteroatoms selected from nitrogen, oxygen and sulfur, which ring is unsubstituted or substituted, but is more suitably an unsubstituted or substituted phenyl group.

Examples of suitable substituent groups for this aryl or heterocyclic ring include cyano, chloro, fluoro, bromo, iodo, alkyl- or aryl-carbonyl, alkyl- or aryl-oxycarbonyl, carbonamido, alkyl- or aryl-carbonamido, alkyl- or aryl-sulfonyl, alkyl- or aryl-sulfonyloxy, alkyl- or aryl-oxysulfonyl, alkyl- or aryl-sulfoxide, alkyl- or aryl-sulfamoyl, alkyl- or aryl-sulfonamido, aryl, alkyl, alkoxy, aryloxy, nitro, alkyl- or aryl-ureido and alkyl- or aryl-carbamoyl groups, any of which may be further substituted. Preferred groups are halogen, cyano, alkoxycarbonyl, alkylsulfamoyl, alkyl-sulfonamido, alkylsulfonyl, carbamoyl, alkylcarbamoyl or alkylcarbonamido. Suitably, R" is a 4-chlorophenyl, 3,4-dichlorophenyl, 3,4-difluorophenyl, 4-cyanophenyl, 3-chloro-4-cyanophenyl, pentafluorophenyl, or a 3- or 4-sulfonamidophenyl group.

In formula (I) when R'" is alkyl, it may be unsubstituted or substituted with a substituent such as halogen or alkoxy. When R'" is aryl or a heterocycle, it may be substituted. Desirably, it is not substituted in the position alpha to the sulfonyl group.

In formula (I), when R'" is a phenyl group, it may be substituted in the meta and/or para positions with 1 to 3 substituents independently selected from the group consisting of halogen, and unsubstituted or substituted alkyl, alkoxy, aryloxy, acyloxy, acylamino, alkyl- or aryl-sulfonyloxy, alkyl- or aryl-sulfamoyl, alkyl- or aryl-sulfamoylamino, alkyl- or aryl-sulfonamido, alkyl- or aryl-ureido, alkyl- or aryl-oxycarbonyl, alkyl- or aryl-oxy-carbonylamino and alkyl- or aryl-carbamoyl groups.

In particular, each substituent may be an alkyl group such as methyl, t-butyl, heptyl, dodecyl, pentadecyl, octadecyl or 1,1,2,2-tetramethylpropyl; an alkoxy group such as methoxy, t-butoxy, octyloxy, dodecyloxy, tetradecyloxy, hexadecyloxy or octadecyloxy; an aryloxy group such as phenoxy, 4-t-butylphenoxy or 4-dodecyl-phenoxy; an alkyl- or aryl-acyloxy group such as acetoxy or dodecanoyloxy; an alkyl- or aryl-acylamino group such as acetamido, hexadecanamido or benzamido; an alkyl- or aryl-sulfonyloxy group such as methyl-sulfonyloxy, dodecylsulfonyloxy or 4-methylphenyl-sulfonyloxy; an alkyl- or aryl-sulfamoyl-group such as N-butylsulfamoyl or N-4-t-butylphenylsulfamoyl; an alkyl- or aryl-sulfamoylamino group such as N-butyl-sulfamoylamino or N-4-t-butylphenylsulfamoyl-amino; an alkyl- or aryl-sulfonamido group such as methane-sulfonamido, hexadecanesulfonamido or 4-chlorophenyl-sulfonamido; an alkyl- or aryl-ureido group such as methylureido or phenylureido; an alkoxy- or aryloxy-carbonyl such as methoxycarbonyl or phenoxycarbonyl; an alkoxy- or aryloxy-carbonylamino group such as methoxy-carbonylamino or phenoxycarbonylamino; an alkyl- or aryl-carbamoyl group such as N-butylcarbamoyl or N-methyl-N-dodecylcarbamoyl; or a perfluoroalkyl group such as trifluoromethyl or heptafluoropropyl.

Suitably, the above substituent groups have 1 to 30 carbon atoms, more preferably 8 to 20 aliphatic carbon atoms. A desirable substituent is an alkyl group of 12 to 18 aliphatic carbon atoms such as dodecyl, pentadecyl or octadecyl or an alkoxy group with 8 to 18 aliphatic carbon atoms such as dodecyloxy and hexadecyloxy or a halogen such as a meta or para chloro group, carboxy or sulfonamido. Any such groups may contain interrupting heteroatoms such as oxygen to form for example polyalkylene oxides.

In formula (I) or (IA), Z is a hydrogen atom or a group which may be split off by the reaction of the coupler with an oxidized color developing agent, known in the photographic art as a 'coupling-off group' and may preferably be hydrogen, chloro, fluoro, substituted aryloxy or mercaptotetrazole, more preferably hydrogen or chloro.

The presence or absence of such groups determines the chemical equivalency of the coupler, that is, whether it is a 2-equivalent or 4-equivalent coupler, and its particular identity may modify the reactivity of the coupler. Such groups may advantageously affect the layer in which the coupler is coated, or other layers in the photographic recording material by performing, after release from the coupler, functions such as dye formation, dye hue adjustment, development acceleration or inhibition, bleach acceleration or inhibition, electron transfer facilitation, color correction.

Representative classes of such coupling-off groups include, for example, halogen, alkoxy, aryloxy, heterocyclyloxy, sulfonyloxy, acyloxy, acyl, heterocyclylsulfonamido, heterocyclylthio, benzothiazolyl, phosophonyloxy, alkylthio, arylthio, and arylazo. These coupling-off groups are described in the art, for example, in U.S. Pat. Nos. 2,455,169; 3,227,551; 3,432,521; 3,467,563; 3,617,291; 3,880,661; 4,052,212; and 4,134,766; and in U.K. Patent Nos. and published applications 1,466,728; 1,531,927; 1,533,039; 2,066,755A, and 2,017,704A. Halogen, alkoxy, and aryloxy groups are most suitable.

Examples of specific coupling-off groups are —Cl, —F, —Br, —SCN, —OCH$_3$, —OC$_6$H$_5$, —OCH$_2$C(=O)NHCH$_2$CH$_2$OH, —OCH$_2$C(O)NHCH$_2$CH$_2$OCH$_3$, —OCH$_2$C(O)NHCH$_2$CH$_2$OC(=O)OCH$_3$, —P(=O)(OC$_2$H$_5$)$_2$, —SCH$_2$CH$_2$COOH,

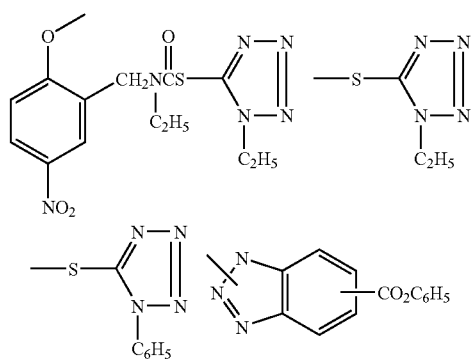

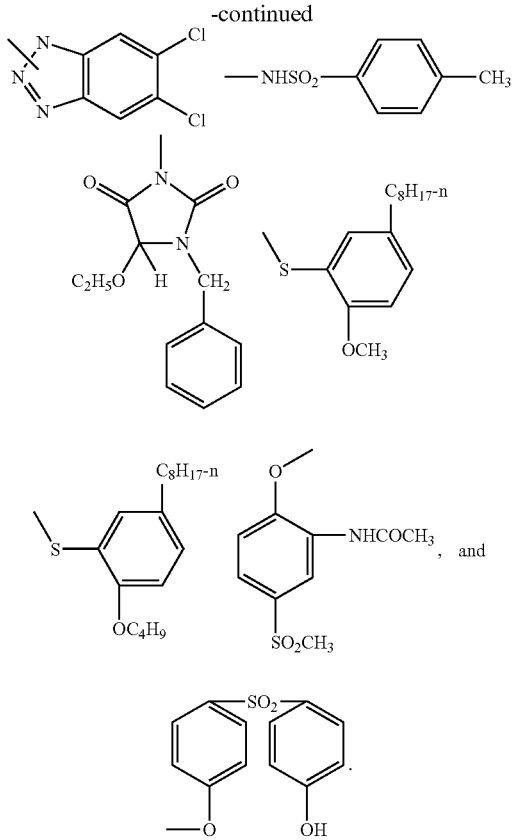

Typically, the coupling-off group is a chlorine atom, hydrogen atom, or p-methoxyphenoxy group.

It is essential that the substituent groups be selected so as to adequately ballast the coupler and the resulting dye in the organic solvent in which the coupler is dispersed. The ballasting may be accomplished by providing hydrophobic substituent groups in one or more of the substituent groups. Generally a ballast group is an organic radical of such size and configuration as to confer on the coupler molecule sufficient bulk and aqueous insolubility as to render the coupler substantially nondiffusible from the layer in which it is coated in a photographic element. Thus, the combinations of substituents are suitably chosen to meet these criteria. To be effective, the ballast will usually contain at least 8 carbon atoms and typically contains 10 to 30 carbon atoms. Suitable ballasting may also be accomplished by providing a plurality of groups, which, in combination, meet these criteria. In the preferred embodiments useful with the invention, R$_1$ in formula (I) is a small alkyl group or hydrogen. Therefore, in these embodiments the ballast would be primarily located as part of the other groups. Furthermore, even if the coupling-off group Z contains a ballast, it is often desirable to ballast the other substituents as well, since Z is eliminated from the molecule upon coupling; thus, the ballast is most advantageously provided as part of groups other than Z.

The following examples further illustrate preferred cyan couplers to be used with the invention. It is not to be construed that the present invention is limited to these examples.

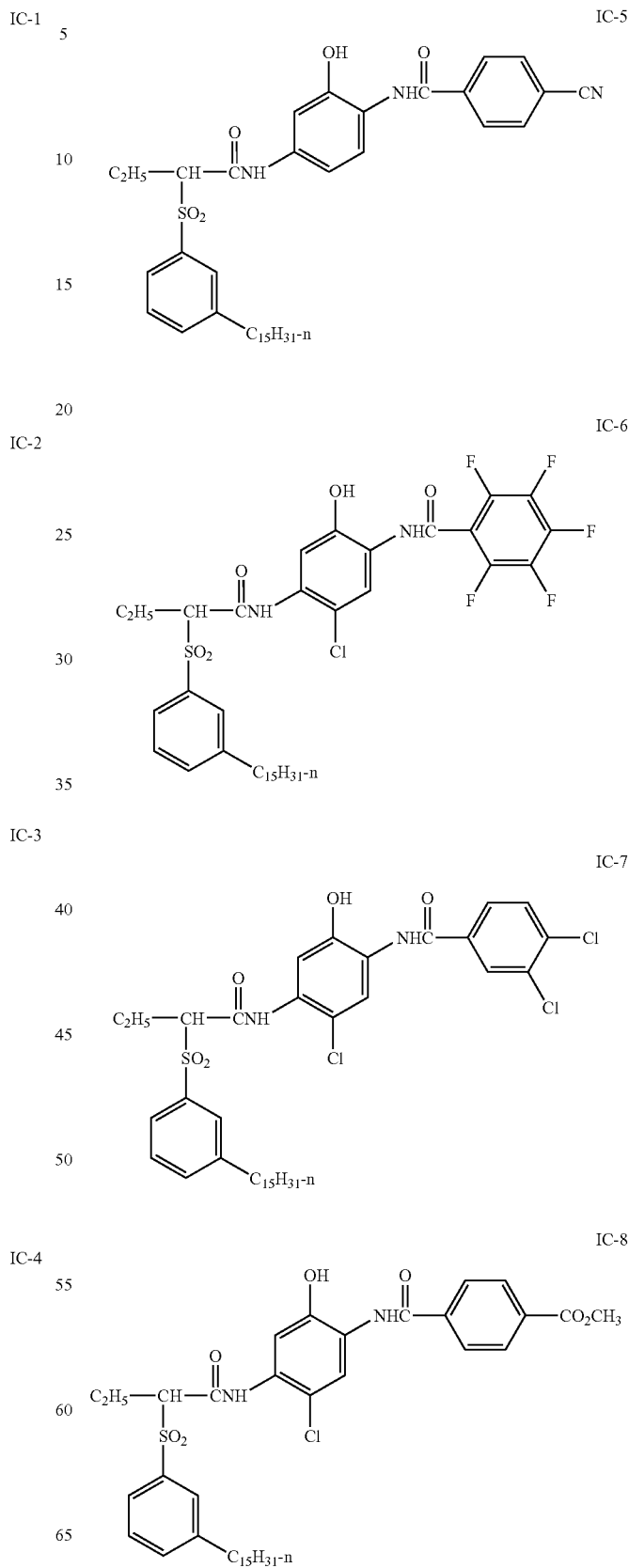

-continued
IC-9
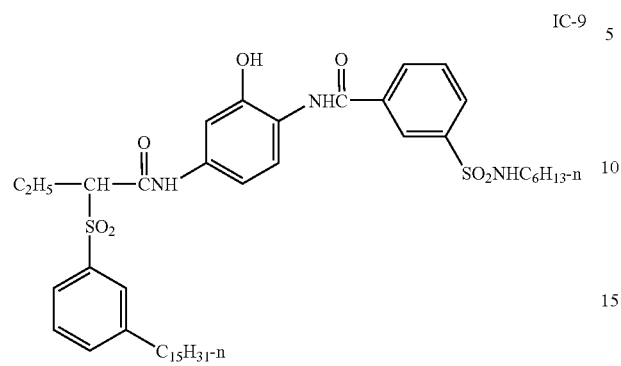
IC-10
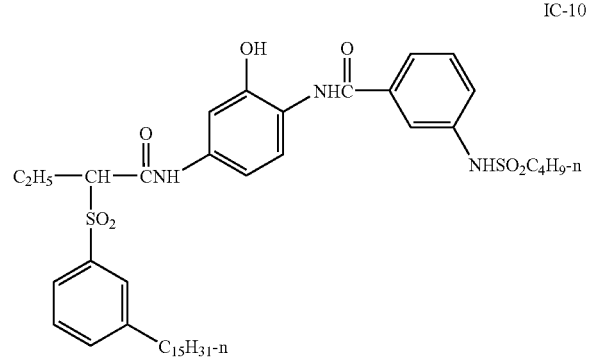
IC-11
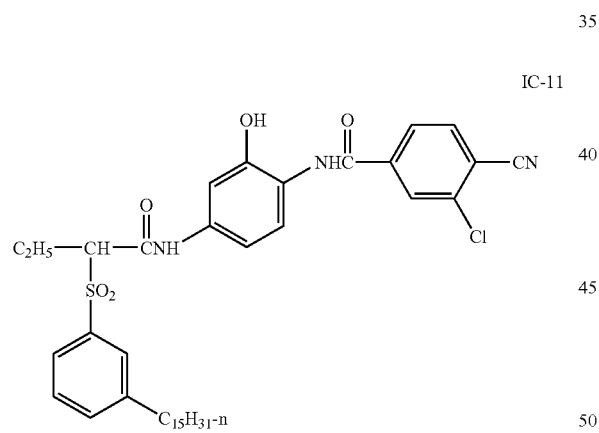
IC-12
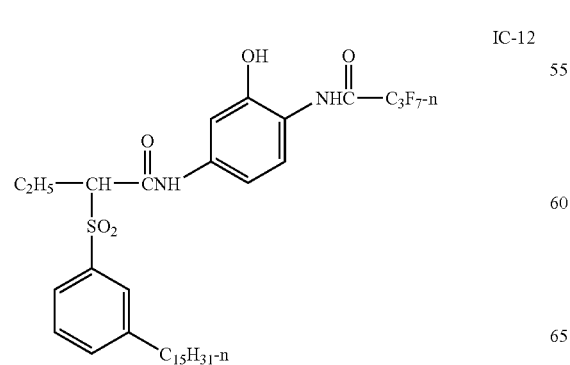
-continued
IC-13
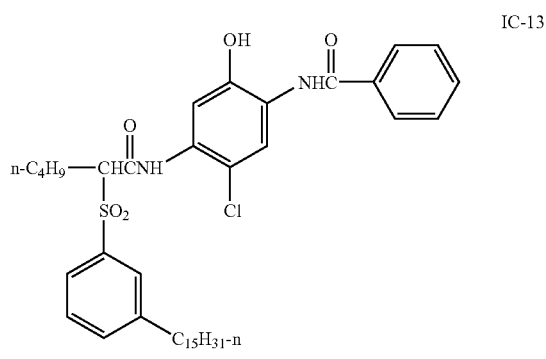
IC-14
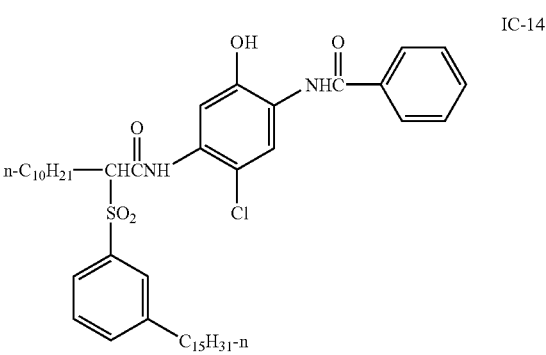
IC-15
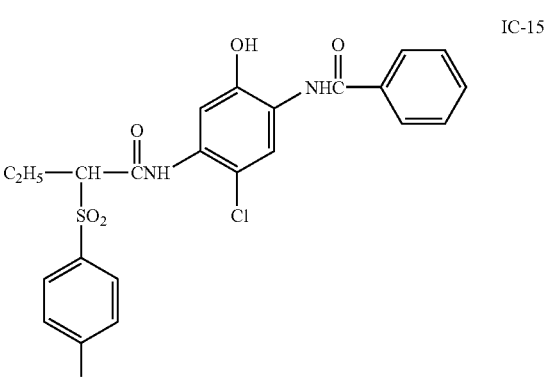
IC-16
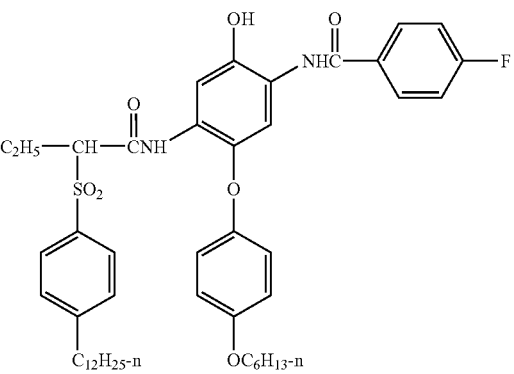

-continued
IC-17
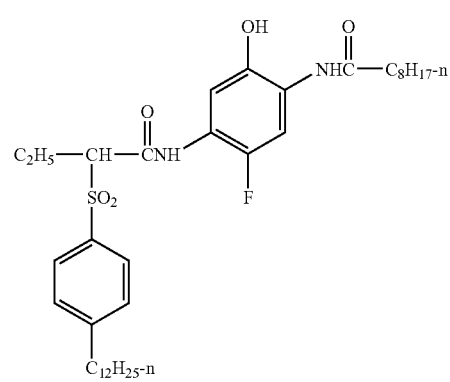
IC-18
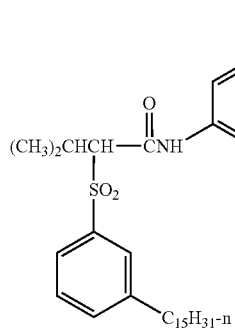
IC-19
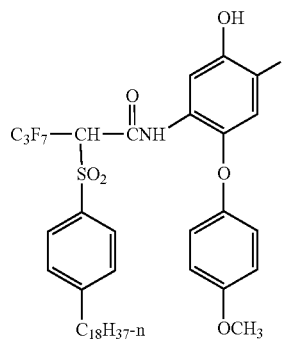
IC-20
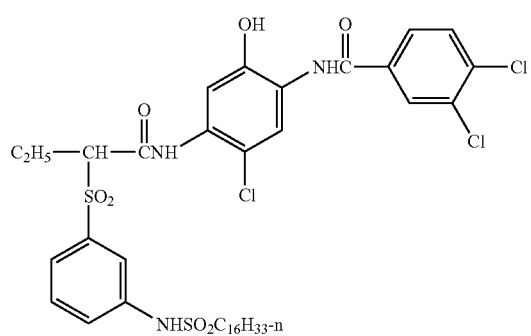
-continued
IC-21
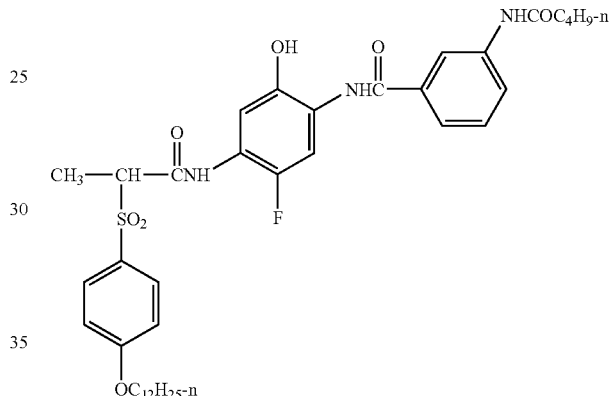
IC-22
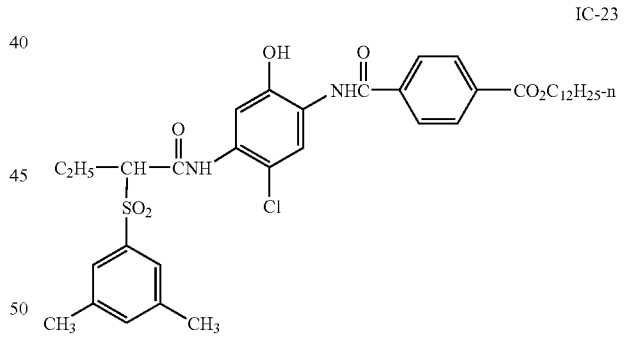
IC-23
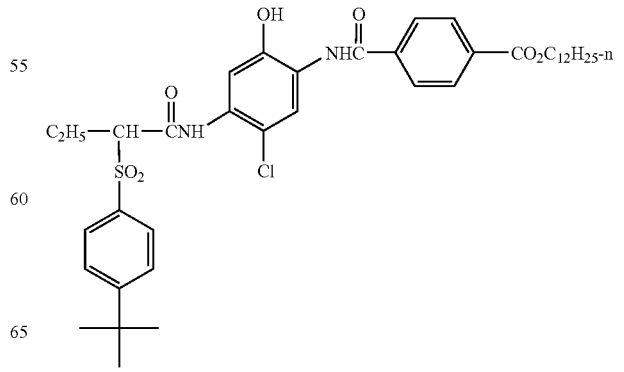
IC-24

-continued
IC-25
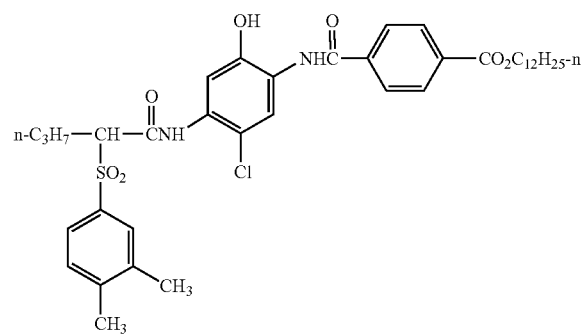
IC-29
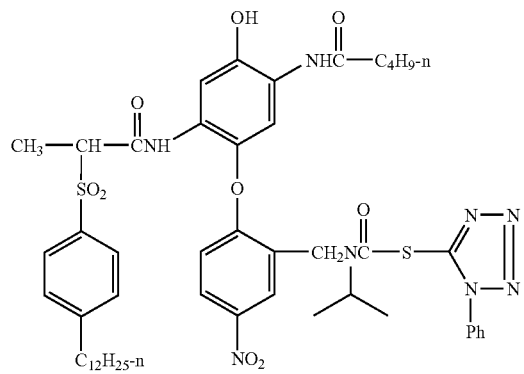
IC-26
IC-30
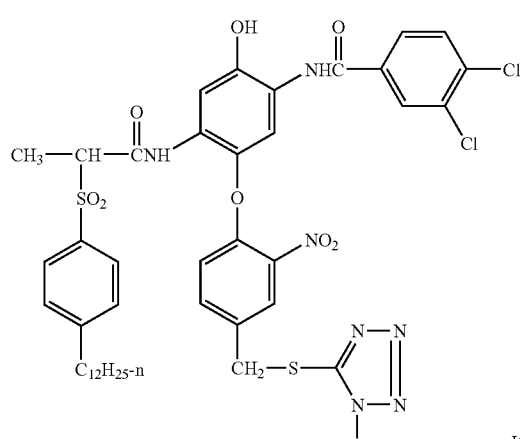
IC-27
IC-31
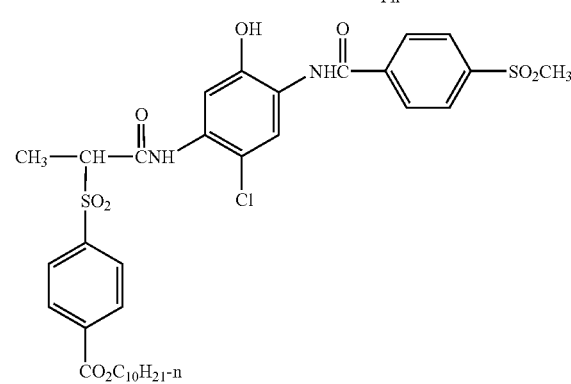
IC-28
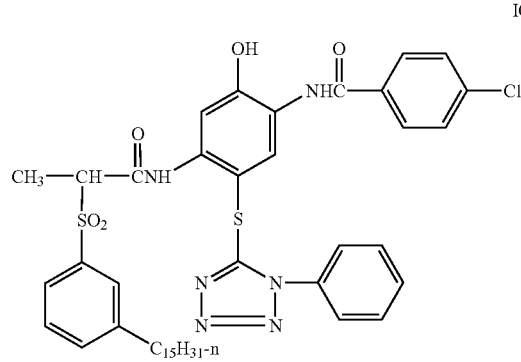
IC-32

-continued
IC-33
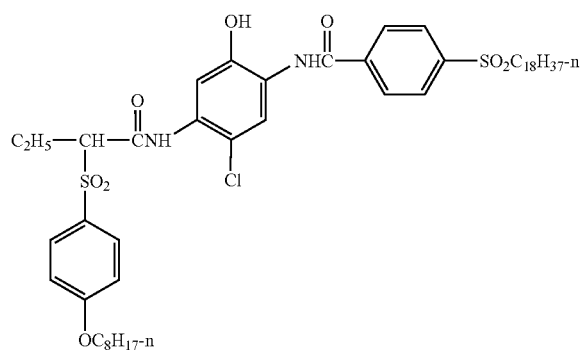
IC-34
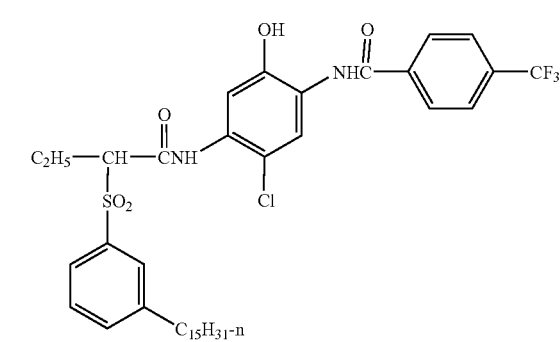
IC-35
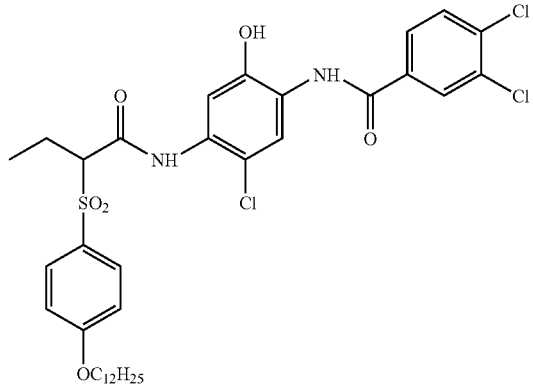
IC-36
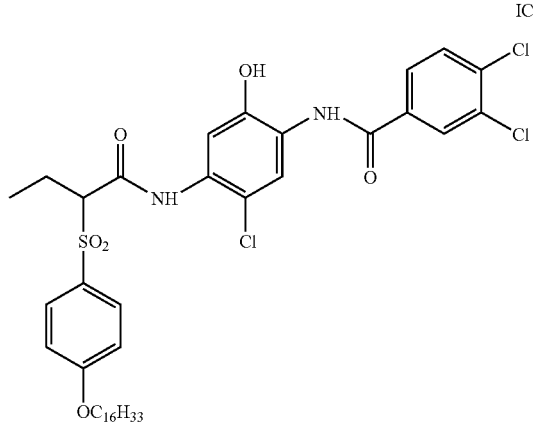
-continued
IC-37
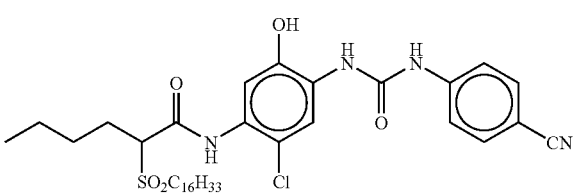
IC-38
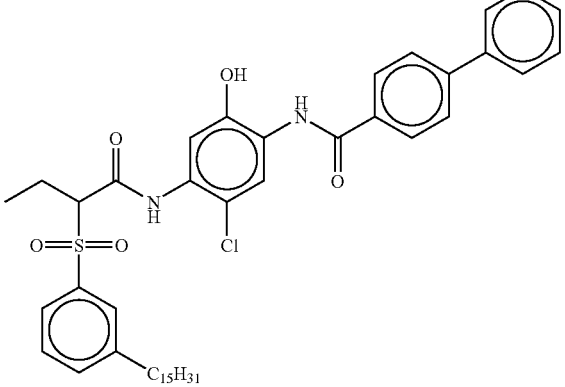
IC-39
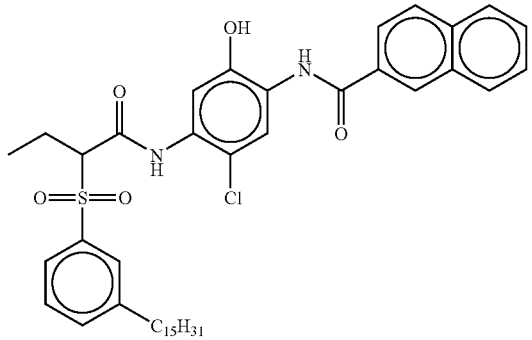
IC-40
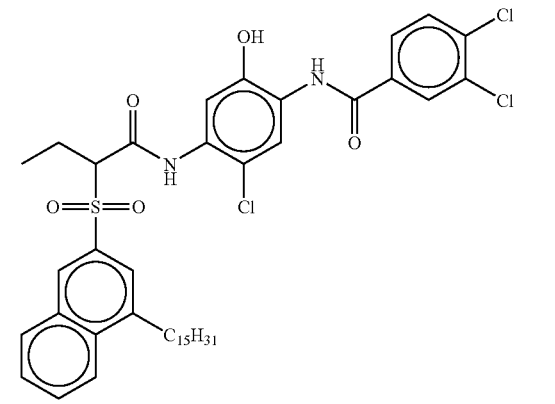
Preferred couplers are IC-3, IC-7, IC-35, and IC-36 because of their suitably narrow left bandwidths.
Couplers that form magenta dyes upon reaction with oxidized color developing agent are described in such representative patents and publications as: U.S. Pat. Nos. 2,311, 082; 2,343,703; 2,369,489; 2,600,788; 2,908,573; 3,062,653; 3,152,896; 3,519,429; 3,758,309; and "Farbkuppler-eine Literature Ubersicht," published in Agfa Mitteilungen, Band III, pp. 126-156 (1961). Preferably such couplers are pyrazolones, pyrazolotriazoles, or pyrazolobenzimidazoles that form magenta dyes upon reaction with oxidized color developing agents. Especially preferred couplers are 1H-pyrazolo [5,1-c]-1,2,4-triazole and 1H-pyrazolo [1,5-b]-1,2,4-triazole. Examples of 1H-pyrazolo [5,1-c]-1,2,4-triazole couplers are described in U.K. Patent Nos. 1,247,493; 1,252,418; 1,398,979; U.S. Pat. Nos. 4,443,536; 4,514,490; 4,540,654; 4,590,153; 4,665,015; 4,822,730; 4,945,034; 5,017,465; and 5,023,170. Examples of 1H-pyrazolo [1,5-b]-1,2,4-triazoles may be found in European Patent applications 176,804; 177,765; U.S. Pat. Nos. 4,659,652; 5,066,575; and 5,250,400.

Typical pyrazoloazole and pyrazolone couplers are represented by the following formulas:

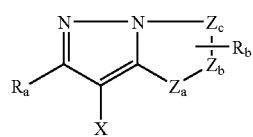

MAGENTA-1

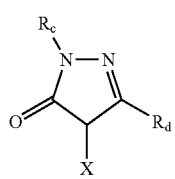

MAGENTA-2 wherein $R_a$ and $R_b$ independently represent H or a substituent; $R_c$ is a substituent (preferably an aryl group); $R_d$ is a substituent (preferably an anilino, carbonamido, ureido, carbamoyl, alkoxy, aryloxycarbonyl, alkoxycarbonyl, or N-heterocyclic group); X is hydrogen or a coupling-off group; and $Z_a$, $Z_b$, and $Z_c$ are independently a substituted methine group, =N—, =C—, or —NH—, provided that one of either the $Z_a$-$Z_b$ bond or the $Z_b$-$Z_c$ bond is a double bond and the other is a single bond, and when the $Z_b$-$Z_c$ bond is a carbon-carbon double bond, it may form part of an aromatic ring, and at least one of $Z_a$, $Z_b$, and $Z_c$ represents a methine group connected to the group $R_b$.

Specific examples of such couplers are:

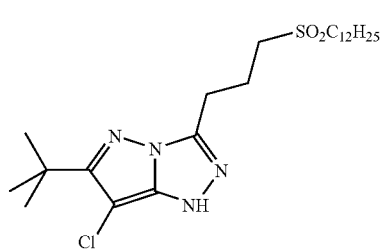

M-1

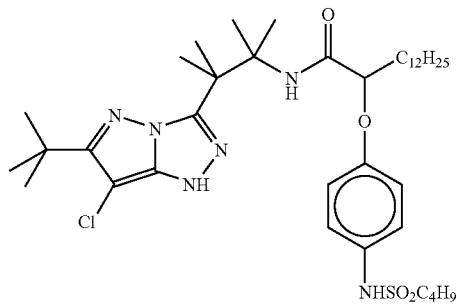

M-2

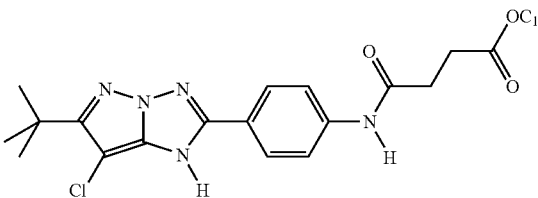

M-3

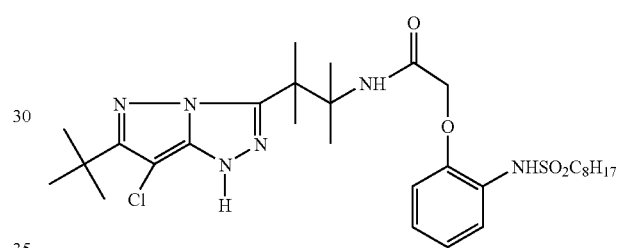

M-4

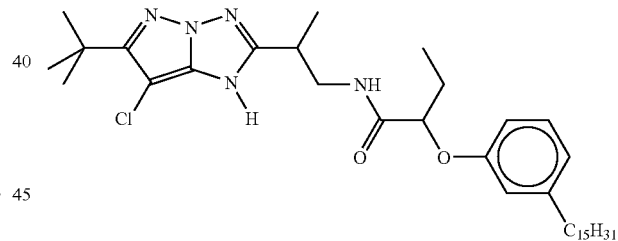

M-5

Couplers that form yellow dyes upon reaction with oxidized color developing agent are described in such representative patents and publications as: U.S. Pat. Nos. 2,298,443; 2,407,210; 2,875,057; 3,048,194; 3,265,506; 3,447,928; 3,960,570; 4,022,620; 4,443,536; 4,910,126; and 5,340,703 and "Farbkuppler-eine Literature Ubersicht," published in Agfa Mitteilungen, Band III, pp. 112-126 (1961). Such couplers are typically open chain ketomethylene compounds. Also preferred are yellow couplers such as described in, for example, European Patent Application Nos. 482,552; 510,535; 524,540; 543,367; and U.S. Pat. No. 5,238,803. For improved color reproduction, couplers which give yellow dyes that cut off sharply on the long wavelength side are particularly preferred (for example, see U.S. Pat. No. 5,360,713).

Typical preferred yellow couplers are represented by the following formulas:

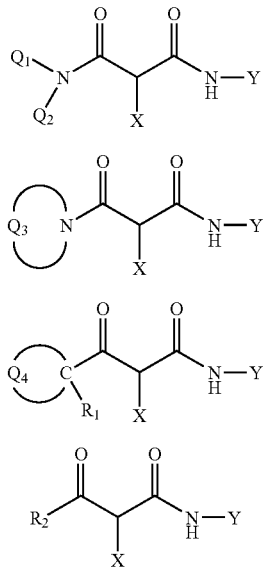

YELLOW-1
YELLOW-2
YELLOW-3
YELLOW-4 wherein $R_1$, $R_2$, $Q_1$ and $Q_2$ each represents a substituent; X is hydrogen or a coupling-off group; Y represents an aryl group or a heterocyclic group; $Q_3$ represents an organic residue required to form a nitrogen-containing heterocyclic group together with the >N—; and $Q_4$ represents nonmetallic atoms necessary to from a 3- to 5-membered hydrocarbon ring or a 3- to 5-membered heterocyclic ring which contains at least one hetero atom selected from N, O, S, and P in the ring. Particularly preferred is when $Q_1$ and $Q_2$ each represents an alkyl group, an aryl group, or a heterocyclic group, and $R_2$ represents an aryl or tertiary alkyl group.

Preferred yellow couplers may be of the following general structures:

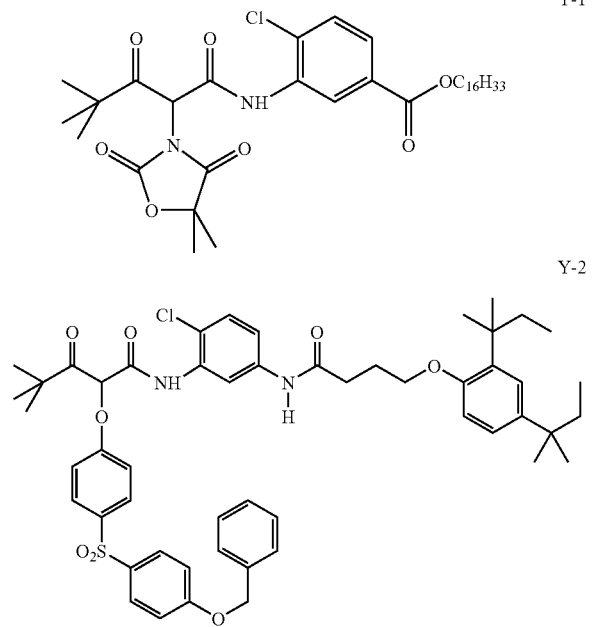

Y-1

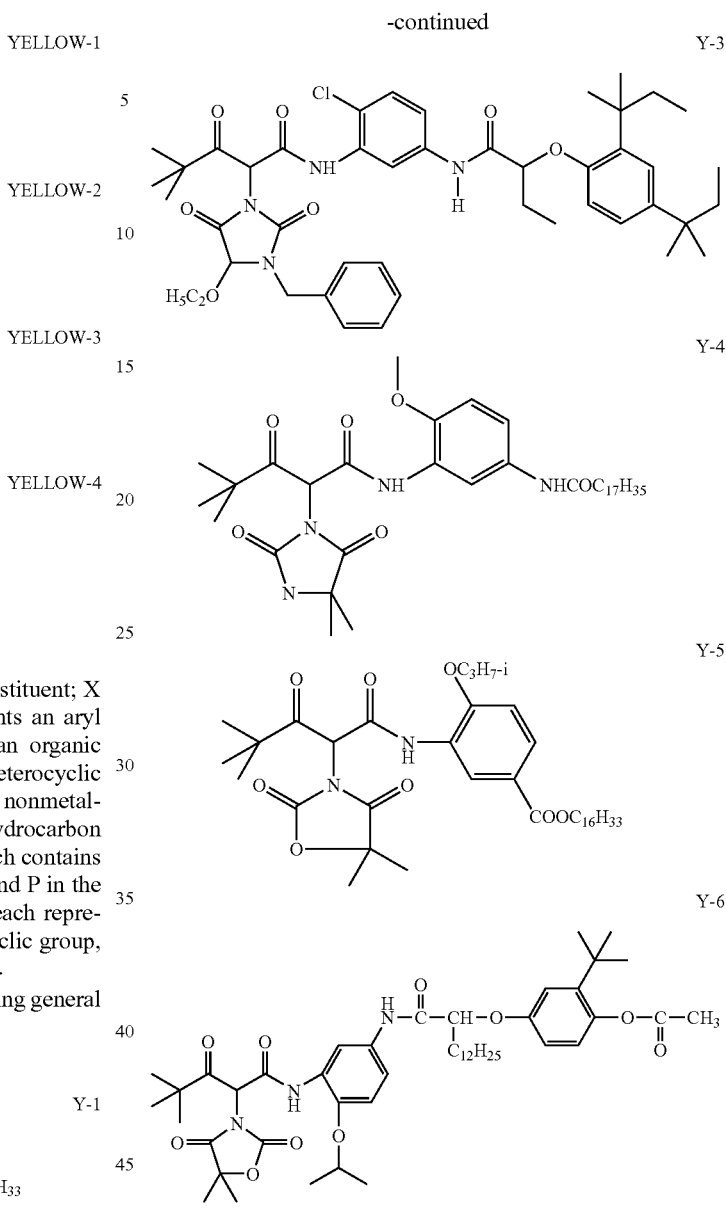

Y-2, Y-3, Y-4, Y-5, Y-6

Unless otherwise specifically stated, substituent groups, which may be substituted on molecules herein include any groups, whether substituted or unsubstituted, which do not destroy properties necessary for photographic utility. When the term "group" is applied to the identification of a substituent containing a substitutable hydrogen, it is intended to encompass not only the substituent's unsubstituted form, but also its form further substituted with any group or groups as herein mentioned. Suitably, the group may be halogen or may be bonded to the remainder of the molecule by an atom of carbon, silicon, oxygen, nitrogen, phosphorous, or sulfur. The substituent may be, for example, halogen, such as chlorine, bromine or fluorine; nitro; hydroxyl; cyano; carboxyl; or groups which may be further substituted, such as alkyl, including straight or branched chain alkyl, such as methyl, trifluoromethyl, ethyl, t-butyl, 3-(2,4-di-t-pentylphenoxy) propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy)butyramido, alpha-(3-pentadecylphenoxy)-hexanamido, alpha-(4-hydroxy-3-t-butylphenoxy)-tetradecanamido, 2-oxopyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino, p-dodecyl-phenylcarbonylamino, p-toluyl-carbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-toluylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-toluylsulfonamido, p-dodecylbenzenesulfonamido, N-methyltetradecylsulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl; N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl, methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-toluylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-toluylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amino, such as phenylanilino, 2-chloroanilino, diethylamino, dodecylamino; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3- to 7-membered heterocyclic ring composed of carbon atoms and at least one hetero atom selected from the group consisting of oxygen, nitrogen and sulfur, such as 2-furyl, 2-thienyl, 2-benzimidazolyloxy or 2-benzothiazolyl; quaternary ammonium, such as triethylammonium; and silyloxy, such as trimethylsilyloxy.

If desired, the substituents may themselves be further substituted one or more times with the described substituent groups. The particular substituents used may be selected by those skilled in the art to attain the desired photographic properties for a specific application and may include, for example, hydrophobic groups, solubilizing groups, blocking groups, releasing or releasable groups. Generally, the above groups and substituents thereof may include those having up to 48 carbon atoms, typically 1 to 36 carbon atoms and usually less than 24 carbon atoms, but greater numbers are possible depending on the particular substituents selected.

Representative substituents on ballast groups include alkyl, aryl, alkoxy, aryloxy, alkylthio, hydroxy, halogen, alkoxycarbonyl, aryloxcarbonyl, carboxy, acyl, acyloxy, amino, anilino, carbonamido, carbamoyl, alkylsulfonyl, arylsulfonyl, sulfonamido, and sulfamoyl groups wherein the substituents typically contain 1 to 42 carbon atoms. Such substituents may also be further substituted.

Stabilizers and scavengers that may be used with the present invention, but are not limited to the following:

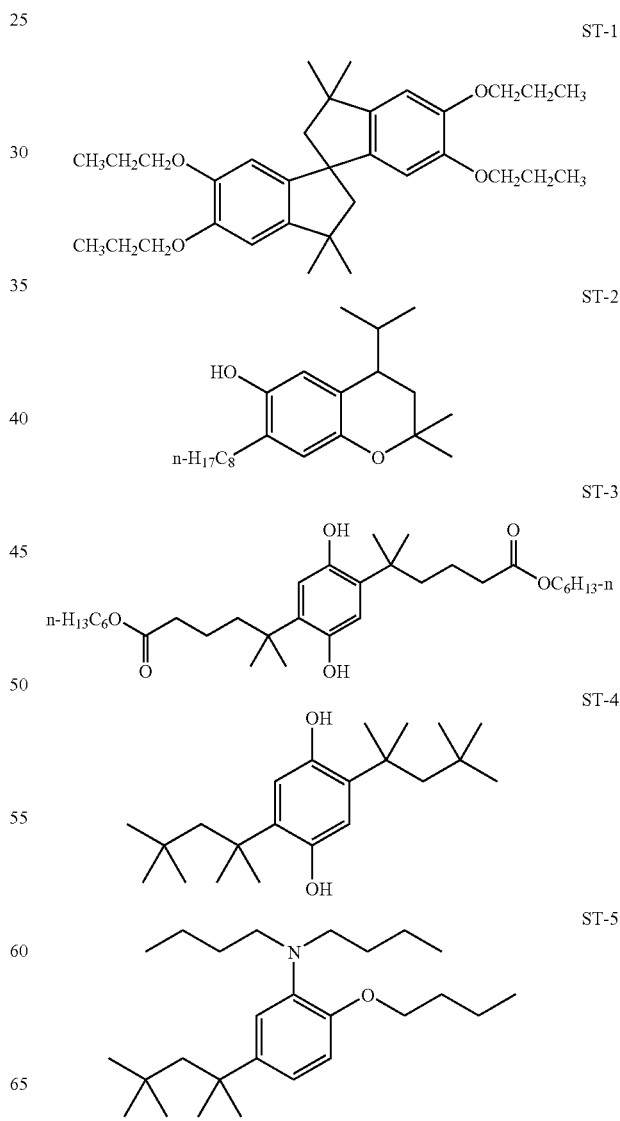

-continued
ST-6
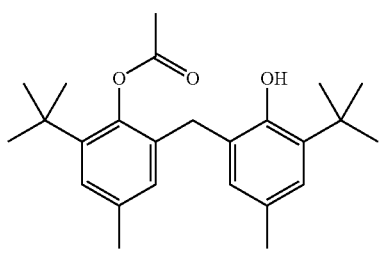
ST-7
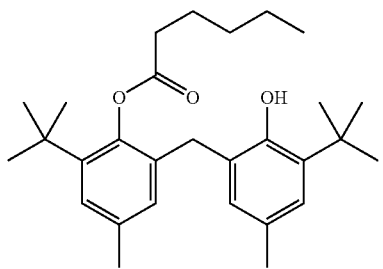
ST-8
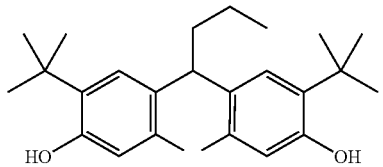
ST-9
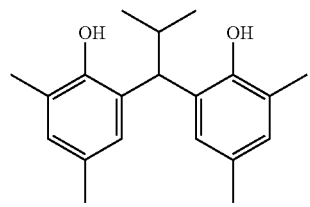
ST-10
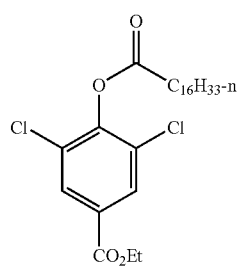
ST-11
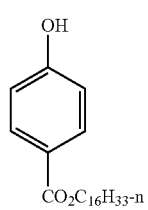
ST-12
-continued
ST-13
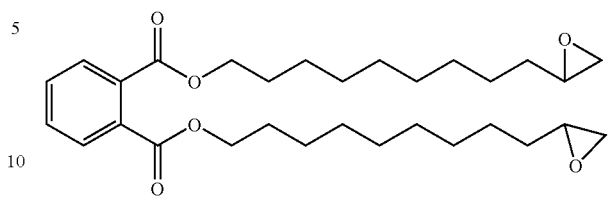
ST-14
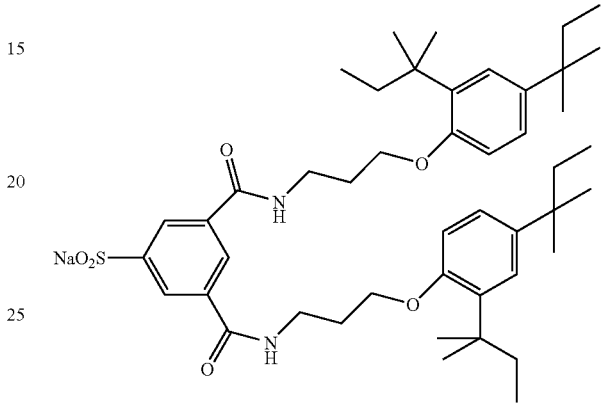
ST-15
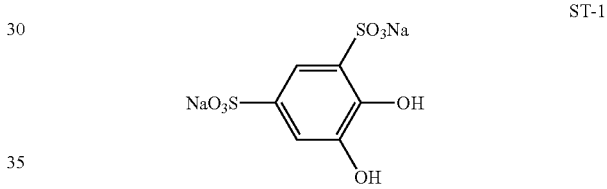
ST-16
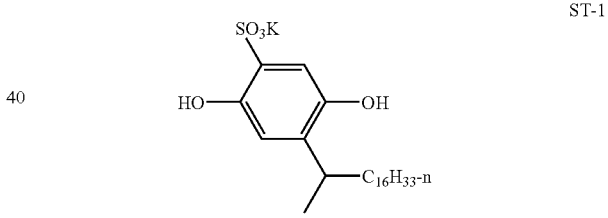
ST-17
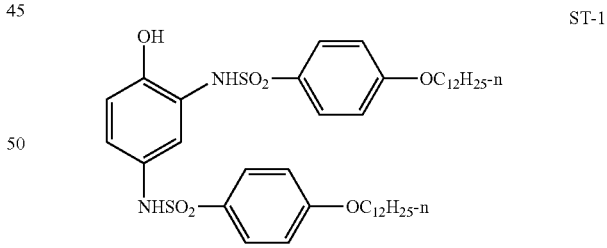
ST-18
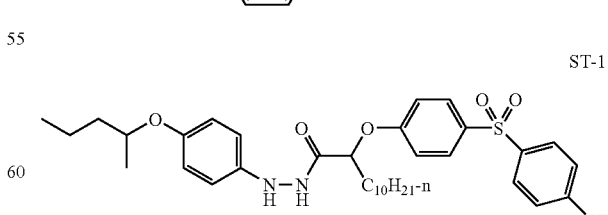
ST-19
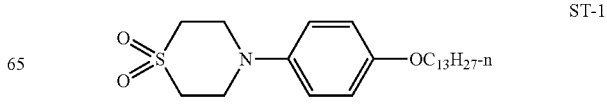

-continued

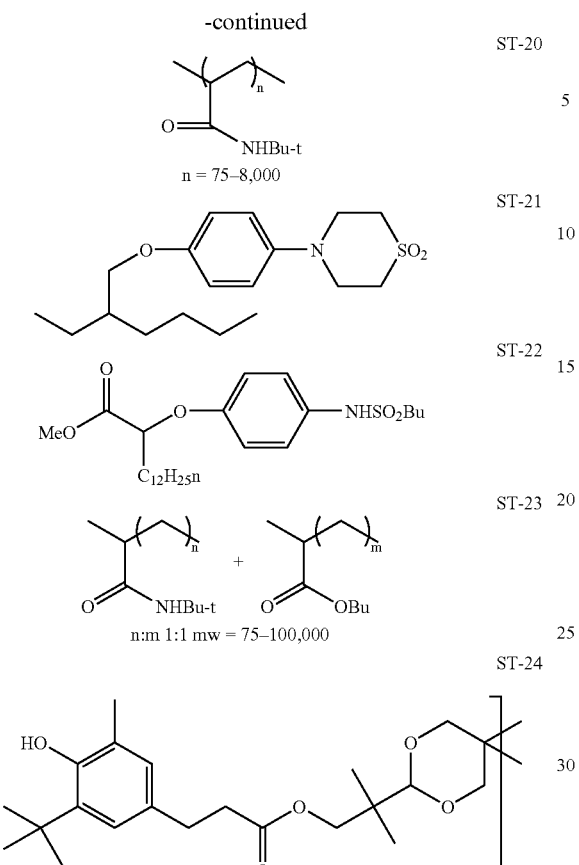

ST-20

ST-21

ST-22

ST-23 n:m 1:1 mw = 75–100,000

ST-24

Examples of solvents, which may be used in the invention, include the following:

| | |
|---|---|
| Tritolyl phosphate | S-1 |
| Dibutyl phthalate | S-2 |
| Diundecyl phthalate | S-3 |
| N,N-Diethyldodecanamide | S-4 |
| N,N-Dibutyldodecanamide | S-5 |
| Tris(2-ethylhexyl)phosphate | S-6 |
| Acetyl tributyl citrate | S-7 |
| 2,4-Di-tert-pentylphenol | S-8 |
| 2-(2-Butoxyethoxy)ethyl acetate | S-9 |
| 1,4-Cyclohexyldimethylene bis(2-ethylhexanoate) | S-10 |

The dispersions used in photographic elements useful with the present invention may also include ultraviolet (UV) stabilizers and so-called liquid UV stabilizers such as described in U.S. Pat. Nos. 4,992,358; 4,975,360; and 4,587,346. Examples of UV stabilizers are shown below.

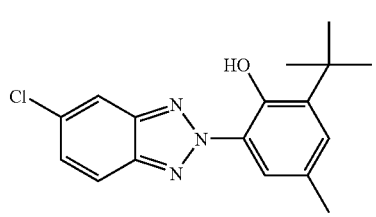

UV-1

-continued

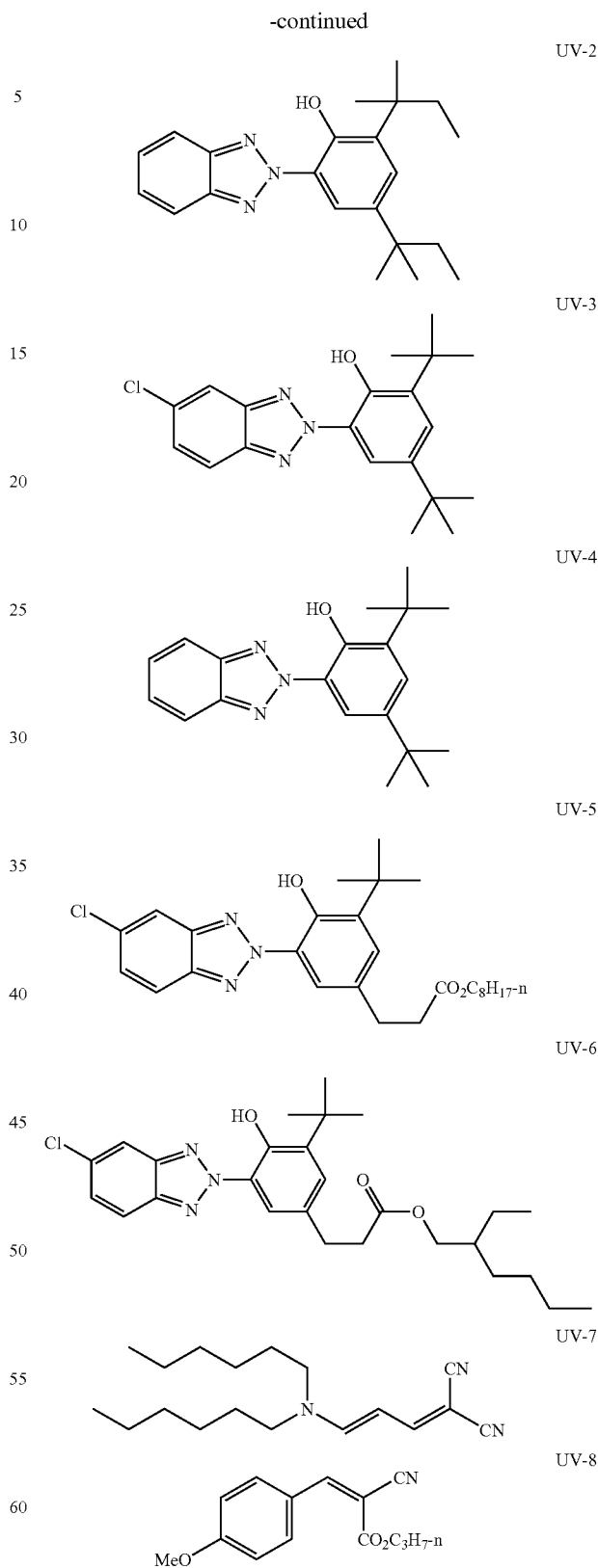

The aqueous phase may include surfactants. Surfactant may be cationic, anionic, zwitterionic or non-ionic. Useful surfactants include, but are not limited to, the following:

Further, it is contemplated to stabilize photographic dispersions prone to particle growth through the use of hydrophobic, photographically inert compounds such as disclosed by Zengerle et al U.S. Pat. No. 5,468,604.

In a preferred embodiment the invention employs recording elements, which are constructed to contain at least three silver halide emulsion and preferably six layer units. A suitable full color, multilayer format for a recording element used in the invention is represented by Structure I.

| STRUCTURE I |
| --- |
| Red-sensitized cyan dye image-forming silver halide emulsion unit |
| Interlayer |
| Green-sensitized magenta dye image-forming silver halide emulsion unit |
| Interlayer |
| Blue-sensitized yellow dye image-forming silver halide emulsion unit |
| ///// Support ///// |
| Blue-sensitized yellow dye image-forming silver halide emulsion unit |
| Interlayer |
| Green-sensitized magenta dye image-forming silver halide emulsion unit |
| Interlayer |
| Red-sensitized cyan dye image-forming silver halide emulsion unit |

The image-forming units are separated from each other by hydrophilic colloid interlayers containing an oxidized developing agent scavenger to prevent color contamination. Silver halide emulsions satisfying the grain and gelatino-peptizer requirements described above may be present in any one or combination of the emulsion layer units. Additional useful multicolor, multilayer formats include structures as described in U.S. Pat. No. 5,783,373. Each of such structures in accordance with the invention preferably would contain six silver halide emulsions comprised of high chloride grains having at least 50 percent of their surface area bounded by {100} crystal faces and containing dopants from classes (i) and (ii), as described above. Preferably each of the emulsion layer units contains emulsion satisfying these criteria.

Conventional features that may be incorporated into multilayer (and particularly multicolor) recording elements contemplated for use in the invention are illustrated by *Research Disclosure*, Item 38957, cited above:

| | |
| --- | --- |
| XI. | Layers and layer arrangements |
| XII. | Features applicable only to color negative |
| XIII. | Features applicable only to color positive |
| | B. Color reversal |
| | C. Color positives derived from color negatives |
| XIV. | Scan facilitating features. |

The recording elements comprising the radiation sensitive high chloride emulsion layers useful with this invention may be conventionally optically printed, or in accordance with a particular embodiment of the invention may be image-wise exposed in a pixel-by-pixel mode using suitable high energy radiation sources typically employed in electronic printing methods. Suitable actinic forms of energy encompass the ultraviolet, visible, and infrared regions of the electromagnetic spectrum, as well as electron-beam radiation and is conveniently supplied by beams from one or more light emitting diodes or lasers, including gaseous or solid state lasers. Exposures may be monochromatic, orthochromatic, or panchromatic. For example, when the recording element is a multilayer multicolor element, exposure may be provided by laser or light emitting diode beams of appropriate spectral radiation, for example, infrared, red, green or blue wavelengths, to which such element is sensitive. Multicolor elements may be employed which produce cyan, magenta and yellow dyes as a function of exposure in separate portions of the electromagnetic spectrum, including at least two portions of the infrared region, as disclosed in the previously mentioned U.S. Pat. No. 4,619,892. Suitable exposures include those up to 2000 nm, preferably up to 1500 nm. Suitable light emitting diodes and commercially available laser sources are known and commercially available. Imagewise exposures at ambient, elevated, or reduced temperatures and/or pressures may be employed within the useful response range of the recording element determined by conventional sensitometric techniques, as illustrated by T. H. James, *The Theory of the Photographic Process*, 4th Ed., Macmillan, 1977, Chapters 4, 6, 17, 18, and 23.

It has been observed that anionic $[MX_xY_yL_z]$ hexacoordination complexes, where M is a group 8 or 9 metal (preferably iron, ruthenium or iridium), X is halide or pseudohalide (preferably Cl, Br, or CN) x is 3 to 5, Y is $H_2O$, y is 0 or 1, L is a C—C, H—C or C—N—H organic ligand, and Z is 1 or 2, are surprisingly effective in reducing high intensity reciprocity failure (HIRF), low intensity reciprocity failure (LIRF) and thermal sensitivity variance and in an improving latent image keeping (LIK). As herein employed, HIRF is a measure of the variance of photographic properties for equal exposures, but with exposure times ranging from $10^{-1}$ to $10^{-6}$ second. LIRF is a measure of the variance of photographic properties for equal exposures, but with exposure times ranging from $10^{-1}$ to 100 seconds. Although these advantages may be generally compatible with face centered cubic lattice grain structures, the most striking improvements have been observed in high (>50 mole %, preferably ≧90 mole %) chloride emulsions. Preferred C—C, H—C, or C—N—H organic ligands are aromatic heterocycles of the type described in U.S. Pat. No. 5,462,849. The most effective C—C, H—C, or C—N—H organic ligands are azoles and azines, either unsubstituted or containing alkyl, alkoxy, or halide substituents, where the alkyl moieties contain from 1 to 8 carbon atoms. Particularly preferred azoles and azines include thiazoles, thiazolines, and pyrazines.

The quantity or level of high energy actinic radiation provided to the recording medium by the exposure source is generally at least $10^{-4}$ ergs/cm$^2$, typically in the range of $10^{-4}$ ergs/cm$^2$ to $10^{-3}$ ergs/cm$^2$ and often from $10^{-3}$ ergs/cm$^2$ to $10^2$ ergs/cm$^2$. Exposure of the recording element in a pixel-by-pixel mode as known in the prior art persists for only a very short duration or time. Typical maximum exposure times are up to 100μ seconds, often up to 10μ seconds, and frequently up to only 0.5μ seconds. Single or multiple exposures of each pixel are contemplated. The pixel density is subject to wide variation, as is obvious to those skilled in the art. The higher the pixel density, the sharper the images may be, but at the expense of equipment complexity. In general, pixel densities used in conventional electronic printing methods of the type described herein do not exceed $10^7$ pixels/cm$^2$ and are typically in the range of $10^4$ to $10^6$ pixels/cm$^2$. An assessment of the technology of high—quality, continuous-tone, color electronic printing using silver halide photographic paper which discusses various features and components of the system, including exposure source, exposure time, exposure level and pixel density and other recording element characteristics is provided in Firth et al., *A Continuous-Tone Laser Color Printer*, Journal of Imaging Technology, Vol. 14, No. 3, June 1988. As previously indicated herein, a description of some of the details of conventional electronic printing methods comprising scanning a recording element with high energy beams such as light emitting diodes or laser beams, is set forth in Hioki U.S. Pat. No. 5,126,235 and European Patent Applications 479 167 A1 and 502 508 A1.

Once imagewise exposed, the recording elements may be processed in any convenient conventional manner to obtain a viewable image. Such processing is illustrated by *Research Disclosure*, Item 38957, cited above:

| | |
|---|---|
| XVIII. | Chemical development systems |
| XIX. | Development |
| XX. | Desilvering, washing, rinsing, and stabilizing |

In addition, a useful developer for the inventive material is a homogeneous, single-part developing agent. The homogeneous, single-part color developing concentrate is prepared using a sequence of steps:

In the first step, an aqueous solution of a suitable color developing agent is prepared. This color developing agent is generally in the form of a sulfate salt. Other components of the solution may include an antioxidant for the color developing agent, a suitable number of alkali metal ions (in an at least stoichiometric proportion to the sulfate ions) provided by an alkali metal base, and a photographically inactive water-miscible or water-soluble hydroxy-containing organic solvent. This solvent is present in the final concentrate at a concentration such that the weight ratio of water to the organic solvent is from 15:85 to 50:50.

In this environment, especially at high alkalinity, alkali metal ions and sulfate ions form a sulfate salt that is precipitated in the presence of the hydroxy-containing organic solvent. The precipitated sulfate salt may then be readily removed using any suitable liquid/solid phase separation technique (including filtration, centrifugation, or decantation). If the antioxidant is a liquid organic compound, two phases may be formed and the precipitate may be removed by discarding the aqueous phase.

The color developing concentrates useful with this invention include one or more color developing agents that are well known in the art that, in oxidized form, will react with dye forming color couplers in the processed materials. Such color developing agents include, but are not limited to, aminophenols, p-phenylenediamines (especially N,N-dialkyl-p-phenylenediamines) and others which are well known in the art, such as EP 0 434 097 A1 (published Jun. 26, 1991) and EP 0 530 921 A1 (published Mar. 10, 1993). It may be useful for the color developing agents to have one or more water-solubilizing groups as are known in the art. Further details of such materials are provided in *Research Disclosure*, 38957, pages 592-639 (September 1996). *Research Disclosure* is a publication of Kenneth Mason Publications Ltd., Dudley House, 12 North Street, Emsworth, Hampshire PO10 7DQ England (also available from Emsworth Design Inc., 121 West 19th Street, New York, N.Y. 10011). This reference will be referred to hereinafter as "*Research Disclosure*".

Preferred color developing agents include, but are not limited to, N,N-diethyl p-phenylenediamine sulfate (KODAK Color Developing Agent CD-2), 4-amino-3-methyl-N-(2-methane sulfonamidoethyl)aniline sulfate, 4-(N-ethyl-N-σ-hydroxyethylamino)-2-methylaniline sulfate (KODAK Color Developing Agent CD-4), p-hydroxyethylethylaminoaniline sulfate, 4-(N-ethyl-N-2-methanesulfonylaminoethyl)-2-methylphenylenediamine sesquisulfate (KODAK Color Developing Agent CD-3), 4-(N-ethyl-N-2-methanesulfonylaminoethyl)-2-methylphenylenediamine sesquisulfate, and others readily apparent to one skilled in the art.

In order to protect the color developing agents from oxidation, one or more antioxidants are generally included in the color developing compositions. Either inorganic or organic antioxidants may be used. Many classes of useful antioxidants are known, including but not limited to, sulfites (such as sodium sulfite, potassium sulfite, sodium bisulfite and potassium metabisulfite), hydroxylamine (and derivatives thereof), hydrazines, hydrazides, amino acids, ascorbic acid (and derivatives thereof), hydroxamic acids, aminoketones, mono- and polysaccharides, mono- and polyamines, quaternary ammonium salts, nitroxy radicals, alcohols, and oximes. Also useful as antioxidants are 1,4-cyclohexadiones. Mixtures of compounds from the same or different classes of antioxidants may also be used if desired.

Especially useful antioxidants are hydroxylamine derivatives as described, for example, in U.S. Pat. Nos. 4,892,804; 4,876,174; 5,354,646; and 5,660,974, all noted above, and U.S. Pat. No. 5,646,327 (Burns et al). Many of these antioxidants are mono- and dialkylhydroxylamines having one or more substituents on one or both alkyl groups. Particularly useful alkyl substituents include sulfo, carboxy, amino, sulfonamido, carbonamido, hydroxy, and other solubilizing substituents.

More preferably, the noted hydroxylamine derivatives may be mono- or dialkylhydroxylamines having one or more hydroxy substituents on the one or more alkyl groups. Representative compounds of this type are described, for example, in U.S. Pat. No. 5,709,982 (Marrese et al), as having the structure AI:

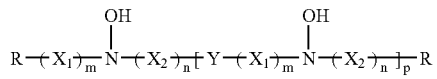

wherein R is hydrogen, a substituted or unsubstituted alkyl group of 1 to 10 carbon atoms, a substituted or unsubstituted hydroxyalkyl group of 1 to 10 carbon atoms, a substituted or unsubstituted cycloalkyl group of 5 to 10 carbon atoms, or a substituted or unsubstituted aryl group having 6 to 10 carbon atoms in the aromatic nucleus.

$X_1$ is —$CR_2(OH)CHR_1$— and $X_2$ is —$CHR_1CR_2(OH)$— wherein $R_1$ and $R_2$ are independently hydrogen, hydroxy, a substituted or unsubstituted alkyl group or 1 or 2 carbon atoms, a substituted or unsubstituted hydroxyalkyl group of 1 or 2 carbon atoms, or $R_1$ and $R_2$ together represent the carbon atoms necessary to complete a substituted or unsubstituted 5- to 8-membered saturated or unsaturated carbocyclic ring structure.

Y is a substituted or unsubstituted alkylene group having at least 4 carbon atoms, and has an even number of carbon atoms, or Y is a substituted or unsubstituted divalent aliphatic group having an even total number of carbon and oxygen atoms in the chain, provided that the aliphatic group has a least 4 atoms in the chain.

Also in Structure AI, m, n, and p are independently 0 or 1. Preferably, each of m and n is 1, and p is 0. Specific di-substituted hydroxylamine antioxidants include, but are not limited to, N,N-bis(2,3-dihydroxypropyl)-hydoxylamine, N,N-bis(2-methyl-2,3-dihydroxypropyl)hydroxylamine, and N,N-bis(1-hydroxymethyl-2-hydroxy-3-phenylpropyl)hydroxylamine. The first compound is preferred.

In the following Table, reference will be made to (1) *Research Disclosure*, December 1978, Item 17643, (2) *Research Disclosure*, December 1989, Item 308119, and (3) *Research Disclosure*, September 1994, Item 36544, all published by Kenneth Mason Publications, Ltd., Dudley Annex, 12a North Street, Emsworth, Hampshire PO10 7DQ, ENGLAND. The Table and the references cited in the Table are to be read as describing particular components suitable for use with the invention. The Table and its cited references also describe suitable ways of preparing, exposing, processing and manipulating the elements, and the images contained therein.

| Reference | Section | Subject Matter |
|---|---|---|
| 1 | I, II | Grain composition, morphology |
| 2 | I, II, IX, X, XI, XII, XIV, XV | and preparation. Emulsion preparation including hardeners, |
| 3 | I, II, III, IX | coating aids, addenda |
| 3 | A & B | |
| 1 | III, IV | Chemical sensitization and |
| 2 | III, IV | spectral sensitization/ |
| 3 | IV, V | Desensitization |
| 1 | V | UV dyes, optical brighteners, |
| 2 | V | luminescent dyes |
| 3 | VI | |
| 1 | VI | |
| 2 | VI | Antifoggants and stabilizers |
| 3 | VII | |
| 1 | VIII | Absorbing and scattering |
| 2 | VIII, XIII, XVI | materials; Antistatic layers; |
| 3 | VIII, IX C & D | matting agents |
| 1 | VII | Image-couplers and image- |
| 2 | VII | modifying couplers; Dye |
| 3 | X | stabilizers and hue modifiers |
| 1 | XVII | Supports |
| 2 | XVII | |
| 3 | XV | |
| 3 | XI | Specific layer arrangements |
| 3 | XII, XIII | Negative working emulsions; Direct positive emulsions |
| 2 | XVIII | Exposure |
| 3 | XVI | |
| 1 | XIX, XX | Chemical processing; |
| 2 | XIX, XX, XXII | Developing agents |
| 3 | XVIII, XIX, XX | |
| 3 | XIV | Scanning and digital processing procedures |

The photographic elements may be exposed with various forms of energy which encompass the ultraviolet, visible, and infrared regions of the electromagnetic spectrum, as well as with electron beam, beta radiation, gamma radiation, x-ray, alpha particle, neutron radiation, and other forms of corpuscular and wave-like radiant energy in either noncoherent (random phase) forms or coherent (in phase) forms, as produced by lasers. When the photographic elements are intended to be exposed by x-rays, they may include features found in conventional radiographic element.

This allows for traditional image processing equipment to be used. The imaging elements of this invention may be exposed via traditional optical methods using a negative, but they are preferably exposed by means of a collimated beam, to form a latent image, and then processed to form a visible image, preferably by other than heat treatment. A collimated beam is preferred as it allows for digital printing and simultaneous exposure of the imaging layer on the top and bottom side without significant internal light scatter. A preferred example of a collimated beam is a laser also known as light amplification by stimulated emission of radiation. The laser may be preferred because this technology is used widely in a number of digital printing equipment types. Further, the laser provides sufficient energy to simultaneously expose the light sensitive silver halide coating on the top and bottom side of the display material of this invention without undesirable light scatter. Subsequent processing of the latent image into a visible image is preferably carried out in the known RA-4™ (Eastman Kodak Company) process or other processing systems suitable for developing high chloride emulsions.

The present invention may also be used with an imaging assembly that comprises photohardenable microencapsulated coloring agents. Development is accomplished by the application of uniform pressure to the imaging assembly. Improved performance is obtained with respect to the imaging assembly's response to pressure by employing a support meeting certain barrier properties. The imaging medium or assembly may also be referred to as a recording medium, and the imaging layer may be referred to as a recording layer, since the assembly may serve both to capture an image (either the original image or an electronic copy), as does film, and also to display the image, as does a print. Consistent with this fact, the imaging assembly may form a positive image.

The photosensitive imaging layer (including microcapsules) is colored by pressure development after exposure to radiation based on image information. The microcapsules, whose mechanical strength changes (increases) when exposed to light, are ruptured by means of pressure development, whereupon the coloring material and other substances encapsulated in the microcapsules flow out (to varying amounts based on the exposure) and development occurs. The coloring material, such as a substantially colorless color former, migrates to, and reacts with, the developer material and coloring occurs, whereupon a color image is developed.

The "rupture" of the microcapsules are not an all-or-nothing event. Rather, the microcapsules exposed to light are differentially photocured to release varying amounts of color former in order to achieve tonal depth in the exposed area. The differential exposure to light proportionately increases the viscosity of the photocurable composition and thus immobilizes the color former proportionately to the desired tonal depth in the exposed area. The rupture of the microcapsules and the release of the color former are accomplished by the uniform application of pressure. Development of the photosensitive imaging layer may be accomplished, for example, by passing the imaging assembly between a pair of upper and lower nip rollers.

In a self-contained imaging system, an imaging layer containing developer and photohardenable microcapsules may be placed between two support members to form an integral unit, wherein at least one support is transparent and at least one support exhibits a water vapor transmission rate of less than 0.77 g/m 2/day (0.05 g/100 in 2/day). Suitably, the transparent support has a percentage light transmission of at least 80 percent at a wavelength of 550 nm. Preferably, the barrier is also sealed on the sides to further prevent water vapor from permeating out of the imaging layer. The term "sealed," as used herein, refers to a seal, which is designed to be non-temporary. This seal is maintained during printing of the image and in the final imaged product, as compared to a temporary package.

In the imaging assembly useful with the invention, a first support is transparent and a second support may be transparent or opaque. In the latter case, an image is provided against a substantially white background as viewed through the transparent support and, in the former case, the image is viewed as a transparency preferably using an overhead or slide projector. Sometimes herein the first support may be referred to as the "front" support and the second support may be referred to as the "back" support.

The term "raw stock keeping" (RSK) is meant to describe the stability of the product from time of manufacture to time of use by the customer. Another metric of concern is "media shelf life" which is defined as the stability of the product from the time of opening a presealed package containing the media to the time of consumption (printing) of the media. Typically, a package may contain a plurality of media, for example 20 media.

As mentioned above, the self-contained imaging assembly comprises an imaging layer or series of layers in which a color developing material (also referred to as a color developer) reacts with a dye precursor (also referred to as a color former) inside microcapsules. Typically, the microcapsules encapsulate photohardenable compositions comprising a photosensitive initiator and hardenable material that undergoes a change of mechanical strength when irradiated with light of a predetermined wavelength, wherein the plurality of microcapsules encapsulates at least a dye precursor for coloring when brought into contact with the color developing material.

The plurality of microcapsules comprises three different types of microcapsules. The three types of microcapsules encapsulate the polymerization initiator, photocurable resin (each photocuring by irradiation with light of one of the three primary colors of light, respectively), and the colorless dye precursors for producing each of the colors of yellow, magenta and cyan. For example, when irradiating the self-contained imaging assembly with blue light (with a wavelength of 470 nm), the photocurable resin of the microcapsules containing only yellow dye precursors is photocured, and these microcapsules (yellow) differentially rupture even when pressure developing the self-contained imaging assembly; however the microcapsules which were not photocured (magenta and cyan) rupture and the magenta and cyan dye precursors are forced out from the microcapsules and react with the color developing material, whereupon coloring occurs, and these colors mix to become a blue color, whereupon this blue color may be seen through the light-transmitting support.

Further, when irradiating the self-contained imaging assembly with green light (with a wavelength of 525 nm), the photocurable resin of the microcapsules containing only magenta dye precursors is photocured, the yellow and cyan microcapsules are ruptured by pressure development, and as a result of the reaction of the color developing material with the yellow and cyan dye precursors the respective coloring occurs, whereupon these colors mix to become a green color. Moreover, when irradiating the self-contained imaging assembly with red light (with a wavelength of 650 nm), the photocurable resin of the microcapsules containing only cyan dye precursors is photocured, the yellow and magenta microcapsules are ruptured by pressure development, and as a result of the reaction of the color developing material with the yellow and magenta dye precursors the respective coloring occurs, whereupon these colors mix to become a red color.

Furthermore, when all microcapsules are photocured to maximum hardness by exposure to light corresponding to the three types of microcapsules previously mentioned, they do not rupture even by pressure development. Therefore coloring does not occur, and the surface of the opaque support may be seen through the light-transmitting support, that is the surface color (white in the present embodiment)

of the opaque support becomes the background color. In short, a color image is formed only in the areas where a coloring reaction occurred when the microcapsules ruptured. This coloring principal is sometimes called "self-coloring."

The self-contained imaging assembly for use with the present invention may having a barrier layer in at least one, preferably both, of the supports. The transparent support may be from 5 to 250 microns thick, preferably 10 to 125 microns thick, and has a light transmission of at least 80% at a wavelength of 550 nm, preferably a light transmission of at least 80% at a wavelength from 450 to 800 nm, more preferably a light transmission of at least 90% at 550 nm, most preferably from 450 to 800 nm. In particular, at least one of the two supports, preferably both, have a water vapor transmission rate of less than 0.77 g/m 2/day (0.05 g/100 in 2/day), preferably not more than 0.47 g/m 2/day (0.03 g/100 in 2/day). The water vapor transmission rate is measured according to ASTM F-1249, hereby incorporated by reference. Although the vapor transmission rate is decreased by increasing thickness, increasing thickness may begin to adversely affect the transparency of the support.

By the term "barrier layer" or "barrier material" is meant a material that has a water vapor transmission rate of less than 0.77 $g/m^2/day$ (0.05 g/100 in 2/day) per 25 micron thickness of the material by the ASTM F-1249 test. Since the barrier layer is part of a support, the support may have other layers that provide a higher water vapor transmission than the barrier layer, so long as the water vapor transmission rate of the entire "top" support, and preferably both supports, is less than 0.77 $g/m^2/day$ (0.05 g/100 in 2 day). The support comprising a barrier layer may be referred to as a "barrier support." A separable part of the barrier support containing a barrier layer may be referred to as a "barrier sheet," for example, when referring to a material commercially available for use in the present invention.

Preferably, the top transparent support contains at least one layer that is a barrier material. This barrier material may desirably have a preselected combination of properties, including thickness (if too thick, too hazy, if too thin not sufficient support) and optical properties. The barrier material may desirably be highly transparent, colorless, practical and cost effective, manufacturable or commercially available, able to be applied via coating or lamination, and stable (non-yellowing). This combination of properties is difficult to find in a single material. Many materials previously used in forming barriers in packaging do not meet all the necessary criteria alone or at all, for example, nylon, PC, PET, polyolefins, and saran polymers. The latter materials do not provide sufficient barrier properties unless using thick layers that are impractical in the present invention. Some materials, while having good moisture barrier properties, have an unacceptable tint, for example silicon oxide coated polyester films. Some materials with exceptional moisture barrier properties are not transparent, for example, aluminum metallized film or paper.

Thus, one embodiment for use with the present invention is directed to a self-contained photohardenable imaging assembly packaged for commercial sale wherein the assembly comprises, in order, a first transparent support that is 5 to 250 microns in thickness and has a light transmission of at least 80% at a wavelength of 550 nm and a water vapor transmission rate of less than 0.77 $g/m^2/day$ (0.05 g/100 in 2 day); one or more imaging layers comprising a plurality of microcapsules encapsulating a photohardenable composition and a color precursor which may react with a developing material in the same or an adjacent imaging layer; and a second support which may be opaque or transparent that is 5 to 250 microns thick.

In a preferred embodiment for use with the invention, the assembly is sealed and the assembly is preconditioned to maintain said imaging layers at a relative humidity greater within the range of from 40 to 90%. The assembly may be sealed by means of heat or other means.

In yet another embodiment for use with the present invention, a self-contained photohardenable imaging assembly further comprises an intermediate layer comprising a relatively resilient material (compared to first transparent support), wherein the Young's modulus of the resilient material is 0.02 to 10 ksi. This has been found beneficial for better distributing the pressure applied to the microcapsules during development.

Materials which may be used as a barrier sheet for a transparent support include, but are not limited to, fluorinated polymers, ceramic coated polymers, for example aluminum oxide, indium tin oxide, or silicon nitride coated on polyester or other transparent polymeric substrates, and other sheet materials meeting the above limitations. Especially preferred are $Al_2O_3$ vacuum deposited coatings on a polyester film (for example, Toppan® GL-AE, available from Toppan Printing Co.) and chlorotrifluoroethylene homopolymer and copolymer films (for example, ACLAR® films available from Honeywell Corp.).

It is preferred that a barrier layer is on both sides of the imaging layer in order to maintain the relative humidity within the assembly. In one embodiment, the relative humidity within the assembly, and particularly within the at least one imaging layer, is maintained at greater than 40%, preferably greater than 50%, by sealing the front and back supports on the sides, after the imaging layer has equilibrated to the desired relative humidity.

Adhesive materials useful for adhering the support to the emulsion or imaging layer may be selected from the general class of "modified acrylics" that have good adhesion, which may be formulated with improved "tack" by addition of tackifying resins or other chemical additives. A useful adhesive may desirably be designed for high initial adhesion and for adhesion to plastic substrates like polyester. It may desirably have the ability to flow quickly for laminating to porous material (the imaging layer) and yet be inert with respect to the imaging layer. High strength adhesives useful in this invention, for example, are the film label stock adhesives of the 3M Company; including 3M's #300 and #310 adhesive formulas which exhibit "inertness" to the imaging layer. Other examples of adhesives useful in this invention are aqueous-based adhesives such as Aeroset® 2177 or Aeroset® 2550, 3240, and 3250 which are commercially available from Ashland Chemical Co., PD 0681, AP 6903, and W 3320 available from H. B. Fuller, or solvent-based pressure sensitive adhesives such as PS 508 sold by Ashland Chemical Co.

The adhesives may be used separately or in combination. Preferably, the adhesive is transparent or translucent and most preferably it is a transparent adhesive which remains transparent even after subjecting the assembly to actinic radiation and pressure necessary to image-wise expose and rupture the microcapsules. The amount of the adhesive will vary depending on the nature of the adhesive and the support. The adhesive is generally applied in an amount of from 0.5 to 20 $g/m^2$.

A subbing layer for promoting adhesion between the transparent support and the imaging layer may desirably have good compatibility with the imaging layer, may desirably not effect the sensitometric response of the imaging layer, and may desirably be chemically stable. Amorphous polyesters, which may be applied as an aqueous dispersion, have been found to work well as the subbing layer material. Polymers with molecular weights of 5,000-15,000, with a low hydroxyl number and low acid number, may be employed, for example, the AQ polymers from Eastman Chemical Co. and, more particularly, AQ38 and AQ55. The subbing layer is coated onto the support at a dried coating weight of from 0.1 to 5.0 g/m 2, with a preferred dried coating weight of from 0.5 to 2.0 $g/m^2$.

Preferably the subbing layer also includes an ultraviolet (UV) ray absorber. Many types of UV absorbing materials have been described in the prior art, including U.S. Pat. Nos. 3,215,530, 3,707,375, 3,705,805, 3,352,681, 3,278,448, 3,253,921, 3,738,837, 4,045,229, 4,790,959, 4,853,471, 4,865,957, and 4,752,298, 5,977,219, 5,538,840 and United Kingdom Patent 1,338,265. Most preferred UV absorbers are polymeric UV absorbers prepared by the method described in U.S. Pat. Nos. 4,496,650, 4,431,726, 4,464,462 and 4,645,735, 5,620,838, EP 0 190 003, U.S. Pat. Nos. 3,761,272, 3,813,255, 4,431,726, 4,455,368, and 4,645,735.

Suitable photohardenable compositions, photoinitiators, chromogenic materials, carrier oils and encapsulation techniques for the layer of microcapsules are disclosed in U.S. Pat. Nos. 4,440,846; 4,772,541; and 5,230,982. Although the latter photohardenable compositions are non-silver systems, silver-based photohardenable microencapsulated system such as that described in U.S. Pat. Nos. 4,912,011; 5,091,280 and 5,118,590 and other patents assigned to Fuji Photo Film Co are also suitable for use in the present invention.

In accordance with the preferred embodiments useful with the invention, a full color imaging system is provided in which the microcapsules are sensitive to red, green, and blue light, respectively. The photohardenable composition in at least one and preferably all three sets of microcapsules may be sensitized by a cationic dye-borate anion complex, e.g., a cyanine dye/borate complex as described in U.S. Pat. No. 4,772,541. For optimum color balance, the microcapsules are sensitive (lambda max) at 450 nm, 540 nm, and 650 nm, respectively. Such a system is useful with visible light sources in direct transmission or reflection imaging. Such a material is useful in making contact prints or projected prints of color photographic slides. They are also useful in electronic imaging using lasers, light emitting diodes, liquid crystal displays or pencil light sources of appropriate wavelengths.

Because cationic dye-borate anion complexes absorb at wavelengths greater than 400 nm, they are colored. The unreacted dye complex present in the microcapsules in the low density image areas may cause undesired coloration in the background area of the final picture, for example, the mixture of microcapsules tends to be green which may give the low density image areas a slight greenish tint. Approaches to reducing undesired coloration in the low density image area as well as the developed image include reducing the amount of photoinitiator used, adjusting the relative amounts of cyan, magenta and yellow microcapsules, or providing a compensating tint in the white opaque support.

The photohardenable compositions used in the microcapsules may also contain a disulfide coinitiator. Examples of useful disulfides are described in U.S. Pat. No. 5,230,982. By means of the optional use of such disulfides, the amount of the photoinitiators used in the microcapsules may be reduced to levels such that the background coloration or residual stain is less than 0.3 and preferably less than 0.25 density units.

The photohardenable compositions of the present invention may be encapsulated in various wall formers using conventional techniques, including coacervation, interfacial polymerization, polymerization of one or more monomers in an oil, as well as various melting, dispersing, and cooling methods. To achieve maximum sensitivities, it is important that an encapsulation technique be used that provides high quality capsules which are responsive to changes in the internal phase viscosity in terms of their ability to rupture. Because the borate tends to be acid sensitive, encapsulation procedures conducted at higher pH (for example, greater than 6) are preferred. Melamine-formaldehyde capsules are particularly useful. U.S. Pat. No. 4,962,010 discloses a conventional encapsulation useful in the present invention in which the microcapsules are formed in the presence of pectin and sulfonated polystyrene as system modifiers. A capsule size may be selected which minimizes light attenuation. The mean diameter of the capsules used in this invention typically ranges from approximately 1 to 25 microns. As a general rule, image resolution improves as the capsule size decreases. Technically, however, the capsules may range in size from one or more microns up to the point where they become visible to the human eye.

The developer materials employed in carbonless paper technology are useful in the present invention. Illustrative examples are clay minerals such as acid clay, active clay, attapulgite, organic acids such as tannic acid, gallic acid, propyl gallate, acid polymers such as phenol-formaldehyde resins, phenol acetylene condensation resins, condensates between an organic carboxylic acid having at least one hydroxy group and formaldehyde, metal salts of aromatic carboxylic acids or derivatives thereof such as zinc salicylate, tin salicylate, zinc 2-hydroxy naphthoate, zinc 3,5 di-tert butyl salicylate, zinc 3,5-di-a-methylbenzyl)salicylate, oil soluble metals salts or phenol-formaldehyde novolak resins (for example, see U.S. Pat. Nos. 3,672,935 and 3,732,120) such as zinc modified oil soluble phenol-formaldehyde resin as disclosed in U.S. Pat. No. 3,732,120, zinc carbonate and mixtures thereof. The particle size of the developer material may affect the quality of the image. In one embodiment, the developer particles are selected to be in the range of from 0.2 to 3 microns, preferably in the range of from 0.5 to 1.5 microns. One or more suitable binders selected from polyethylene oxide, polyvinyl alcohol, polyacrylamide, acrylic latices, neoprene emulsions, polystyrene emulsions, and nitrile emulsions, may be mixed with the developer and the microcapsules, typically in an amount of from 1 to 8% by weight, to prepare a coating composition. A preferred developer material is one which provides good compatibility with the microcapsule slurry solution, for example Schenectady International resin HRJ-4250 solution.

The self-contained imaging assembly used as photosensitive recording medium is not limited to the embodiments that have been described before, but different variations or modifications thereof are possible. For example, instead of encapsulating the photocurable resin and the polymerization initiator inside the microcapsules of the self-contained imaging assembly, the photocurable resin and the polymerization initiator may also be included in the material constituting the microcapsules. Further, instead of photocurable microcapsules, the self-contained imaging assembly may contain photo-softening microcapsules, for example, microcapsules which have sufficient strength in the unexposed state, and which soften when exposed to light of a predetermined wavelength. In this case it is desirable to perform thermal-curing by heat-fixing.

There is no need to use red, green and blue light to capture the image in the imaging layer; depending on the characteristics of the photosensitive recording medium, light with various wavelengths may be selected. For example, light emitting elements producing infrared light, red, and green, or light emitting elements producing far infrared light, near infrared light, and red may also be selected. Ultraviolet and far ultraviolet are also advantageous examples of valid color choices for light emitting elements. Moreover, the number of colors of the light emitting elements is not limited to the three colors red, green, and blue; it is equally possible to use only one or two colors, or to select four colors, as in a typical color printer using yellow, magenta, cyan, and black, or even more colors. Furthermore, the choice of light emitting elements includes, but is not limited to LEDs, electroluminescent lamps (EL), light emitting plasma and laser devices, and other light emitting elements.

The imaging assembly of the present invention may be exposed in any suitable camera or other exposure device to provide an image. The imaging assembly of this invention is especially suitable for exposure using a liquid crystal array or light emitting diodes driven by a computer generated signal or a video signal for the reproduction of images from a video cassette recorder, or a camcorder. It is possible to utilize, for example, with the current state of technology, a very economical compact printer, weighing under 500 g and having a size less than 100,000 mm$^3$ that prints directly from a digital camera utilizing a CompactFlash® card interface and provides a resolution of 150 ppi or more with continuous tone and over 250 gradation levels.

The print is "developed," based on the "latent image" formed by the selectively photohardened microencapsulated color formers, by the application of pressure or by the application of both heat and pressure. See, for example, the image forming device described in U.S. Pat. No. 5,884,114 to Iwasaki, in which a photo and pressure sensitive printer provides the feeding and discharging of a photosensitive imaging medium at the front of the printer housing, which device may have the added advantage of being easily integrated into other equipment such as a personal computer. In this particular device, the latent image is formed by a movement in the main scanning direction of an LED-type exposure head. Thereafter, an upper nip roller of a developing mechanism is moved from a separated position to a pressing position. The capsules that have not been photohardened are ruptured by pressure and a full color image is formed on the sheet, heat-fixing (which is optional to the present invention) is performed by a film heater, and the imaged assembly is discharged from the front of the housing for the device or printer.

A typical pressure-type image-forming device (which may be referred to as a printer) typically comprises a printer housing with a lightproof cartridge for accommodating photosensitive imaging media (alternately referred to as recording media) mounted to the front of the printer housing so as to be easily detachable. In some devices, a preheater is employed for preheating the photosensitive imaging medium. A typical exposure mechanism may include an exposure head for exposing while scanning in a direction perpendicular to the surface of the drawing and a developing mechanism for pressure development by means of a pair of an upper and a lower nip roller. The roller may be maintained under pressure by a spring. An optional fixing heater for heat-fixing the developed photosensitive imaging medium may be used. A discharge tray may be provided at the rear end of the printer housing. The pressure sensitive printer may be designed so that sheets are both fed and discharged at the front side of the printer housing.

An image forming device for treatment of the imaging media may, for example, comprise exposure means for forming a latent image on the imaging medium upon exposure based on image information, developing means for developing the latent image by means of the coloring material coming out of the microcapsules when pressure is applied to the photosensitive imaging medium on which the latent image was formed by the exposure means, wherein the developing means comprise a pair of an upper and a lower nip roller facing each other and sandwiching the transport path of the photosensitive imaging medium, pressing means for pressing one nip roller against the other nip roller, roller switching means for alternately switching between a pressing position in which the one nip roller is brought into pressure contact with the other nip roller and a separated position in which the one nip roller is separated from the other nip roller, and a transport path for transporting the photosensitive imaging medium comprises a feed path for feeding the photosensitive imaging medium on the inlet side, a discharge path for discharging the recorded photosensitive imaging medium.

In one embodiment, the developing mechanism may comprise a pair of an upper and a lower nip roller, a rectangular frame fixed inside the printer housing for supporting the nip rollers, a pair of compression springs for pressing both ends of the roller axis of the upper nip roller toward the lower nip roller, and a roller switching mechanism for alternately switching between a pressing position in which the upper nip roller is brought into pressure contact with the lower nip roller and a separated position in which it is separated from the lower nip roller. If the pressing force of each of the springs is 150 kgf, the upper nip roller presses with a total force of 300 kgf on the lower nip roller. However, other means for applying pressure may be employed, for example, a pressure stylus.

A control unit for the image-forming device may comprise a CPU, a ROM and a RAM, an I/O interface, and drive circuits, wherein a stepping motor for paper transport, a solenoid actuator for driving a switching plate, a film heater, a motor for roller switching, a stepping motor for driving the carriage, the exposure head, are respectively connected to the drive circuits. A connector and a control panel may also be connected to the control unit. In one embodiment, image data (RGB image data) from an external host computer may be fed via a connector to the control unit.

The ROM may store control programs for controlling all operations of the printer, a control program for calculating, from the input image data, the duration for which each LED of the exposure head is turned on and the timing thereof, a control program for controlling the transport of the self-contained imaging assembly by controlling the stepping motor for sheet transport synchronously with the exposure to green, red and blue light, a control program for controlling the scanning of the exposure head by controlling the stepping motor for driving the carriage synchronously with the exposure to green, red and blue light. The different buffers and memory types necessary for running the control programs are in the RAM. The number of copies to be printed, the enlargement or reduction ratio of the image, the size of the image forming area of the imaging assembly, input by an operator at the control panel, may be stored in the memory of the RAM. Exposure may take place upon calculation of the driving conditions for the stepping motor.

In one type of image-forming device, when image data of an image is sent to the control unit, the image data is divided into R image data, G image data, and B image data and stored in a buffer of the RAM. Each LED of an exposure heat may be electrically driven by a drive circuit via a cable.

In one embodiment of practicing the invention, imaging medium sheets may be packaged as a stack of sheets which go into the printer. The individual sheets may be picked from the stack of sheets and transported into the "printing path" of the printer. However, if two or more sheets at the same time are picked up and fed into the printing path the printer, the printer may become jammed, requiring disassembly by the user. To avoid this problem, the static in the sheets may be reduced or eliminated just prior to the final packaging; and a precision hinge on the printer film cassette or tray may be used. Also, a method to further aid the feeding of sheets into the printer is to add a "back coat" or backing layer to the imaging medium. In general, these coatings may include a binder and a grit or abrasive such as silica. Preferably, the front side of the first support and the back side of the second support has a coefficient of friction of less than 0.4.

The article, preferably an imaging element, of the invention may comprise a single layer or multiple layers according to need. The antistatic layer of the invention may be placed in any location in the article, preferably an imaging element, providing the layer is able to remain conductive. In one embodiment, the antistatic layer may be on the same side of support as imaging layer. In another embodiment, the antistatic layer may be on the side of support opposite the imaging layer. In another embodiment, the antistatic layer may be on top of the imaging layer, that is, one the side of the imaging layer opposite the support or between the imaging layer and the support. There may also be more than one antistatic layer. These multiple layers may be in any combination of the above locations.

The multiplicity of other layers present in the article, preferably an imaging element, may include any number of auxiliary layers such as antistatic layers, backmark retention layers, tie layers or adhesion promoting layers, abrasion resistant layers, conveyance layers, barrier layers, splice providing layers, UV absorption layers, antihalation layers, optical effect providing layers, waterproofing layers, flavor retaining layers, fragrance providing layers, adhesive layers, and imaging layers.

The article, preferably an imaging element, of the invention may be subjected to any number of coatings and treatments, after extrusion, coextrusion, and orientation, or between casting and full orientation, to improve its properties, such as printability, barrier properties, heat-sealability, spliceability, adhesion to other supports and/or imaging layers. Examples of such coatings can be acrylic coatings for printability, and polyvinylidene halide for heat seal properties. Examples of such treatments can be flame, plasma and corona discharge treatment, to improve printability and adhesion. Further examples of treatments can be calendaring, embossing, and patterning to obtain specific effects on the surface of the element. The element of the invention may be incorporated in any other suitable support by lamination, extrusion coating, or any other method known in the art.

The following examples are provided to illustrate the invention.

Base Paper

The photographic grade cellulose paper base used in the invention was produced using a standard fourdrinier paper machine and a blend of mostly bleached hardwood Kraft fibers. The fiber ratio consisted primarily of bleached poplar (38%) and maple/beech (37%) with lesser amounts of birch (18%) and softwood (7%). Fiber length was reduced from 0.73 mm length weighted average as measured by a Kajaani FS-200 to 0.55 mm length using high levels of conical refining and low levels of disc refining. Fiber lengths from the slurry were measured using a FS-200 Fiber Length Analyzer (Kajaani Automation Inc.). Energy applied to the fibers as indicated by the total Specific Net Refining Power (SNRP) was 127 KW hr/metric ton. Two conical refiners were used in series to provide the total conical refiners SNRP value. This value was obtained by adding the SNRPs of each conical refiner. Two disc refiners were similarly used in series to provide a total Disk SNRP. Neutral sizing chemical addenda, utilized on a dry weight basis, included alkyl ketene dimer at 0.20% addition, cationic starch (1.0%), polyaminoamide epichlorhydrin (0.50%), polyacrylamide resin (0.18%), diaminostilbene optical brightener (0.20%), and sodium bicarbonate. Surface sizing using hydroxyethylated starch and sodium chloride was also employed but is not critical to the invention. In the 3rd Dryer section, ratio drying was utilized to provide a moisture bias from the face side to the wire side of the sheet. The imaging or face side (emulsion side) of the sheet was then remoisturized with conditioned steam immediately prior to calendering. Sheet temperatures were raised to between 76° C. and 93° C. just prior to and during calendering. The paper was then calendered to an apparent density of 1.17 gm/cc. Moisture levels after the calender were 7.0% to 9.0% by weight.

EXAMPLE 1

In this example a continuous antistatic layer was applied to a sheet of photographic polyethylene coated paper. The photographic polyethylene coated paper represents a typical photographic paper base of approximately 160 g/m$^2$ of photo quality paper with 26 g/m$^2$ pigmented of low density polyethylene (0.917 g/cc) on the top side. This layer contains approximately 12% by weight of anatase TiO$_2$, an optical brightener and blue tints. On the backside was a layer of 28 g/m$^2$ of clear high density (0.924 g/cc) polyethylene. A continuous antistatic layer was coated onto the backside polyethylene resin by a gravure coating process. The dry antistatic layer consisted of the following ingredients:

| | |
|---|---|
| Baytron P (a polythiophene based conductive polymer supplied by Bayer) | 5% |
| Ludox AM (colloidal silica supplied by Du Pont) | 19% |
| Neocryl A50454 (styrene acrylate copolymer supplied by Avecia) | 76% |

The inherent color of the conductive polythiophene provide a slight density difference between the printed areas with antistatic layer and the graphic design logo areas that had essentially no antistatic layer coverage, such that the base substrate showed through in the form of the desired logo graphic.

EXAMPLE 2

This example was prepared the same as example 1, except the antistatic layer was printed to form multiple logo graphics, with conductive lines between letters of the individual graphic design logos and also between each individual logo, as to form an interconnected pattern or grid as shown in FIG. 4.

TABLE 1

| Example | Antistatic Layer Coating Type | Surface resistivity |
| --- | --- | --- |
| 1 (control) | Continuous | $3 \times 10^9$ ohms/sq. |
| 2 | Patterned grid with internal logo | $3 \times 10^9$ ohms/sq. |

As shown by the data in Table 1, both the control, as represented by example 1, and the patterned grid with internal graphic design logo had the same level of surface resistivity.

Surface electrical resistivity (SER) is measured with a Keithly model 616 digital electrometer using a two point DC probe by a method similar to that described in U.S. Pat. No. 2,801,191, col. 4, line 4-34. Internal resistivity or "water electrode resistivity (WER)" is measured by the procedures described in R. A. Elder, "Resistivity Measurement on Buried Conductive Layers," EOS/ESD Symposium Proceedings, September 1990, pages 251-254.

What is claimed is:

1. An article comprising a substrate having deposited on the surface thereof at least one antistatic layer, wherein said antistatic layer comprises at least one conductive material, wherein said antistatic layer comprises areas of patterned coverage, wherein said patterned coverage comprises a graphic design, and wherein said patterned coverage comprise a continuous interconnected conductive pathway, wherein said antistatic layer comprises a resistivity of between $10^{13}$ and $10^7$ ohms/sq.

2. The article of claim 1 wherein said conductive materials comprises at least one polyether polymeric conductive material.

3. The article of claim 2 wherein said polyether polymeric conductive material comprises polyether block copolyamide.

4. The article of claim 1 wherein said substrate and said antistatic layer have a density difference of at least 0.01 density units as measured by a reflection densitometer a transparent conductive material.

5. The article of claim 1 wherein said patterned coverage comprises areas of coverage and areas without coverage.

6. The article of claim 1 wherein said patterned coverage comprises a gradient, wherein said gradient comprises areas of higher coverage and lower coverage.

7. The article of claim 6 wherein said areas of higher coverage comprise a resistivity of less than $10^{13}$ ohm/sq and said areas of lower coverage comprise a resistivity of greater than or equal to $10^{13}$ ohm/sq.

8. The article of claim 1 wherein said graphic design comprises at least one line.

9. The article of claim 1 wherein said graphic design comprises at least one dot.

10. The article of claim 1 wherein said graphic design comprises a grid.

11. The article of claim 1 wherein said graphic design comprises at least one character.

12. The article of claim 1 wherein said graphic design comprises a logo.

13. The article of claim 12 wherein said logo comprises at least one member selected from the group consisting of letters, pictures, numbers, symbols, and words.

14. The article of claim 1 wherein said substrate comprises an opaque support.

15. The article of claim 14 wherein said opaque substrate comprises paper.

16. The article of claim 1 wherein said substrate comprises oriented laminates.

17. The article of claim 1 wherein said substrate comprises a transparent support.

18. The article of claim 1 wherein said substrate comprises a core that has adhered thereto at least one flange layer.

19. The article of claim 18 wherein said core comprises paper.

20. The article of claim 18 wherein said core comprises a blow-cell foam core.

21. The article of claim 1 wherein said substrate comprises a microvoided support.

22. The article of claim 1 wherein said conductive material comprises from 15 to 85% weight of said antistatic layer, and said polymer comprises from 15 to 85% by weight of said antistatic layer.

23. The article of claim 1 wherein said antistatic layer comprises a resistivity of less than 13 log ohm/sq.

24. The article of claim 1 wherein said antistatic layer comprises a layer applied by at least one member selected from the group consisting of extrusion coating, blade coating, wound wire rod coating, slot coating, hopper coating, slide hopper coating, gravure coating, curtain coating, spray coating or inkjet coating.

25. The article of claim 1 wherein said antistatic layer comprises a layer applied by extrusion coating.

26. The article of claim 25 wherein said extrusion coating comprises simultaneous or consecutive extrusion.

27. The article of claim 1 wherein said antistatic layer comprises a printed layer.

28. The article of claim 1 wherein said article comprises an imaging element having at least one imaging layer, and a support.

29. The article of claim 28 wherein said imaging layer comprises a photosensitive silver halide imaging layer.

30. The article of claim 28 wherein said antistatic layer comprises a layer on the same side of said support as said imaging layer.

31. The article of claim 28 wherein said antistatic layer comprises a layer on the side of said support opposite said imaging layer.

32. The article of claim 28 wherein said antistatic layer is on the side of said imaging layer opposite said support.

33. The article of claim 28 wherein said antistatic layer is between said imaging layer and said support.

34. The article of claim 28 wherein said imaging layer comprises an inkjet receiving layer.

35. The article of claim 28 wherein said imaging layer comprises a thermal receiving layer.

36. The article of claim 28 wherein said imaging layer comprises an electrophotographic imaging layer.

37. The article of claim 1 wherein said antistatic layer further comprises a polymer camer.

38. The article of claim 37 wherein said polymer comprises polyolefin.

39. The article of claim 37 wherein said polymer comprises polyester.

40. The article of claim 37 wherein said polymer comprises polypropylene.

41. The article of claim 37 wherein said polymer comprises polyethylene.

42. The article of claim 28 wherein said imaging layer comprises an imaging assembly that comprises photohardenable microencapsulated coloring agents.

43. The article of claim 28 wherein said imaging layer comprises plural heat-coloring elements, each comprising a diazo compound and a coupling component causing heat-coloring, and each of said diazo compounds in the heat-coloring elements being decomposed by radiation having a respectively different wavelength.

44. The article of claim 1 wherein said conductive materials comprises electronically conductive metal-containing particles.

45. The article of claim 1 wherein said conductive materials comprises electronically conductive polymers.

46. An article comprising a substrate comprising a core that has adhered thereto at least one flange layer, said flange layer having thereon at least one antistatic layer, wherein said antistatic layer comprises at least one conductive material, wherein said antistatic layer comprises areas of patterned coverage, wherein said patterned coverage comprises a graphic design, and wherein said patterned coverage comprise a continuous interconnected conductive pathway, wherein said antistatic layer comprises a resistivity of between $10^{13}$ and $10^7$ ohms/sq.

47. The article of claim 46 wherein said conductive materials comprises at least one polyether polymeric conductive material.

48. The article of claim 47 wherein said polyether polymeric conductive material comprises polyether block copolyamide.

49. The article of claim 46 wherein said substrate and said antistatic layer have a density difference of at least 0.01 density units as measured by a reflection densitometer a transparent conductive material.

50. The article of claim 46 wherein said patterned coverage comprises areas of coverage and areas without coverage.

51. The article of claim 46 wherein said patterned coverage comprises a gradient, wherein said gradient comprises areas of higher coverage and lower coverage.

52. The article of claim 51 wherein said areas of higher coverage comprise a resistivity of less than $10^{13}$ ohm/sq and said areas of lower coverage comprise a resistivity of greater than or equal to $10^{13}$ ohm/sq.

53. The article of claim 46 wherein said graphic design comprises at least one line.

54. The article of claim 46 wherein said graphic design comprises at least one dot.

55. The article of claim 46 wherein said graphic design comprises a grid.

56. The article of claim 46 wherein said graphic design comprises at least one character.

57. The article of claim 46 wherein said graphic design comprises a logo.

58. The article of claim 57 wherein said logo comprises at least one member selected from the group consisting of letters, pictures, numbers, symbols, and words.

59. The article of claim 46 wherein said substrate comprises an opaque support.

60. The article of claim 59 wherein said opaque substrate comprises paper.

61. The article of claim 46 wherein said substrate comprises oriented laminates.

62. The article of claim 46 wherein said substrate comprises a transparent support.

63. The article of claim 46 wherein said core comprises paper.

64. The article of claim 46 wherein said core comprises a blow-cell foam core.

65. The article of claim 46 wherein said substrate comprises a microvoided support.

66. The article of claim 46 wherein said conductive material comprises from 15 to 85% weight of said antistatic layer, and said polymer comprises from 15 to 85% by weight of said antistatic layer.

67. The article of claim 46 wherein said antistatic layer comprises a resistivity of less than 13 log ohm/sq.

68. The article of claim 46 wherein said antistatic layer comprises a layer applied by at least one member selected from the group consisting of extrusion coating, blade coating, wound wire rod coating, slot coating, hopper coating, slide hopper coating, gravure coating, curtain coating, spray coating or inkjet coating.

69. The article of claim 46 wherein said antistatic layer comprises a layer applied by extrusion coating.

70. The article of claim 69 wherein said extrusion coating comprises simultaneous or consecutive extrusion.

71. The article of claim 46 wherein said antistatic layer comprises a printed layer.

72. The article of claim 46 wherein said antistatic layer further comprises a polymer carrier.

73. The article of claim 72 wherein said polymer comprises polyolefin.

74. The article of claim 72 wherein said polymer comprises polyester.

75. The article of claim 72 wherein said polymer comprises polypropylene.

76. The article of claim 72 wherein said polymer comprises polyethylene.

77. The article of claim 46 wherein said article comprises an imaging element having at least one imaging layer, and a support.

78. The article of claim 77 wherein said antistatic layer comprises a layer on the same side of said support as said imaging layer.

79. The article of claim 77 wherein said antistatic layer comprises a layer on the side of said support opposite said imaging layer.

80. The article of claim 77 wherein said antistatic layer is on the side of said imaging layer opposite said support.

81. The article of claim 77 wherein said antistatic layer is between said imaging layer and said support.

82. The article of claim 77 wherein said imaging layer comprises a photosensitive silver halide imaging layer.

83. The article of claim 77 wherein said imaging layer comprises an inkjet receiving layer.

84. The article of claim 77 wherein said imaging layer comprises a thermal receiving layer.

85. The article of claim 77 wherein said imaging layer comprises an electrophotographic imaging layer.

86. The article of claim 77 wherein said imaging layer comprises an imaging assembly that comprises photohardenable microencapsulated coloring agents.

87. The article of claim 77 wherein said imaging layer comprises plural heat-coloring elements, each comprising a diazo compound and a coupling component causing heat-coloring, and each of said diazo compounds in the heat-coloring elements being decomposed by radiation having a respectively different wavelength.

88. The article of claim 46 wherein said conductive materials comprises electronically conductive metal-containing particles.

89. The article of claim 46 wherein said conductive materials comprises electronically conductive polymers.

90. An article comprising a substrate having thereon at least one antistatic layer, wherein said antistatic layer comprises at least one conductive material, wherein said antistatic layer comprises areas of patterned coverage, wherein said patterned coverage comprises a graphic design, and wherein said patterned coverage comprise a continuous interconnected conductive pathway having areas of coverage and areas without coverage, and wherein said graphic design comprises at least one member selected from the group consisting of at least one line, at least one dot, a grid, at least one character, and at least one logo, wherein said antistatic layer comprises a resistivity of between $10^{13}$ and $10^7$ ohms/sq.

91. The article of claim 90 wherein said conductive materials comprises at least one polyether polymeric conductive material.

92. The article of claim 91 wherein said polyether polymeric conductive material comprises polyether block copolyamide.

93. The article of claim 90 wherein said substrate and said antistatic layer have a density difference of at least 0.01 density units as measured by a reflection densitometer a transparent conductive material.

94. The article of claim 90 wherein said logo comprises at least one member selected from the group consisting of letters, pictures, numbers, symbols, and words.

95. The article of claim 90 wherein said substrate comprises an opaque support.

96. The article of claim 95 wherein said opaque substrate comprises paper.

97. The article of claim 90 wherein said substrate comprises oriented laminates.

98. The article of claim 90 wherein said substrate comprises a transparent support.

99. The article of claim 90 wherein said substrate comprises a core that has adhered thereto at least one flange layer.

100. The article of claim 99 wherein said core comprises paper.

101. The article of claim 99 wherein said core comprises a blow-cell foam core.

102. The article of claim 90 wherein said substrate comprises a microvoided support.

103. The article of claim 90 wherein said conductive material comprises from 15 to 85% weight of said antistatic layer, and said polymer comprises from 15 to 85% by weight of said antistatic layer.

104. The article of claim 90 wherein said antistatic layer comprises a resistivity of less than 13 log ohm/sq.

105. The article of claim 90 wherein said antistatic layer comprises a layer applied by at least one member selected from the group consisting of extrusion coating, blade coating, wound wire rod coating, slot coating, hopper coating, slide hopper coating, gravure coating, curtain coating, spray coating or inkjet coating.

106. The article of claim 90 wherein said antistatic layer comprises a layer applied by extrusion coating.

107. The article of claim 106 wherein said extrusion coating comprises simultaneous or consecutive extrusion.

108. The article of claim 90 wherein said antistatic layer comprises a printed layer.

109. The article of claim 90 wherein said antistatic layer further comprises a polymer carrier.

110. The article of claim 109 wherein said polymer comprises polyolefin.

111. The article of claim 109 wherein said polymer comprises polyester.

112. The article of claim 109 wherein said polymer comprises polypropylene.

113. The article of claim 109 wherein said polymer comprises polyethylene.

114. The article of claim 90 wherein said article comprises an imaging element having at least one imaging layer, and a support.

115. The article of claim 114 wherein said antistatic layer comprises a layer on the same side of said support as said imaging layer.

116. The article of claim 114 wherein said antistatic layer comprises a layer on the side of said support opposite said imaging layer.

117. The article of claim 114 wherein said antistatic layer is on the side of said imaging layer opposite said support.

118. The article of claim 114 wherein said antistatic layer is between said imaging layer and said support.

119. The article of claim 114 wherein said imaging layer comprises a photosensitive silver halide imaging layer.

120. The article of claim 114 wherein said imaging layer comprises an inkjet receiving layer.

121. The article of claim 114 wherein said imaging layer comprises a thermal receiving layer.

122. The article of claim 114 wherein said imaging layer comprises an electrophotographic imaging layer.

123. The article of claim 114 wherein said imaging layer comprises an imaging assembly that comprises photohardenable microencapsulated coloring agents.

124. The article of claim 114 wherein said imaging layer comprises plural heat-coloring elements, each comprising a diazo compound and a coupling component causing heat-coloring, and each of said diazo compounds in the heat-coloring elements being decomposed by radiation having a respectively different wavelength.

125. The article of claim 90 wherein said conductive materials comprises electronically conductive metal-containing particles.

126. The article of claim 90 wherein said conductive materials comprises electronically conductive polymers.

\* \* \* \* \*

UNITED STATES PATENT AND TRADEMARK OFFICE
CERTIFICATE OF CORRECTION

| | |
|---|---|
| PATENT NO. | : 7,255,912 B2 |
| APPLICATION NO. | : 10/669181 |
| DATED | : August 14, 2007 |
| INVENTOR(S) | : Peter T. Aylward et al. |

It is certified that error appears in the above-identified patent and that said Letters Patent is hereby corrected as shown below:

Column 78, Line 54    In Claim 37, delete "camer." and insert -- carrier. --, therefor.

Signed and Sealed this

Sixth Day of May, 2008

JON W. DUDAS
*Director of the United States Patent and Trademark Office*